US012356665B2

(12) United States Patent
Yun et al.

(10) Patent No.: US 12,356,665 B2
(45) Date of Patent: Jul. 8, 2025

(54) STACKED TRANSISTORS HAVING AN ISOLATION REGION THEREBETWEEN AND A COMMON GATE ELECTRODE, AND RELATED FABRICATION METHODS

(71) Applicant: Samsung Electronics Co., Ltd., Suwon-si (KR)

(72) Inventors: Seungchan Yun, Waterford, NY (US); Inchan Hwang, Schenectady, NY (US); Gunho Jo, Albany, NY (US); Jeonghyuk Yim, Halfmoon, NY (US); Byounghak Hong, Latham, NY (US); Kang-ill Seo, Latham, NY (US); Ming He, San Jose, CA (US); JaeHyun Park, Hwaseong-si (KR); Mehdi Saremi, Danville, CA (US); Rebecca Park, Mountain View, CA (US); Harsono Simka, Saratoga, CA (US); Daewon Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 568 days.

(21) Appl. No.: 17/554,483

(22) Filed: Dec. 17, 2021

(65) Prior Publication Data
US 2023/0086084 A1 Mar. 23, 2023

Related U.S. Application Data

(60) Provisional application No. 63/270,873, filed on Oct. 22, 2021, provisional application No. 63/247,389, filed on Sep. 23, 2021.

(51) Int. Cl.
*H10D 30/67* (2025.01)
*H10D 30/62* (2025.01)
(Continued)

(52) U.S. Cl.
CPC ....... *H10D 30/6735* (2025.01); *H10D 64/258* (2025.01); *H10D 84/0135* (2025.01);
(Continued)

(58) Field of Classification Search
CPC ....... H01L 29/42392; H01L 21/823437; H01L 21/823481; H01L 27/088; H01L 29/0665;
(Continued)

(56) References Cited

U.S. PATENT DOCUMENTS 9,224,811 B2 12/2015 Cheng et al.
10,741,456 B2 8/2020 Cheng et al.
(Continued)

FOREIGN PATENT DOCUMENTS

EP 3979306 A1 4/2022

OTHER PUBLICATIONS

Extended European Search Report corresponding to EP 22196841.5, mailed Feb. 7, 2023 (11 pages).

*Primary Examiner* — Changhyun Yi
(74) *Attorney, Agent, or Firm* — Myers Bigel, P.A.

(57) ABSTRACT

Transistor devices are provided. A transistor device includes a substrate. The transistor device includes a lower transistor having a lower gate and a lower channel region on the substrate. The transistor device includes an upper transistor having an upper gate and an upper channel region. The lower transistor is between the upper transistor and the substrate. The transistor device includes an isolation region that separates the lower channel region of the lower transistor from the upper channel region of the upper transistor. Moreover, the lower gate of the lower transistor contacts the upper gate of the upper transistor. Related methods of forming a transistor device are also provided.

18 Claims, 51 Drawing Sheets

(51) Int. Cl.
*H10D 64/23* (2025.01)
*H10D 84/01* (2025.01)
*H10D 84/03* (2025.01)

(52) U.S. Cl.
CPC ....... *H10D 84/0151* (2025.01); *H10D 84/038* (2025.01); *H10D 30/62* (2025.01)

(58) Field of Classification Search
CPC ......... H01L 29/41775; H01L 29/78696; H01L 29/785; H01L 29/78642; H01L 29/66545; H01L 21/8221; H10D 30/6735; H10D 64/258; H10D 84/0151; H10D 84/0135; H10D 84/038
See application file for complete search history.

(56) References Cited

U.S. PATENT DOCUMENTS

| | | |
|---|---|---|
| 11,069,684 B1 | 7/2021 | Xie et al. |
| 2019/0109040 A1 | 4/2019 | Chao et al. |
| 2019/0393214 A1 | 12/2019 | Lilak et al. |
| 2020/0006331 A1 | 1/2020 | Lilak et al. |
| 2020/0098756 A1 | 3/2020 | Lilak et al. |
| 2020/0105751 A1 | 4/2020 | Dewey et al. |
| 2020/0119015 A1 | 4/2020 | Bi et al. |
| 2020/0266218 A1 | 8/2020 | Lilak et al. |
| 2020/0294998 A1 | 9/2020 | Lilak et al. |
| 2020/0295127 A1* | 9/2020 | Mannebach ............ H01L 24/17 |
| 2020/0411518 A1 | 12/2020 | Fulford et al. |
| 2021/0035975 A1 | 2/2021 | Kim et al. |
| 2022/0013521 A1 | 1/2022 | Zhang et al. |
| 2023/0037957 A1* | 2/2023 | Thomas ................ H01L 27/092 |
| 2023/0089395 A1* | 3/2023 | Orr ..................... H01L 27/0605 257/369 |

* cited by examiner

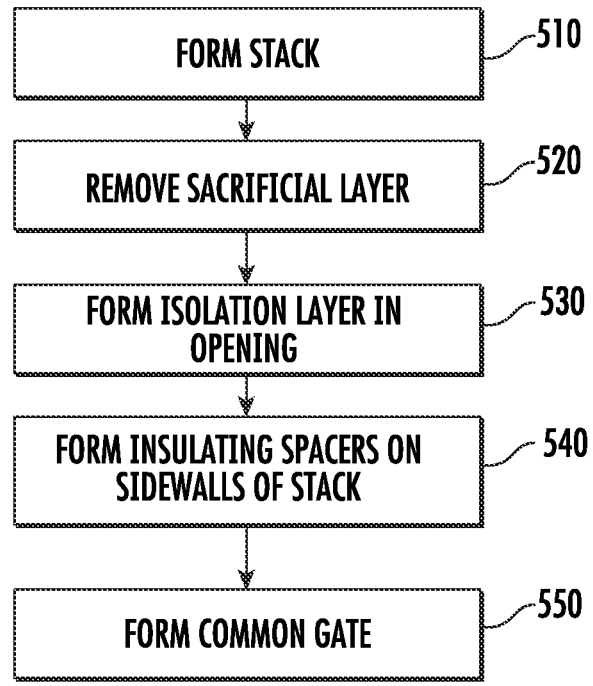

STACKED TRANSISTORS HAVING AN ISOLATION REGION THEREBETWEEN AND A COMMON GATE ELECTRODE, AND RELATED FABRICATION METHODS

CLAIM OF PRIORITY

The present application claims the benefit of U.S. Provisional Patent Application Ser. No. 63/247,389, filed on Sep. 23, 2021, entitled REPLACEMENT LAYER FOR DUAL INNER SPACER IN COMMON GATE STACKED FET, the disclosure of which is hereby incorporated herein in its entirety by reference. The present application also claims the benefit of U.S. Provisional Patent Application Ser. No. 63/270,873, filed on Oct. 22, 2021, entitled 3DSFET DIELECTRIC INSERTION TO GATE NP SEPARATION, the disclosure of which is hereby incorporated herein in its entirety by reference.

FIELD

The present disclosure generally relates to the field of semiconductor devices and, more particularly, to three-dimensional transistor structures.

BACKGROUND

The density of transistors in electronic devices has continued to increase. Though three-dimensional transistor structures can help to increase transistor density, they may experience electrical vulnerabilities, such as parasitic capacitance. For example, parasitic capacitance between a contact metal and a gate metal of a three-dimensional transistor structure can reduce device performance.

Moreover, it may be difficult to form inner spacers for three-dimensional transistor structures. And the deposition and removal of gate metal for three-dimensional transistor structures may be complicated and difficult to control.

SUMMARY

A transistor device, according to some embodiments herein, may include a substrate. The transistor device may include a lower transistor having a lower gate and a lower channel region on the substrate. The transistor device may include an upper transistor having an upper gate and an upper channel region. The lower transistor may be between the upper transistor and the substrate. The transistor device includes an isolation region that may separate the lower channel region of the lower transistor from the upper channel region of the upper transistor. Moreover, the lower gate of the lower transistor may contacts the upper gate of the upper transistor.

A transistor device, according to some embodiments, may include a lower nanosheet transistor having a lower nanosheet stack and a lower gate on the lower nanosheet stack. The transistor device may include an upper nanosheet transistor on top of the lower nanosheet transistor. The upper nanosheet transistor may include an upper nanosheet stack and an upper gate on the upper nanosheet stack. The transistor device may include an isolation region that separates the lower nanosheet stack from the upper nanosheet stack. Moreover, the lower gate of the lower nanosheet transistor may contacts the upper gate of the upper nanosheet transistor.

A method of forming a transistor device, according to some embodiments, may include forming a preliminary transistor stack including a lower channel layer, an upper channel layer, and a sacrificial layer that separates the lower channel layer from the upper channel layer. The method may include forming insulating spacers between the lower channel layer and the upper channel layer. The method may include removing the sacrificial layer. The method may include forming an isolation layer in an opening formed by removing the sacrificial layer. The method may include forming a lower gate on the lower channel layer below the isolation layer and an upper gate on the upper channel layer above the isolation layer. Moreover, the upper gate may contact the lower gate.

BRIEF DESCRIPTION OF THE DRAWINGS

FIGS. 2A, 2B, 2C, 2D, 2E, 2F, 2G, 2H, 2I, 2J, 2K, 2L, 2M, 2N, 2O, 2P, 2Q, 2R, 2S, 2T, 2U, 2V, 2W, 2X, 2Y, 2Z, 2AA, 2AB, 2AC, 2AD, 2AE, 2AF, 2AG, 2AH, 2AI, 2AJ, 2AK, 2AL, 2AM, and 2AN are cross-sectional views illustrating operations of forming the transistor stack of FIGS. 1B and 1C.

FIGS. 5A and 5B are flowcharts corresponding to operations of FIGS. 4A-4P.

DETAILED DESCRIPTION

Pursuant to embodiments of the present invention, transistor devices comprising a common gate and an isolation region that separates a lower channel region of a lower transistor from an upper channel region of an upper transistor are provided. Forming inner spacers for three-dimensional transistor structures may have a process restriction due to an undefined border between upper and lower transistors. For example, inner spacers may have incomplete pinchoff (e.g., removal/separation) between the upper and lower transistors. And the deposition and removal of gate metal in the middle of upper and lower devices may be restricted by vertical spaces between them and gate length, and those processes may be complicated and difficult to control.

Transistor devices and methods of forming the same pursuant to embodiments of the present invention, however, can address these issues by forming a sacrificial layer that defines a border between the upper and lower transistors. The defined border provided by the sacrificial layer can improve control of subsequent formation of inner spacers. Moreover, the sacrificial layer is subsequently replaced with an isolation layer that is part of an isolation region that will be inside a common gate for the upper and lower transistors.

Forming the isolation layer inside a region where the common gate will be formed helps to control the amount and location of gate metal that is formed in the region.

Example embodiments of the present invention will be described in greater detail with reference to the attached figures.

Figure 1A:
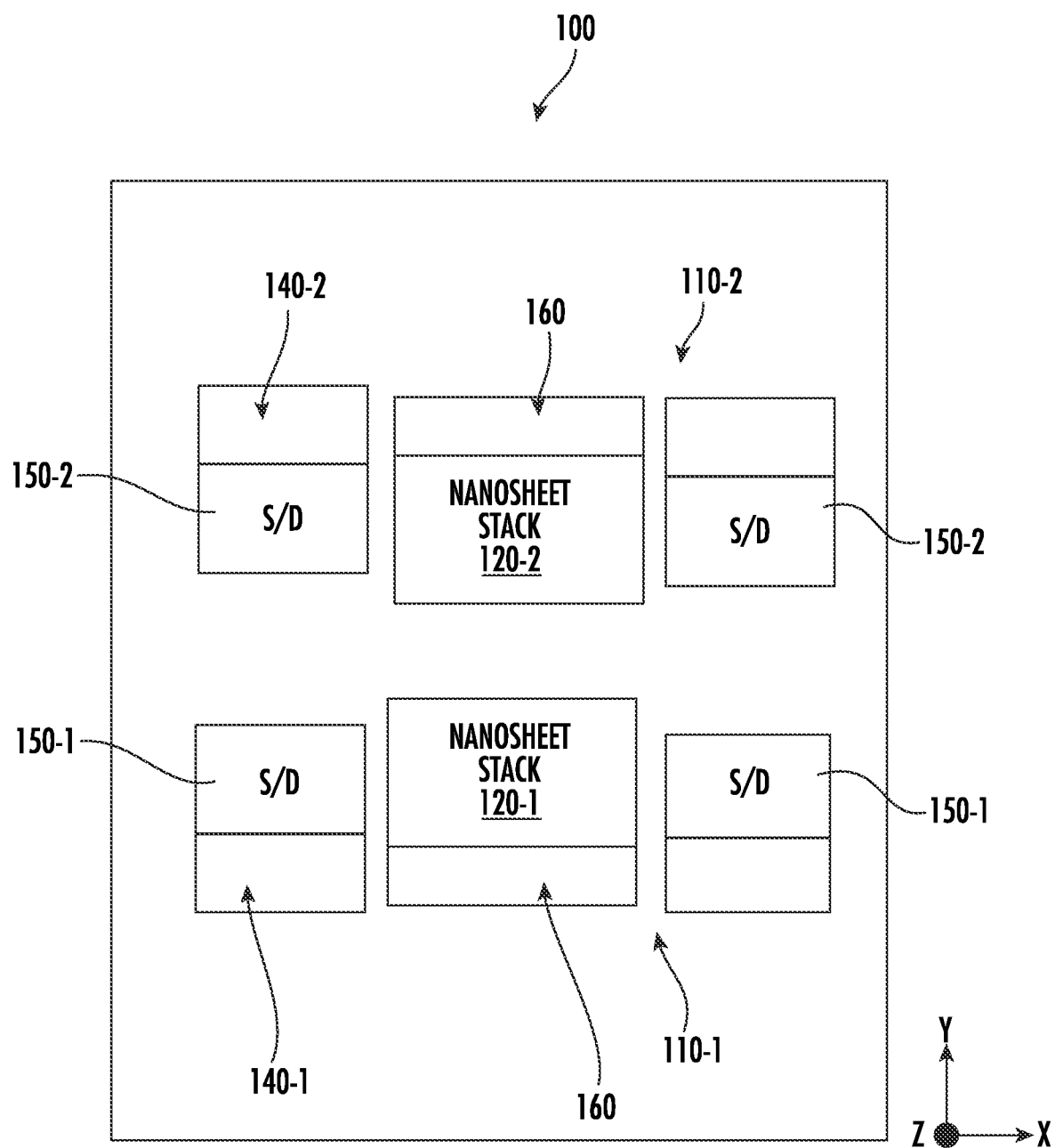
FIG. 1A is a plan view of a nanosheet transistor device according to some embodiments of the present invention.

FIGS. 1A-1D provide views of transistor devices according to various embodiments, viewed along different axes. FIG. 1A is a plan view of a nanosheet transistor device 100 according to some embodiments of the present invention. The device 100 includes first and second transistor stacks 110-1, 110-2. For simplicity of illustration, only two transistor stacks 110 are shown in FIG. 1A. In some embodiments, however, the device 100 may include three, four, or more transistor stacks 110. For example, the two transistor stacks 110-1, 110-2 may be a pair of transistor stacks 110 that are closer to each other than to any other transistor stack 110 in the device 100.

The first transistor stack 110-1 includes a first nanosheet stack 120-1 that is between a pair of source/drain regions 150-1 in a first horizontal direction X. The first nanosheet stack 120-1 includes upper and lower nanosheets NS-U and NS-L (FIG. 1B) and upper and lower gate portions G-U and G-L (FIG. 1B) that are on the nanosheets NS. Though the nanosheets NS may contact the source/drain regions 150-1, the gate portions G-U and G-L may be spaced apart from the source drain regions 150-1 in the direction X by upper and lower insulating spacers IS-U and IS-L (FIG. 1C), which may be referred to herein as "inner spacers."

Each source/drain region 150-1 may have a respective source/drain contact 140-1 adjacent thereto in a second horizontal direction Y, which may be perpendicular to the direction X. Accordingly, a pair of source/drain contacts 140-1 can be on opposite sides of the first nanosheet stack 120-1. Each source/drain contact 140-1 may comprise, for example, metal.

To reduce parasitic capacitance with the source/drain contacts 140-1, an insulation region 160 of the transistor stack 110-1 is provided adjacent (e.g., aligned/overlapping in the direction X with) the source/drain contact(s) 140-1. The region 160 may also reduce parasitic capacitance with both source/drain regions 150-1. Likewise, a second nanosheet stack 120-2 of the second transistor stack 110-2 is between a pair of source/drain regions 150-2, and the transistor stack 110-2 has an insulation region 160 that is adjacent a source/drain contact 140-2.

Figure 1B:
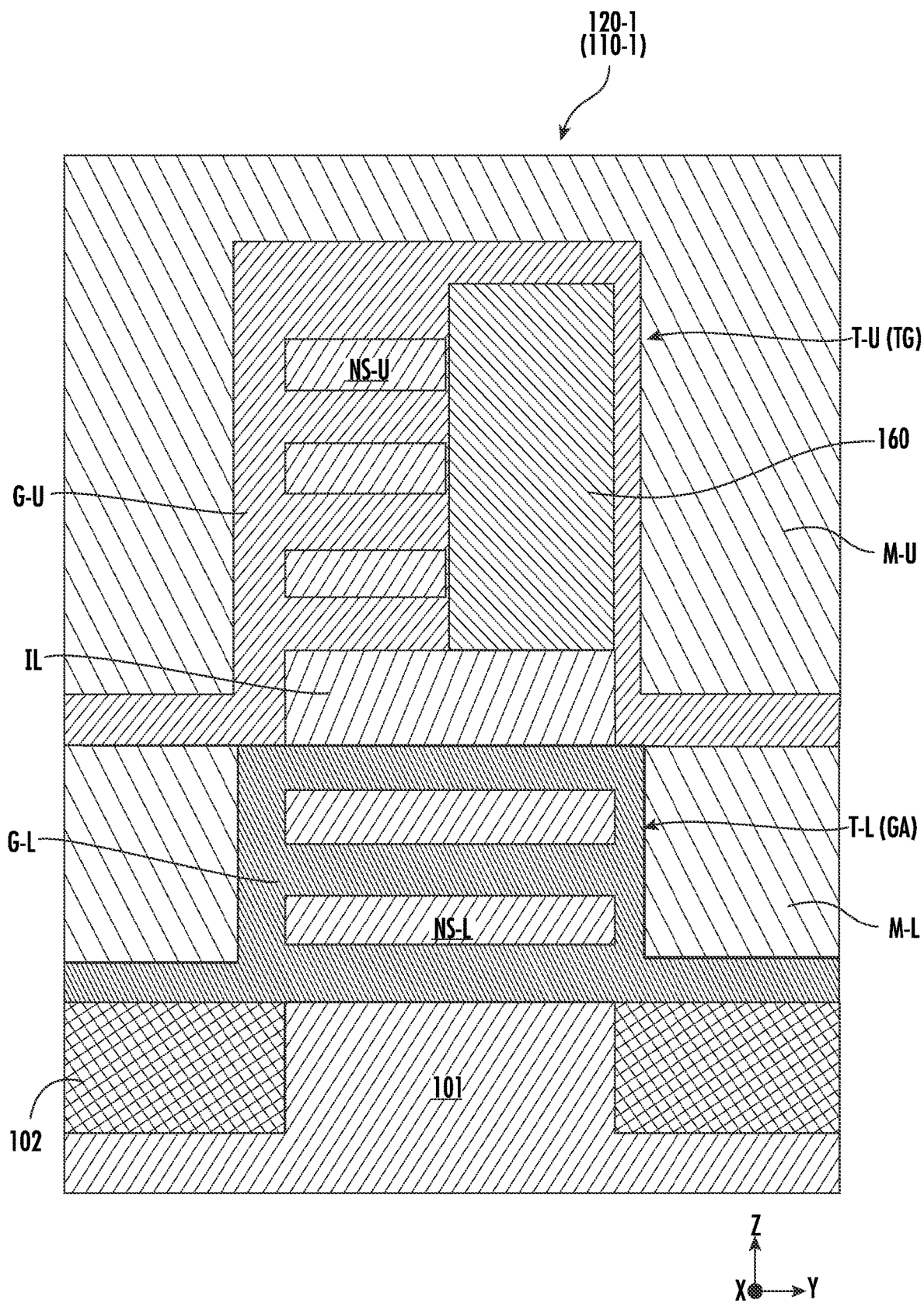
FIG. 1B is a cross-sectional view, taken along the direction Y, of the first transistor stack of the nanosheet transistor device of FIG. 1A.

FIG. 1B is a cross-sectional view, taken along the direction Y, of the first transistor stack 110-1 of the nanosheet transistor device 100 of FIG. 1A. As shown in FIG. 1B, the nanosheet stack 120-1 of the first transistor stack 110-1 includes a plurality of lower nanosheets NS-L of a lower transistor T-L and a plurality of upper nanosheets NS-U of an upper transistor T-U. The upper nanosheets NS-U overlap the lower nanosheets NS-L in a vertical direction Z that is perpendicular to the horizontal directions X and Y.

The lower transistor T-L further includes a lower gate G-L that is on the lower nanosheets NS-L. In the cross-sectional view of FIG. 1B, the lower gate G-L is shown on four sides of each of the lower nanosheets NS-L. The upper transistor T-U, on the other hand, further includes an upper gate G-U that is on three sides of each of the upper nanosheets NS-U in the cross-sectional view of FIG. 1B, and an insulation region 160 is on a fourth side of each of the upper nanosheets NS-U. Accordingly, the transistors T-L, T-U shown in FIG. 1B are a gate-all-around ("GAA") transistor GA and a tri-gate nanosheet transistor TG, respectively.

The insulation region 160 may contact respective sidewalls of the upper nanosheets NS-U and may vertically overlap the lower nanosheets NS-L. The insulation region 160 may comprise, for example, silicon nitride or silicon oxide. In some embodiments, the insulation region 160 may comprise a low-k spacer, which can provide better capacitance-reduction than a higher-k insulator. As used herein, the term "low-k" refers to a material that has a smaller dielectric constant than silicon dioxide.

An isolation region IL separates the lower nanosheets NS-L from the upper nanosheets NS-U. The isolation region IL may comprise, for example, an oxide material. The insulation region 160 may be on an upper surface of the isolation region IL. As an example, a length of the isolation region IL in the direction Y may be equal to a combined length of the upper nanosheets NS-U and the insulation region 160 in the direction Y and/or equal to lengths of the lower nanosheets NS-L in the direction Y. In some embodiments, the upper gate G-U may be on opposite sidewalls of the isolation region IL. The isolation region IL may thus be inside the upper gate G-U. In other embodiments, the isolation region IL may be inside the lower gate G-L. In some embodiments, the isolation region IL may be between the upper gate G-U and the lower gate G-L.

The gates G-L, G-U may contact each other and thus may collectively provide a common gate electrode that is shared by the transistors T-L, T-U. For example, FIG. 1B shows that a lower surface of the upper gate G-U may contact an upper surface of the lower gate G-L. Moreover, each transistor stack 110 (FIG. 1A) may, in some embodiments, be a complementary field-effect transistor ("CFET") stack in which the lower transistor T-L and the upper transistor T-U are N-type and P-type transistors, respectively, or vice versa. Accordingly, the gates G-L, G-U may comprise different respective metals. As an example, the different metals may have different respective work functions.

Though the transistors T-L, T-U are shown in FIG. 1B as nanosheet transistors, at least one of the transistors T-L, T-U may, in some embodiments, be a vertical field-effect transistor ("VFET") or a fin field-effect transistor ("FinFET"). For example, the lower transistor T-L may be a nanosheet transistor as shown in FIG. 1B, and the upper transistor T-U may be a VFET or FinFET that may have a single channel region rather than the plurality of upper nanosheets NS-U that are shown in FIG. 1B. Accordingly, the present invention is not limited to transistors that have a plurality of nanosheets NS.

The transistors T-L, T-U may be stacked on a substrate 101 such that the lower transistor T-L is between the upper transistor T-U and the substrate 101. The substrate 101 may be, for example, a semiconductor substrate. In some embodiments, portions of the substrate 101 on opposite sides of the transistors T-L, T-U may be recessed and filled with an insulating material to provide trench isolation regions 102.

According to some embodiments, an upper metal layer M-U may be on the upper gate G-U, and a lower metal layer M-L may be on the lower gate G-L. For example, each of the metal layers M-U, M-L may comprise tungsten. Portions of the metal layers M-U, M-L may vertically overlap the trench isolation regions 102.

FIG. 1B also illustrates that the upper nanosheets NS-U may each have a width in the direction Y that is different from a width in the direction Y of each of the lower nanosheets NS-L. Specifically, due to the insulation region 160, the width of the upper nanosheets NS-U may be narrower than the width of the lower nanosheets NS-L. The nanosheet stack 120-1 may thus represent a stepped nanosheet ("sNS") structure. Example sNS structures are discussed in U.S. Provisional Patent Application Ser. No. 63/086,781, filed on Oct. 2, 2020, the disclosure of which is hereby incorporated herein in its entirety by reference.

Due to its wider nanosheet NS width, the lower transistor T-L can have fewer (e.g., two versus three) nanosheets NS than the upper transistor T-U, while still having the same total nanosheet NS cross-sectional area (and/or the same total nanosheet NS surface area) as the upper transistor T-U. Moreover, for simplicity of illustration, a gate insulation layer is omitted from view in FIG. 1B. It will be understood, however, that a gate insulation layer may extend between each nanosheet NS and the gate G. For example, a gate insulation layer may be between each upper nanosheet NS-U and the upper gate G-U, and may be between each lower nanosheet NS-L and the lower gate G-L. The gate insulation layer may wrap around each nanosheet NS and may be thinner than the isolation region IL.

Figure 1C:
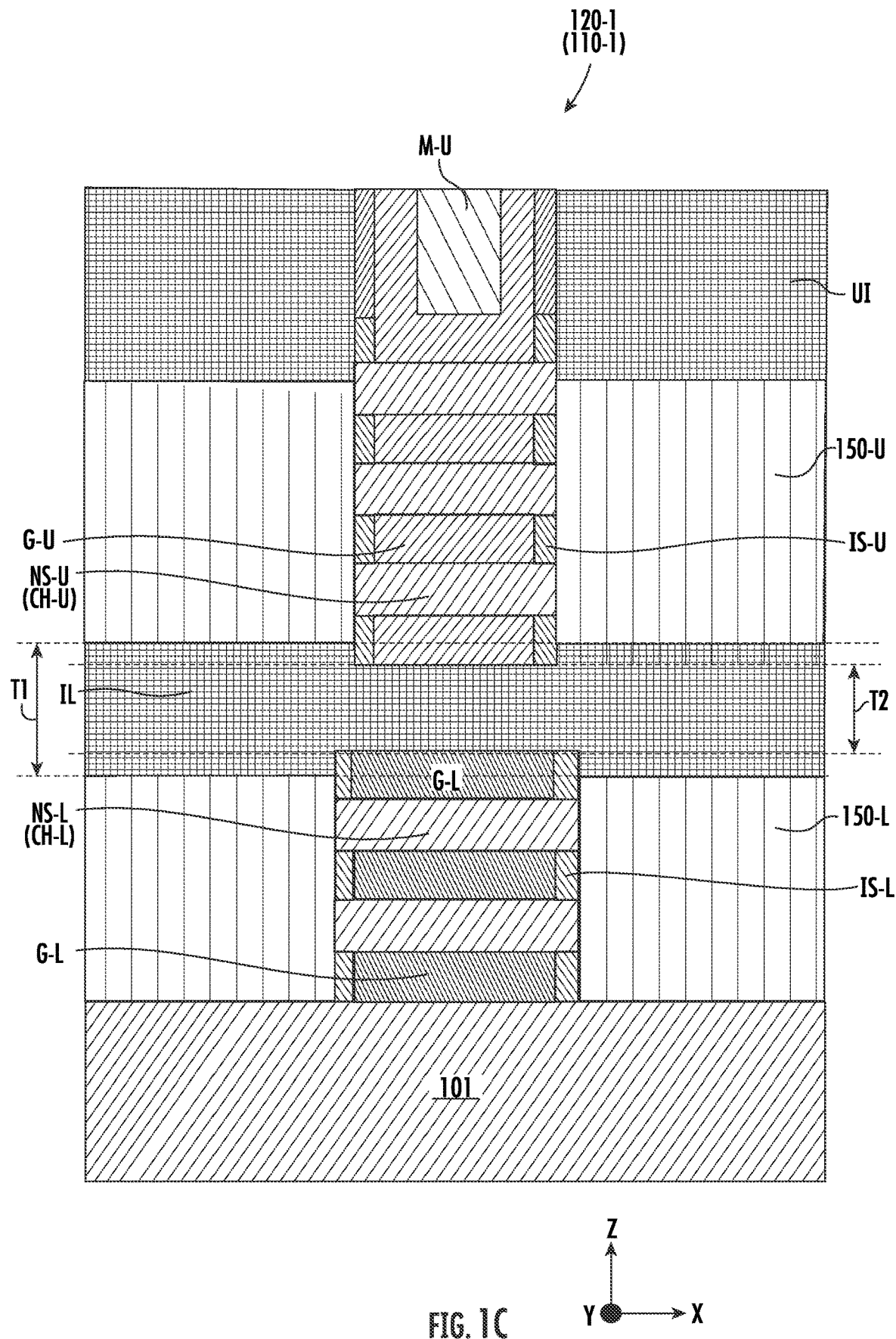
FIG. 1C is a cross-sectional view, taken along the direction X, of the first transistor stack of FIG. 1A according to some embodiments of the present invention.

FIG. 1C is a cross-sectional view, taken along the direction X, of the first transistor stack 110-1 of FIG. 1A according to some embodiments of the present invention. As shown in FIG. 1C, the stack 110-1 may comprise upper source/drain regions 150-U on sidewalls of the upper nanosheets NS-U, and lower source/drain regions 150-L on sidewalls of the lower nanosheets NS-L. Each upper nanosheet NS-U may provide an upper channel region CH-U between the upper source/drain regions 150-U. Likewise, each lower nanosheet NS-L may provide a lower channel region CH-L between the lower source/drain regions 150-L. Upper insulating spacers IS-U may be on sidewalls of the upper gate G-U between the upper nanosheets NS-U. Similarly, lower insulating spacers IS-L may be on sidewalls of the lower gate G-L between the lower nanosheets NS-L. The isolation region IL may separate the lower nanosheets NS-L from the upper nanosheets NS-U, as well as the lower insulating spacers IS-L from the upper insulating spacers IS-U and the lower source/drain regions 150-L from the upper source/drain regions 150-U.

In some embodiments, the isolation region IL may have a non-uniform thickness in the direction Z. For example, the isolation region IL may have a first thickness T1 that separates the lower source/drain regions 150-L from the upper source/drain regions 150-U. Moreover, the isolation region IL may have a second thickness T2 between an uppermost one of the lower insulating spacers IS-L (and/or the lower gate G-L) and a lowermost one of the upper insulating spacers IS-U (and/or the upper gate G-U). The second thickness T2 may be thinner than the first thickness T1. Moreover, the uppermost one of the lower insulating spacers IS-L may contact a lower portion (e.g., a lower surface and a side surface) of the isolation region IL, and the lowermost one of the upper insulating spacers IS-U may contact an upper portion (e.g., an upper surface and a side surface) of the isolation region IL.

As shown in the cross-sectional view in FIG. 1C, the lower gate G-L may, in some embodiments, be wider, in the direction X, than the upper gate G-U. The lower insulating spacers IS-L may thus be spaced farther apart from each other, in the direction X, than the upper insulating spacers IS-U.

Referring still to FIG. 1C, an upper isolation region UI may be on top of the upper source/drain regions 150-U. The upper isolation region UI may comprise, for example, an oxide material. In some embodiments, the upper isolation region UI and the isolation region IL may comprise the same oxide material.

Figure 1D:
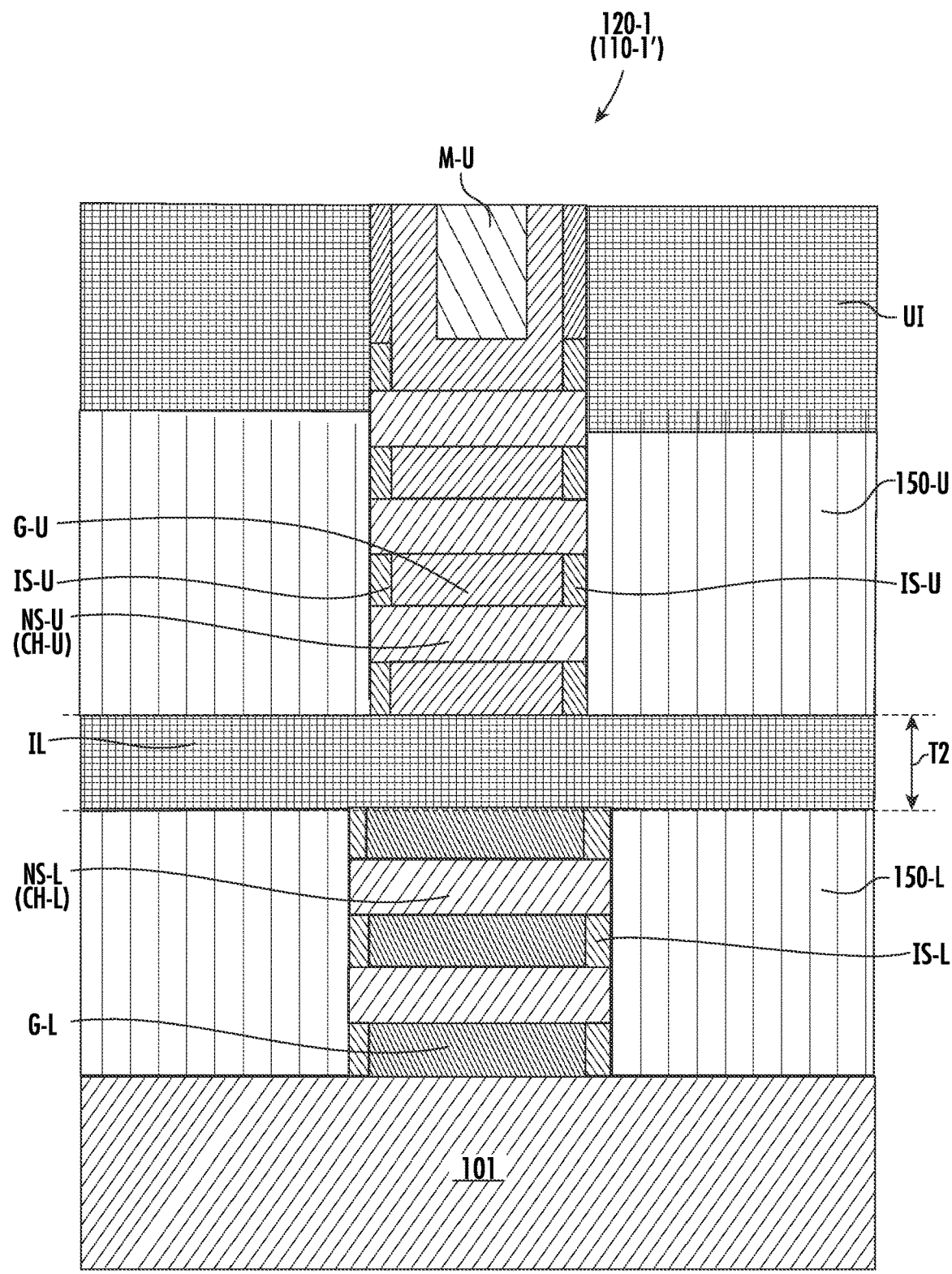
FIG. 1D is a cross-sectional view, taken along the direction X, of the first transistor stack of FIG. 1A according to other embodiments of the present invention.

FIG. 1D is a cross-sectional view, taken along the direction X, of a modified first transistor stack 110-1' corresponding to the stack 110-1 of FIG. 1A according to other embodiments of the present invention. The modified stack 110-1' of FIG. 1D differs from the stack 110-1 of FIG. 1C, in that an isolation region IL of the modified stack 110-1' has a uniform thickness T2. Accordingly, the isolation region IL of FIG. 1D separates the lower source/drain regions 150-L from the upper source/drain regions 150-U by the same distance that it separates the lower gate G-L from the upper gate G-U. As a result, a bonding process can be used to bond the lower transistor T-L to the upper transistor T-U. The stack 110-1 shown in FIG. 1C, on the other hand, can be implemented without using a bonding process.

Figure 2A:
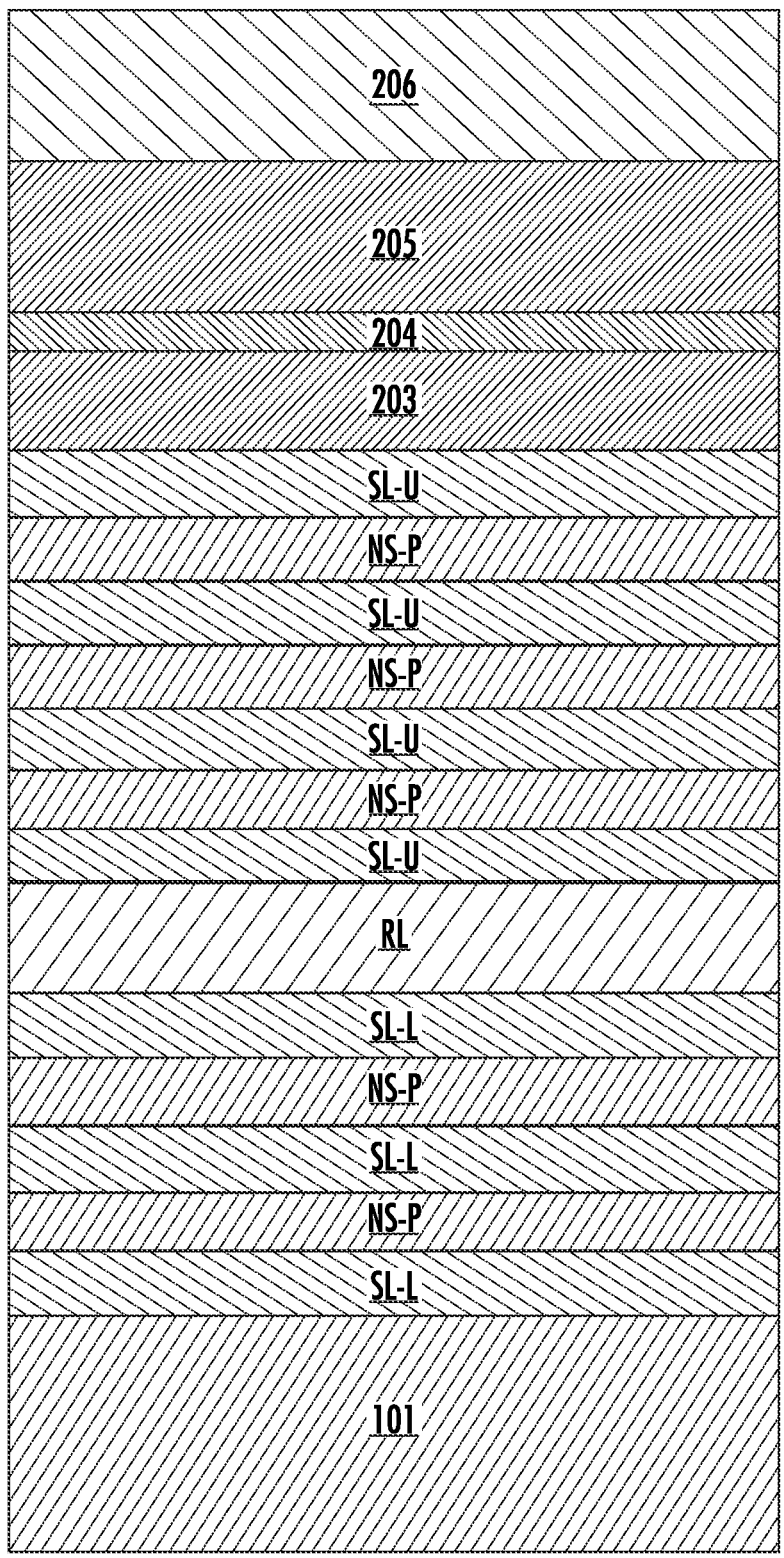

FIGS. 2A-2AN are cross-sectional views illustrating operations of forming the transistor stack 110-1 of FIGS. 1B and 1C. Referring to FIG. 2A, a plurality of sacrificial layers SL may alternate with a plurality of preliminary nanosheets NS-P in a vertical stack. The sacrificial layers SL may comprise, for example, silicon germanium ("SiGe"), and the preliminary nanosheets NS-P may each be, for example, a silicon ("Si") sheet. In some embodiments, the sacrificial layers SL and/or the preliminary nanosheets NS-P may be epitaxially grown on a substrate 101, which may comprise Si. Upper ones of the preliminary nanosheets NS-P may be referred to herein as "upper channel layers," and lower ones of the preliminary nanosheets NS-P may be referred to herein as "lower channel layers," as the preliminary nanosheets NS-P will be etched to form nanosheets NS that function as respective channel regions. Moreover, the sacrificial layers SL and the preliminary nanosheets NS-P may collectively be referred to herein as a "preliminary transistor stack."

The preliminary transistor stack also includes a sacrificial layer RL that separates upper ones of the preliminary nanosheets NS-P from lower ones of the preliminary nanosheets NS-P. In some embodiments, the sacrificial layer RL and the preliminary nanosheets NS-P may be epitaxially grown. Ones of the sacrificial layers SL that are above the sacrificial layer RL are upper sacrificial layers SL-U, and ones of the sacrificial layers SL that are below the sacrificial layer RL are lower sacrificial layers SL-L. The upper ones of the preliminary nanosheets NS-P alternate with the upper sacrificial layers SL-U, and the lower ones of the preliminary nanosheets NS-P alternate with the lower sacrificial layers SL-L. Moreover, the sacrificial layer RL may contact a lowermost one of the upper sacrificial layers SL-U and an uppermost one of the lower sacrificial layers SL-L. The sacrificial layer RL may also be referred to herein as a "replacement isolation dummy layer," as it will be replaced with an isolation layer 228 (FIG. 2V) that is part of the isolation region IL (FIG. 1B).

The sacrificial layer RL may comprise a first sacrificial material that has etch selectivity with respect to a second sacrificial material of the sacrificial layers SL (and with respect to the preliminary nanosheets NS-P). For example, the sacrificial layer RL may comprise Si, which has etch selectivity with respect to SiGe of the sacrificial layers SL, and which can be grown on the SiGe. As another example, the sacrificial layer RL may comprise SiGe having a first concentration of Ge, and the sacrificial layers SL may comprise SiGe having a second concentration of Ge, where the first concentration is higher than the second concentration. Accordingly, high-Ge SiGe can be used for the sacrificial layer RL if it has etch selectivity with respect to SiGe of the sacrificial layers SL. Moreover, the sacrificial layer RL may be thicker than each of the sacrificial layers SL.

Insulating layers 203-205 may be in a stack on top of the preliminary nanosheets NS-P and the sacrificial layers SL. For example, the insulating layers 203, 205 may each comprise an oxide material, and the insulating layer 204 may comprise silicon nitride ("SiN"). Moreover, a hardmask layer 206 may be deposited on top of the insulating layers 203-205. As an example, the hardmask layer 206 may comprise Si.

Figure 2B:
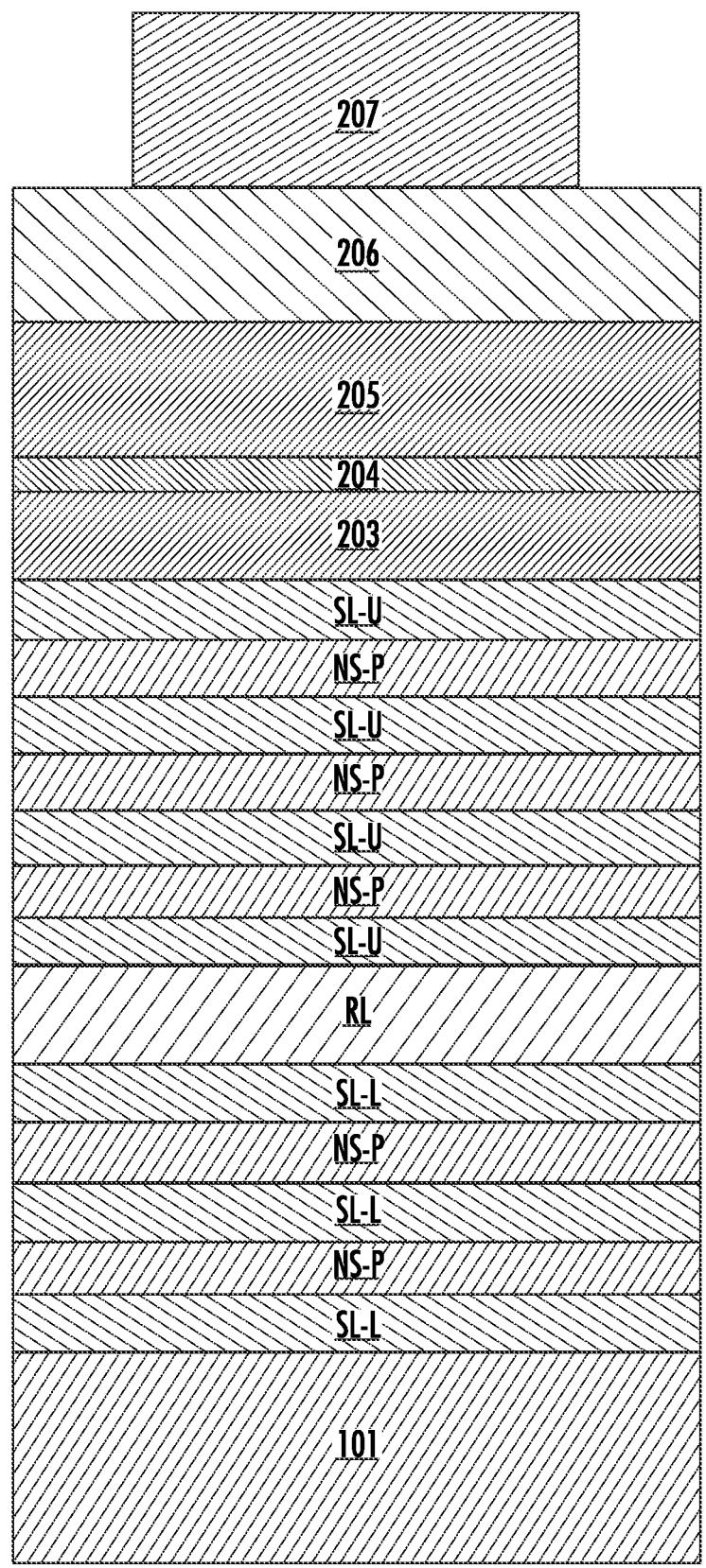

Referring to FIG. 2B, a mask layer 207 may be formed on the hardmask layer 206. The mask layer 207 may be patterned to be narrower than the hardmask layer 206.

Figure 2C:
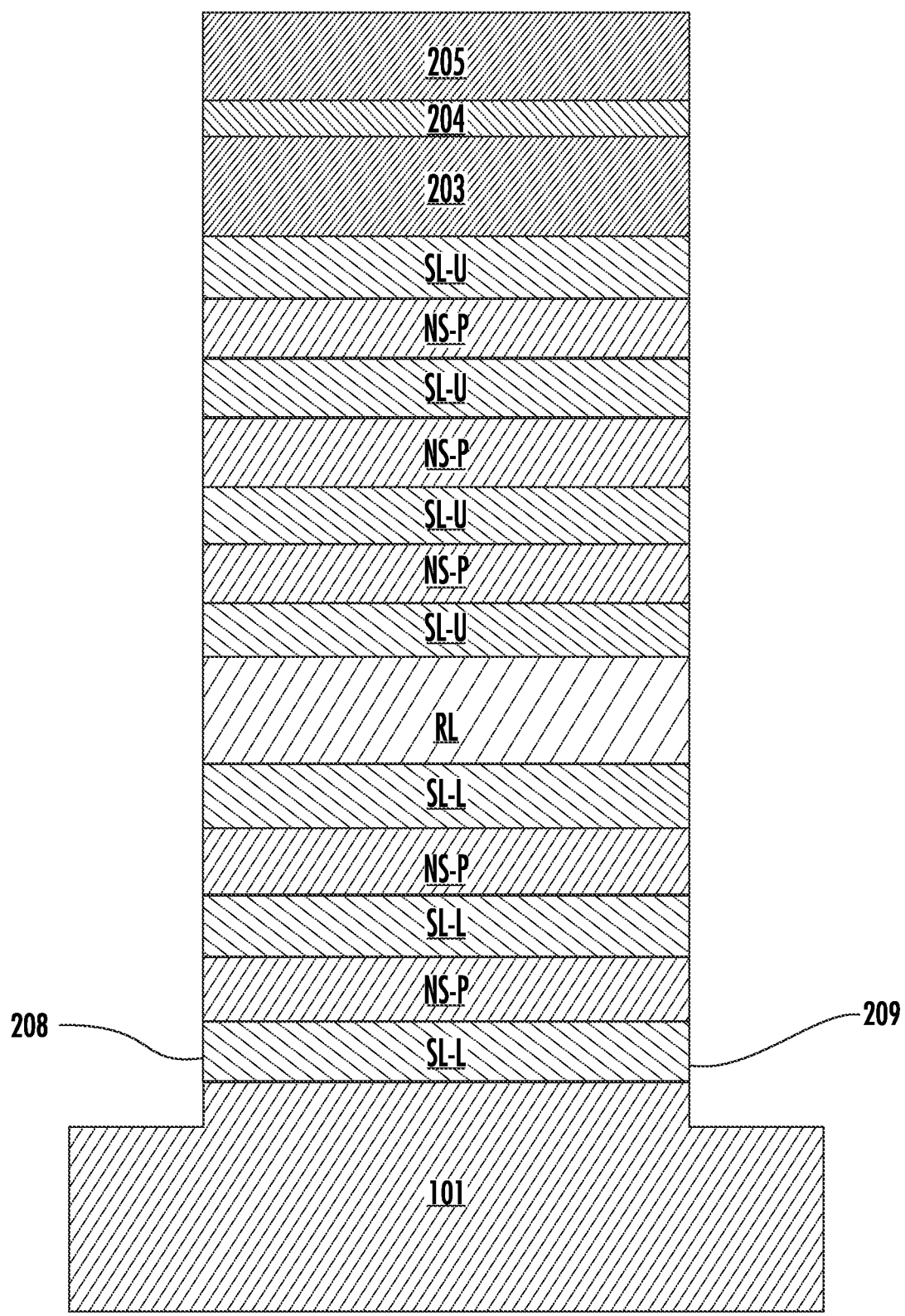

Referring to FIG. 2C, recess regions 208, 209 may be formed in the preliminary transistor stack by using the mask layer 207 and the hardmask layer 206 as an etch mask. After forming the recess regions 208, 209, the mask layer 207 and the hardmask layer 206 may be removed.

Figure 2D:
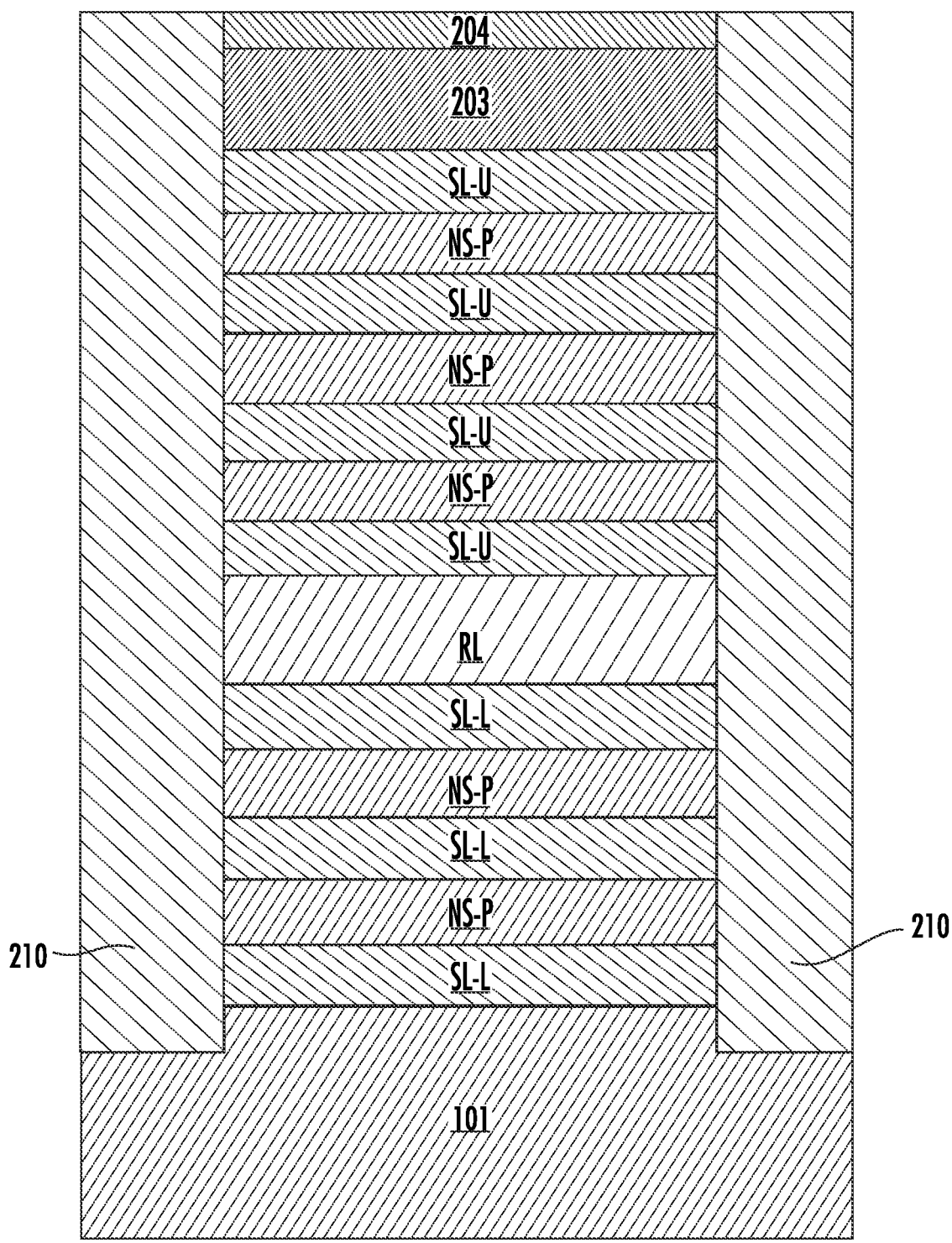

Referring to FIG. 2D, dielectric regions 210 may be formed in the recess regions 208, 209 and may be planarized (e.g., using chemical mechanical planarization ("CMP")) to have upper surfaces that are coplanar with an upper surface of the insulating material 204.

Figure 2E:
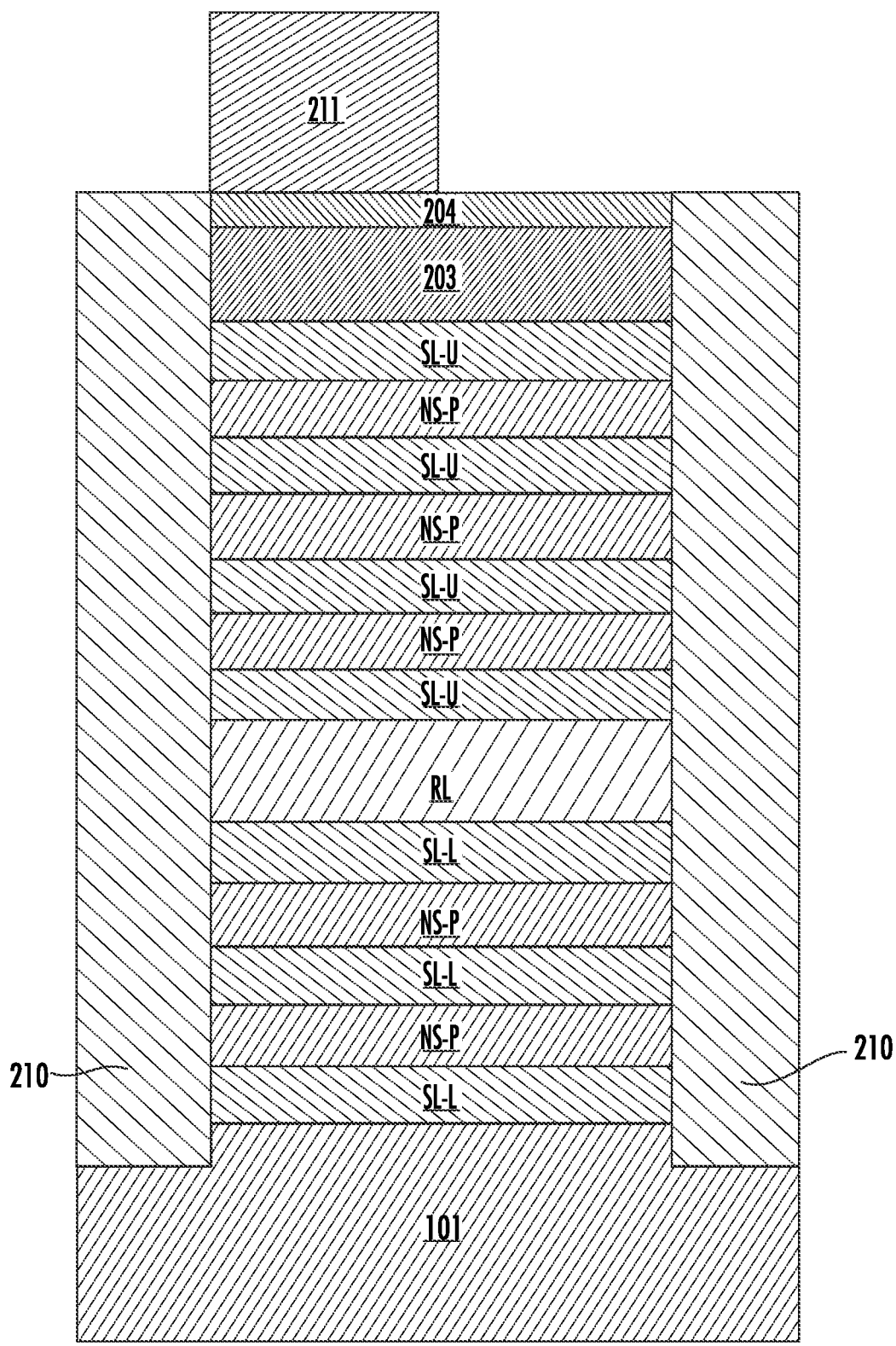

Referring to FIG. 2E, a mask layer 211 may be formed on top of the preliminary transistor stack. The mask layer 211 may be patterned to vertically overlap a portion (e.g., one half) of the preliminary transistor stack.

Figure 2F:
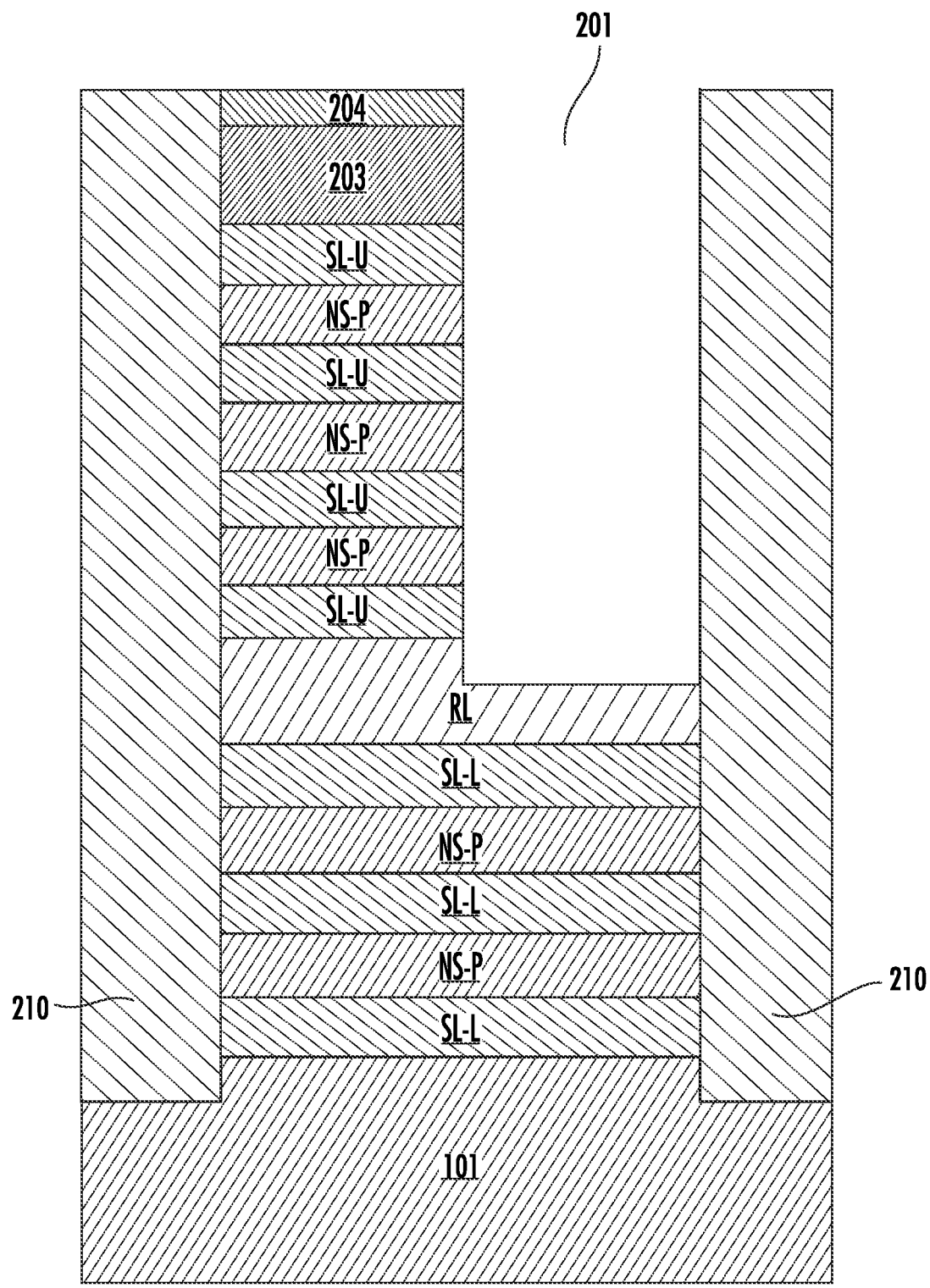

Referring to FIG. 2F, a recess region 201 may be formed in the preliminary transistor stack by using the mask layer 211 as an etch mask. As a result, the upper sacrificial layers SL-U and the upper ones of the preliminary nanosheets NS-P are etched to narrow the width thereof, thus exposing a portion of an upper surface of the sacrificial layer RL. For example, the recess region 201 may extend into (but not completely through) the sacrificial layer RL.

Figure 2G:
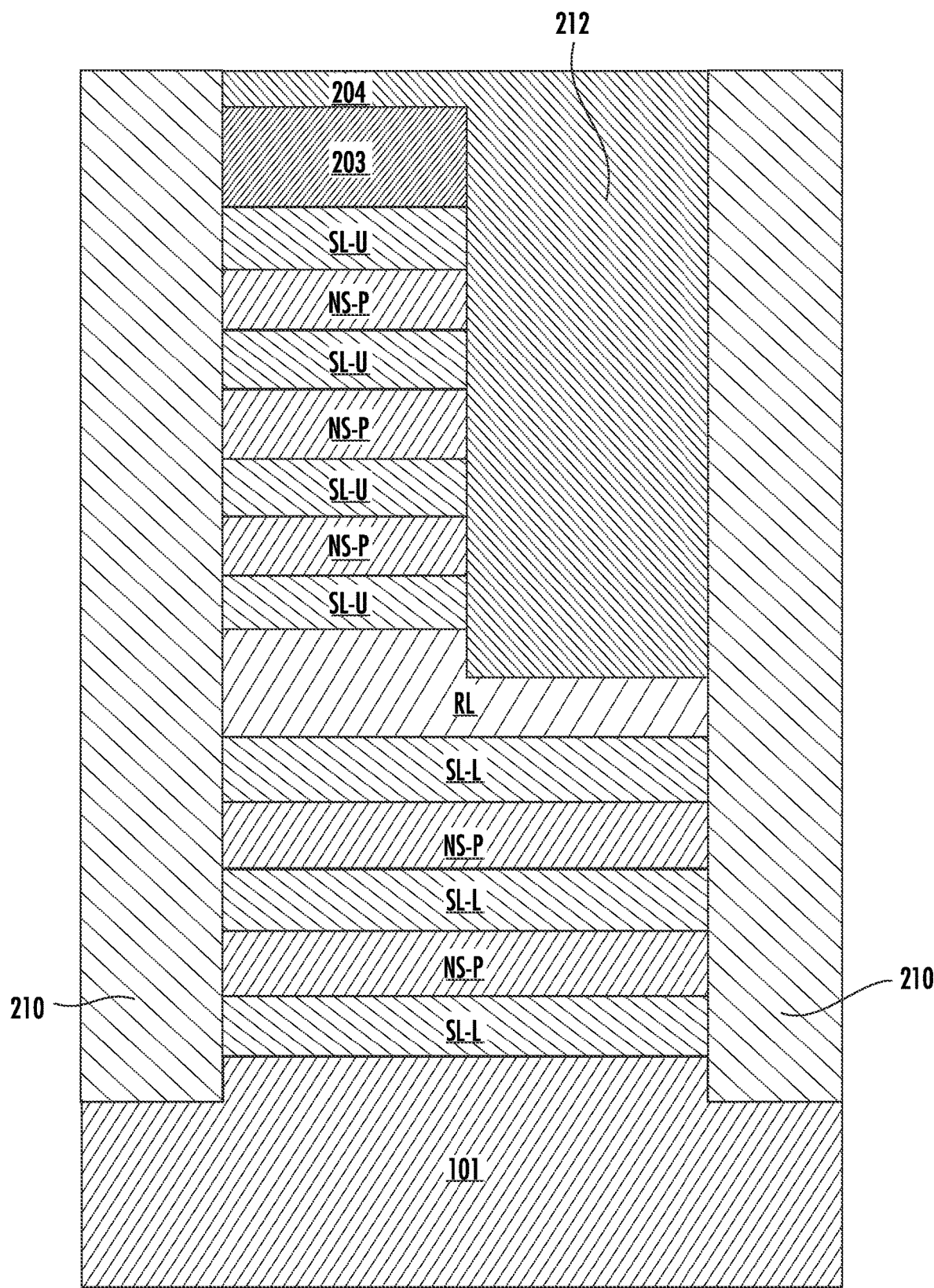

Referring to FIG. 2G, an insulating layer 212 may be formed in the recess region 201 and planarized (e.g., using CMP). The insulating layer 212 may comprise, for example, SiN.

Figure 2H:
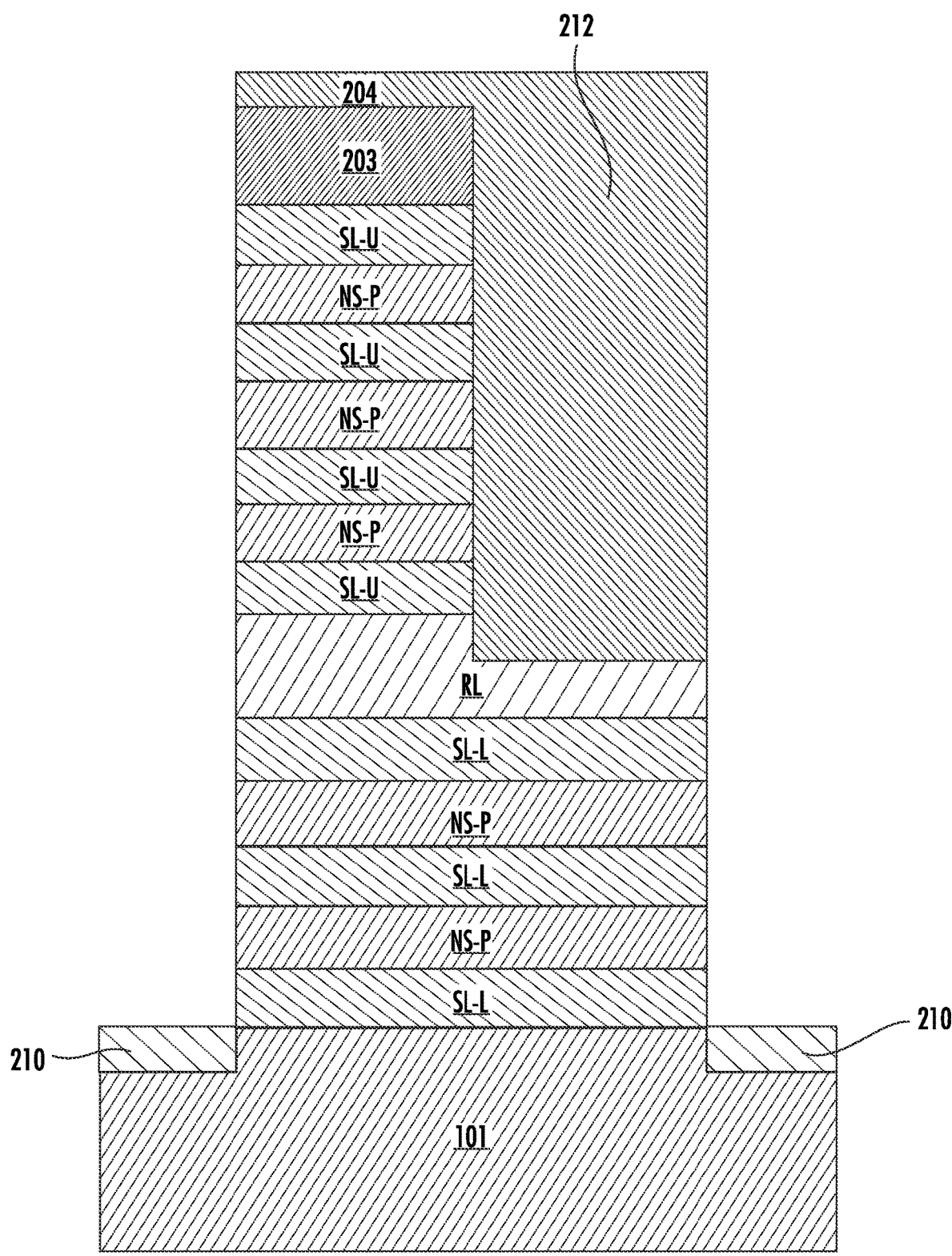

Referring to FIG. 2H, the dielectric regions 210 may be recessed until they are below a level of the lowermost preliminary nanosheet NS-P. For example, the dielectric regions 210 may be recessed to have upper surfaces that are coplanar with an upper surface of the substrate 101.

Figure 2I:
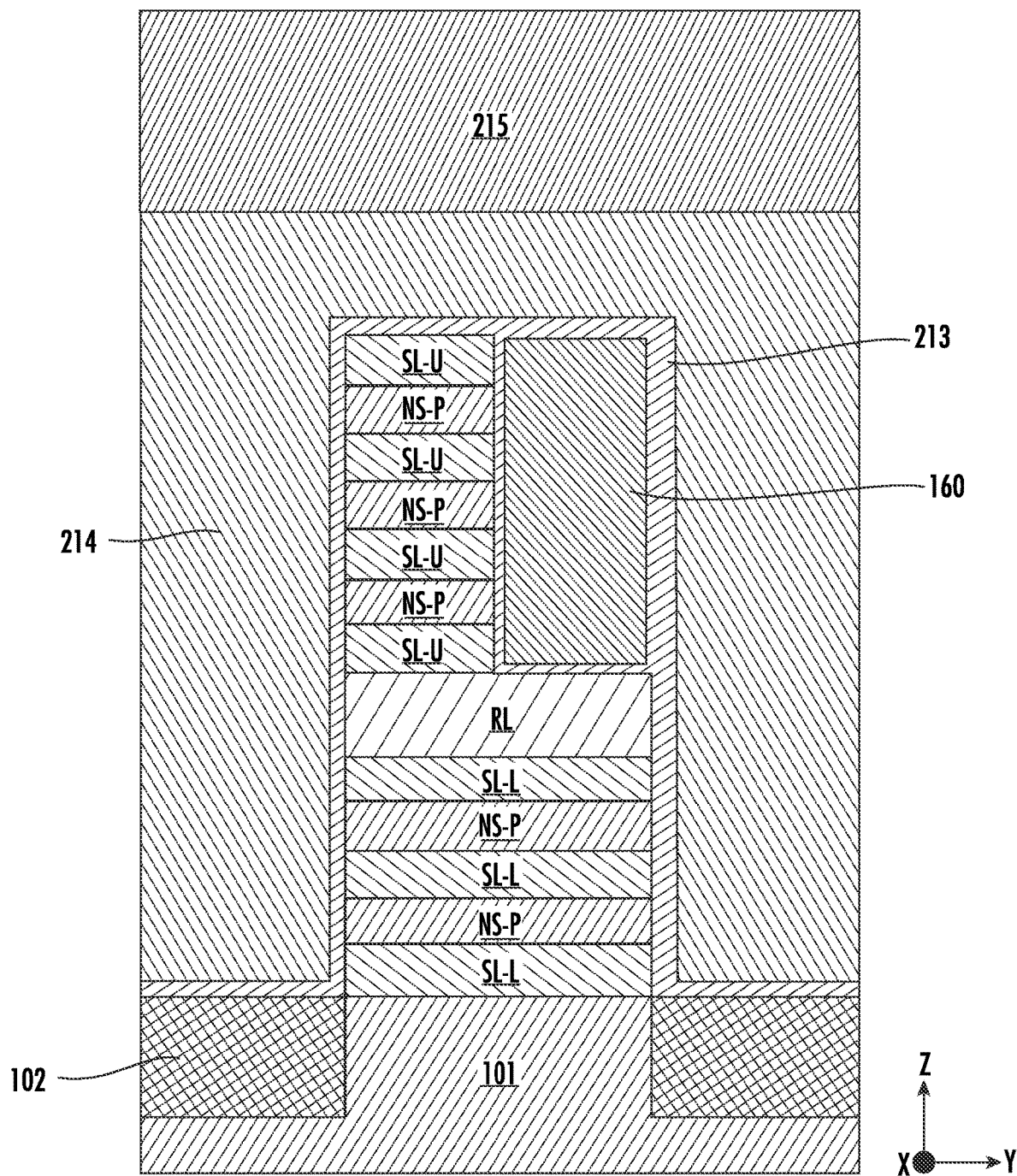

Referring to FIG. 2I, which is a cross-sectional view taken along the direction Y, the insulating layer 212 may be patterned to form the insulation (e.g., dielectric) region 160. Moreover, a spacer layer 213 may be deposited on the insulation region 160, the preliminary transistor stack, and the trench isolation regions 102. Also, a sacrificial material 214 may be formed on the spacer layer 213, and a hardmask layer 215 may be formed on the sacrificial material 214. The sacrificial material 214 may comprise, for example, polysilicon.

Figure 2J:
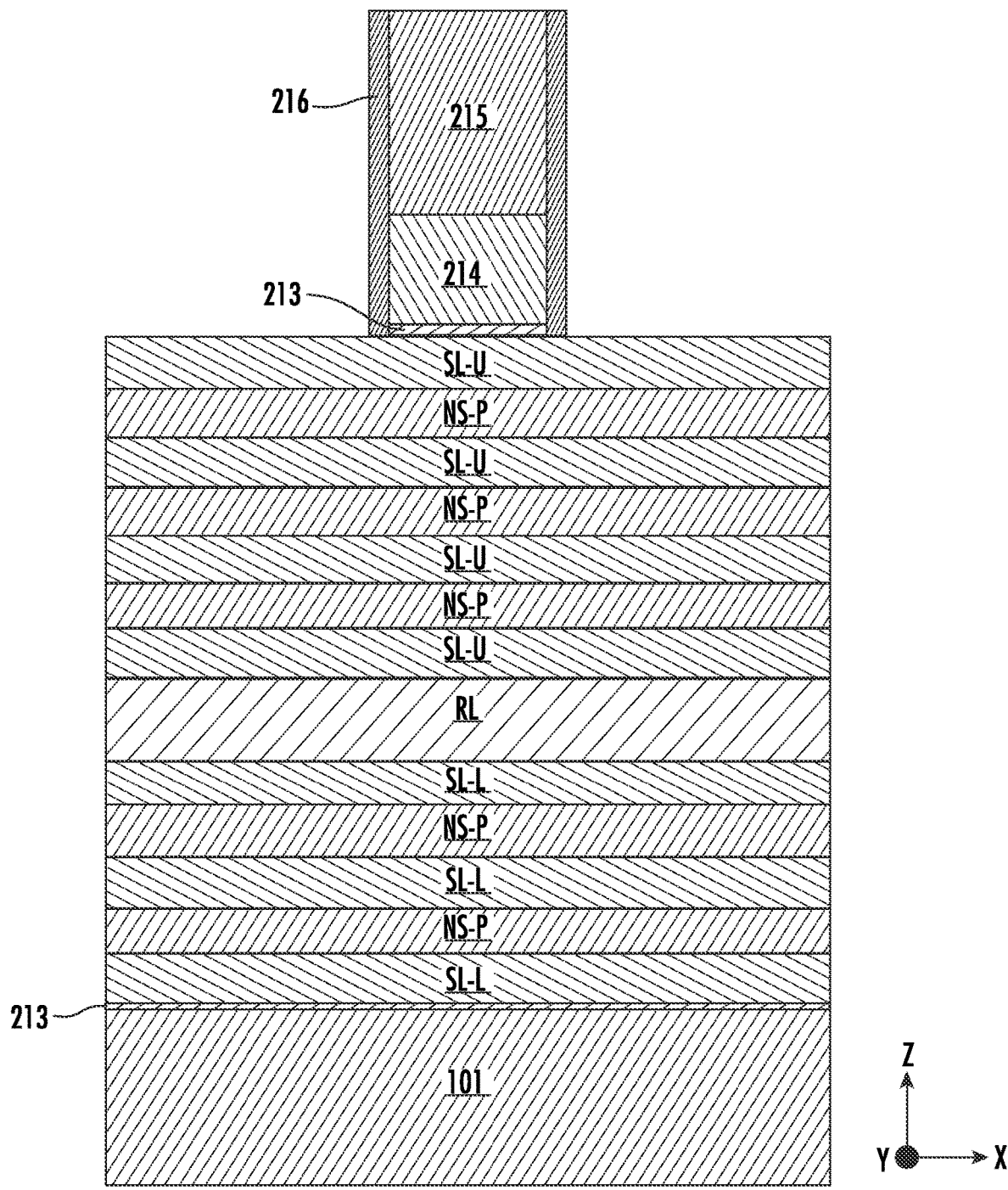

Referring to FIG. 2J, which is a cross-sectional view taken along the direction X, the hardmask layer 215 may have spacers 216 on sidewalls thereof.

Figure 2K:
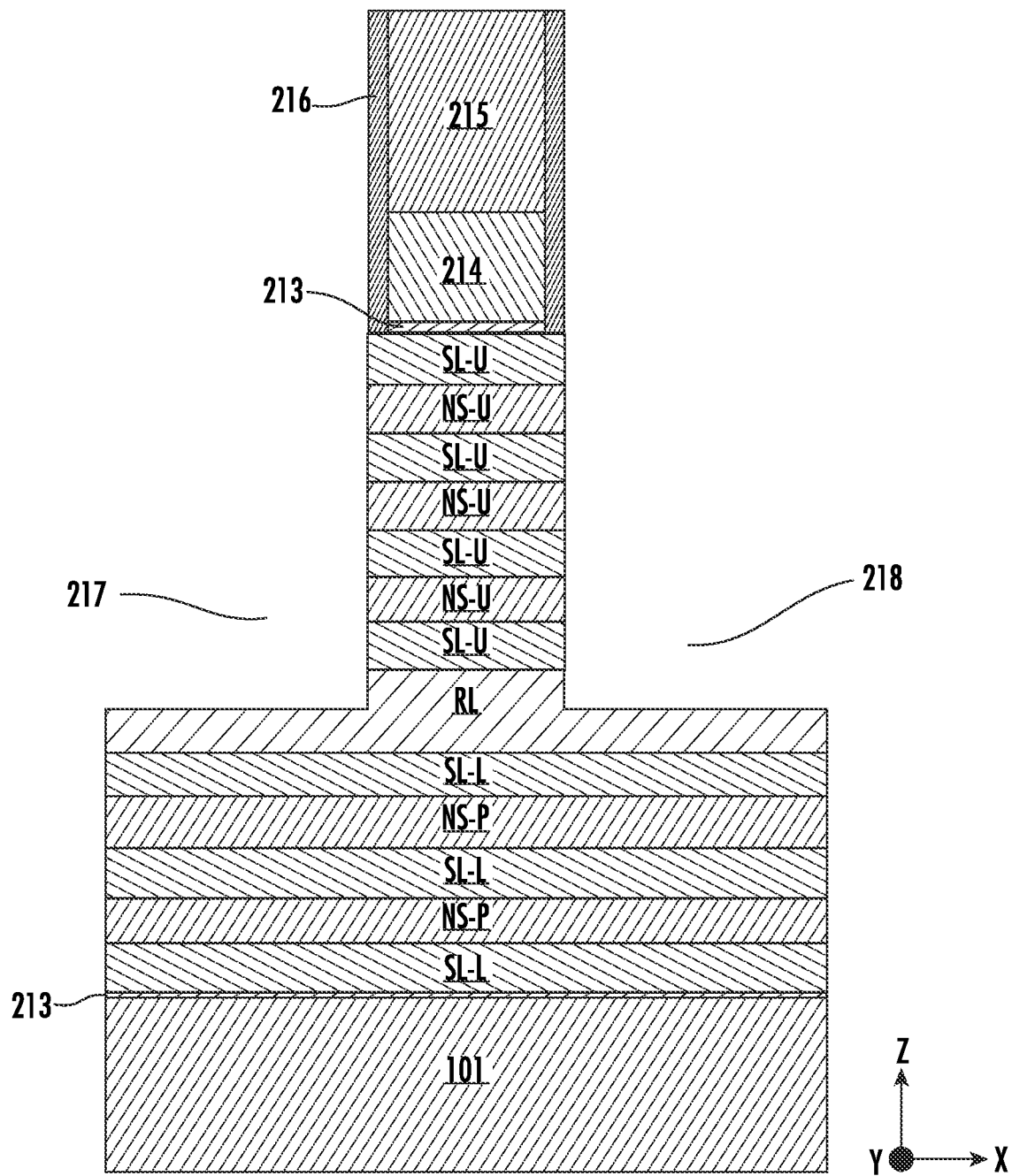

Referring to FIG. 2K, which is a cross-sectional view taken along the direction X, the preliminary transistor stack is recessed to about the depth of the sacrificial layer RL by using the hardmask layer 215 and spacers 216 as an etch mask. As a result, the width of the upper ones of the preliminary nanosheets NS-P is narrowed, thus forming upper nanosheets NS-U. The width of the upper sacrificial layers SL-U is also narrowed, thus forming recess regions 217, 218 alongside the upper sacrificial layers SL-U and the upper nanosheets NS-U. While forming the recess regions 217, 218, the sacrificial layer RL may be partially recessed, without etching completely through the sacrificial layer RL to the uppermost one of the lower sacrificial layers SL-L thereunder.

Figure 2L:
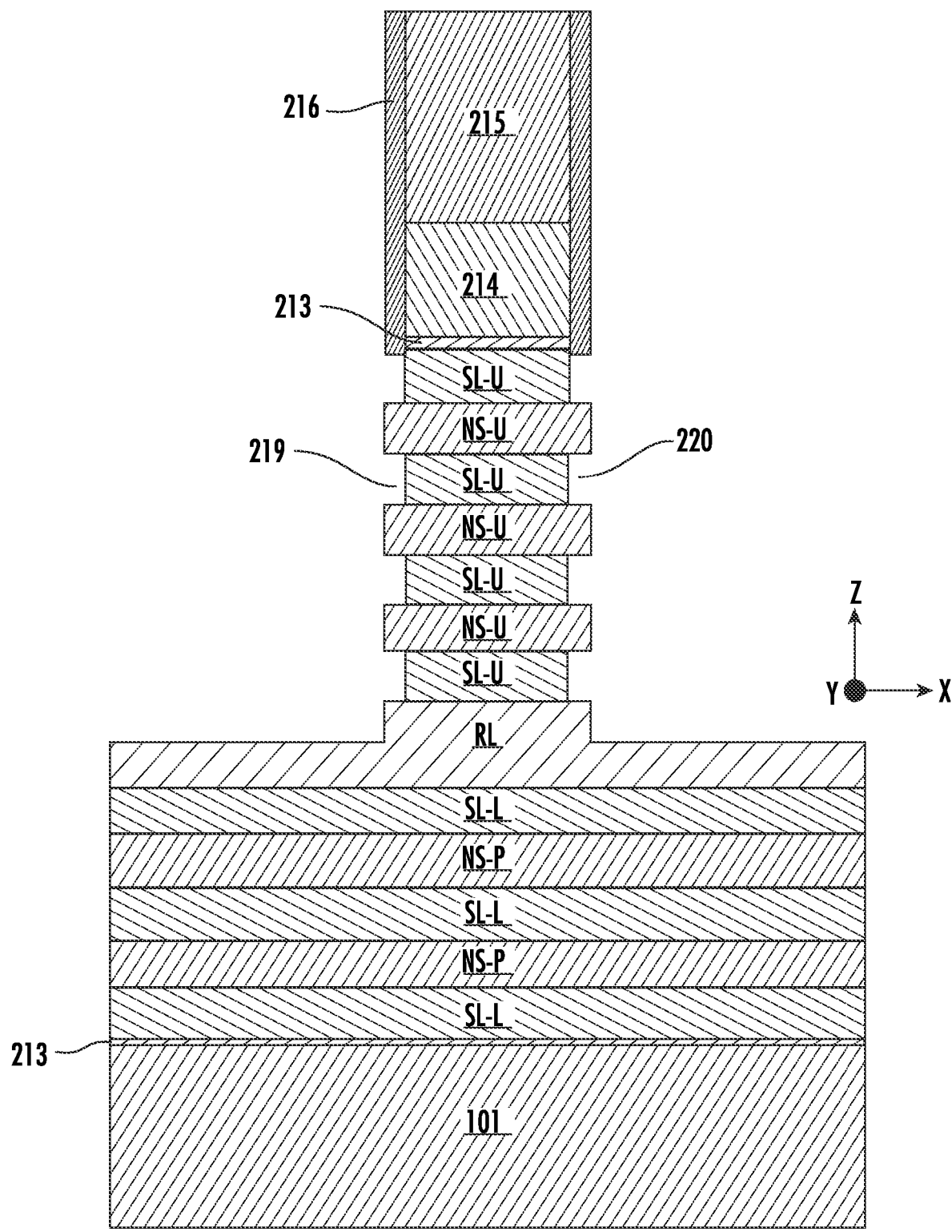

Referring to FIG. 2L, which is a cross-sectional view taken along the direction X, sidewalls of the upper sacrificial layers SL-U are recessed to form recess regions 219, 220 between the upper nanosheets NS-U, as well as between the sacrificial layer RL and a lowermost one of the upper nanosheets NS-U, and between an uppermost one of the upper nanosheets NS-U and the sacrificial material 214. For example, the recess regions 219, 220 may be formed by performing a low-Ge SiGe etch-back for the upper sacrificial layers SL-U.

Figure 2M:
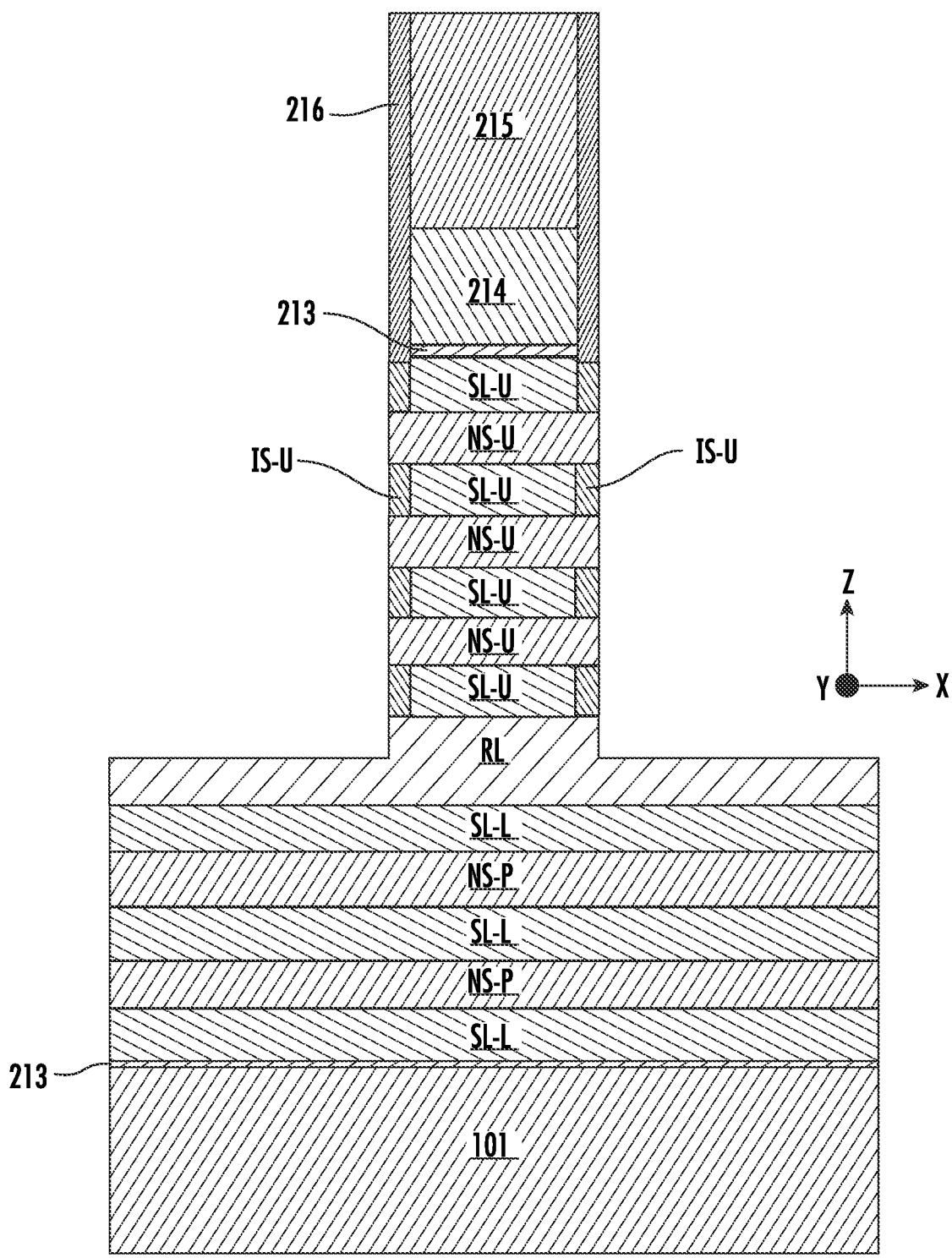

Referring to FIG. 2M, which is a cross-sectional view taken along the direction X, upper insulating spacers IS-U are formed in the recess regions 219, 220. As a result, the upper insulating spacers IS-U are on sidewalls of the upper sacrificial layers SL-U. The upper insulating spacers IS-U are (i) between the upper nanosheets NS-U, (ii) between the sacrificial layer RL and a lowermost one of the upper nanosheets NS-U, and (ii) between an uppermost one of the upper nanosheets NS-U and the sacrificial material 214. The upper insulating spacers IS-U may be formed by, for example, performing a SiN deposition and etch-back.

Figure 2N:
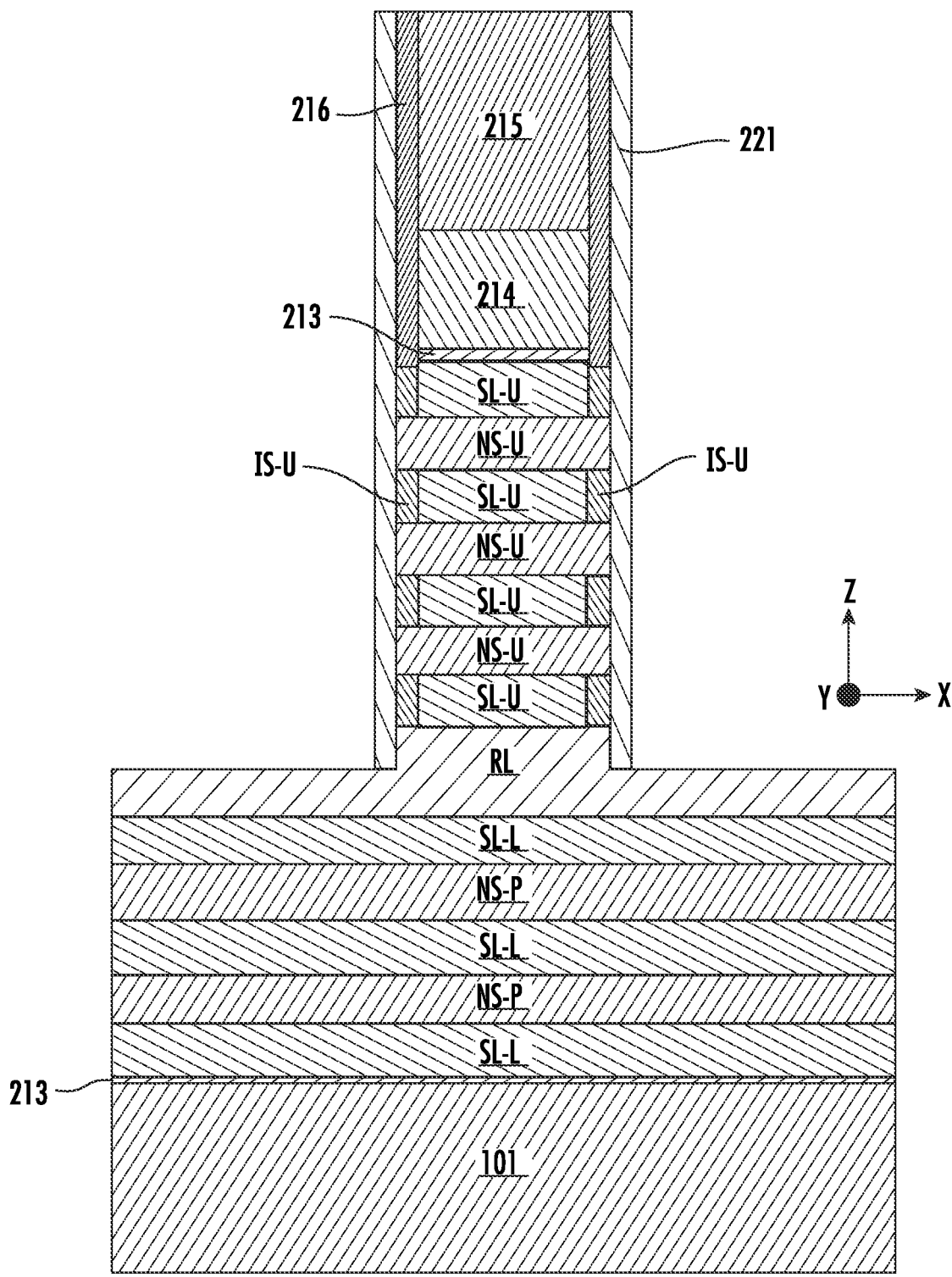
Figure 20:
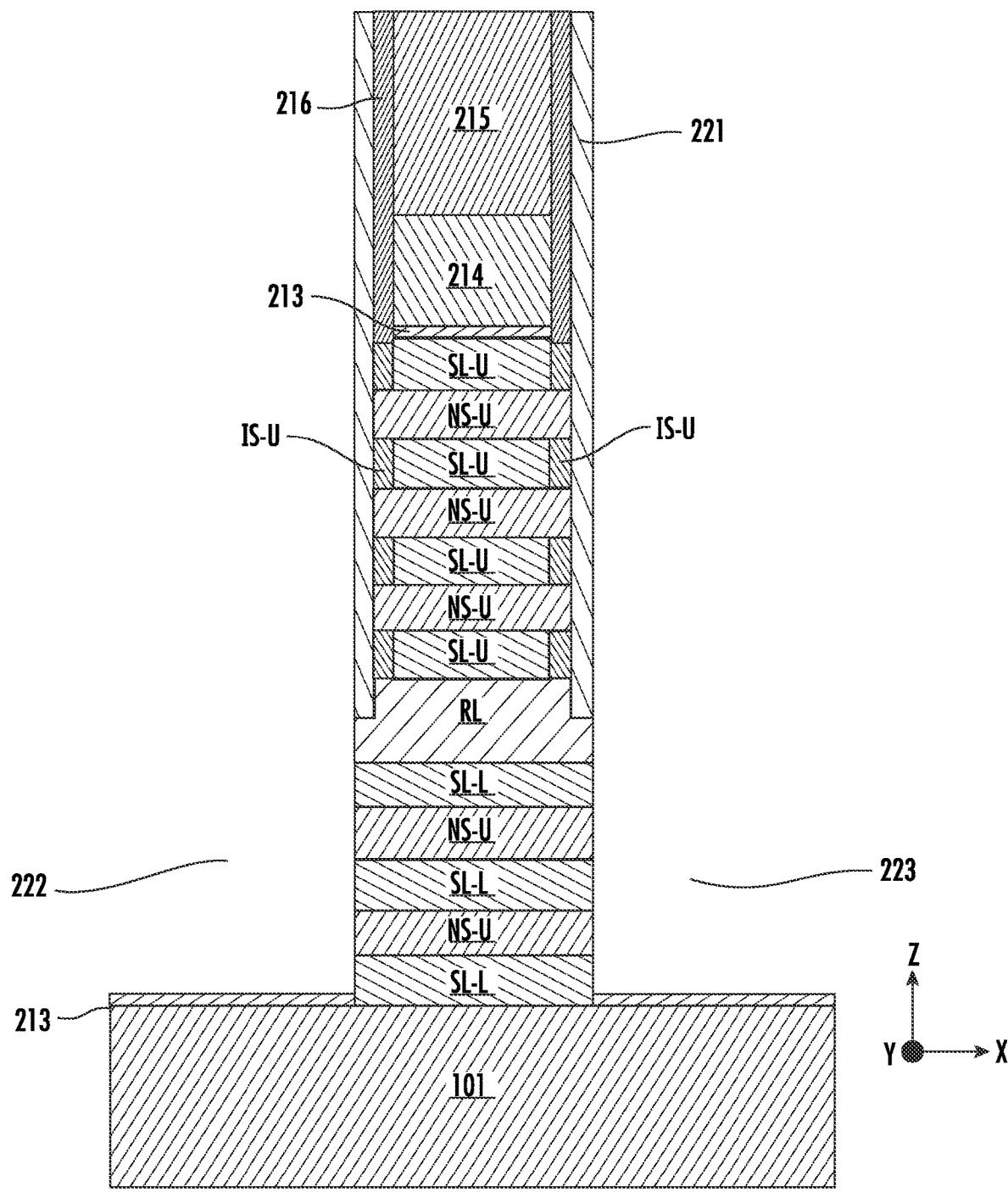

Referring to FIG. 2N, which is a cross-sectional view taken along the direction X, spacers 221 are deposited on sidewalls of the upper insulating spacers IS-U and on sidewalls of the spacers 216. For example, the spacers 221 may extend continuously from sidewalls of the sacrificial layer RL to upper portions of the spacers 216.

Referring to FIG. 2O, which is a cross-sectional view taken along the direction X, lower side regions of the preliminary transistor stack are recessed while using the spacers 216, 221 and the hardmask layer 215 as an etch mask to protect the upper nanosheets NS-U and the upper insulating spacers IS-U. As a result, the lower ones of the preliminary nanosheets NS-P are narrowed to form lower nanosheets NS-L and recess regions 222, 223 that are adjacent the lower nanosheets NS-L. The lower sacrificial layers SL-L are also narrowed, as is a lower portion of the sacrificial layer RL.

Figure 2P:
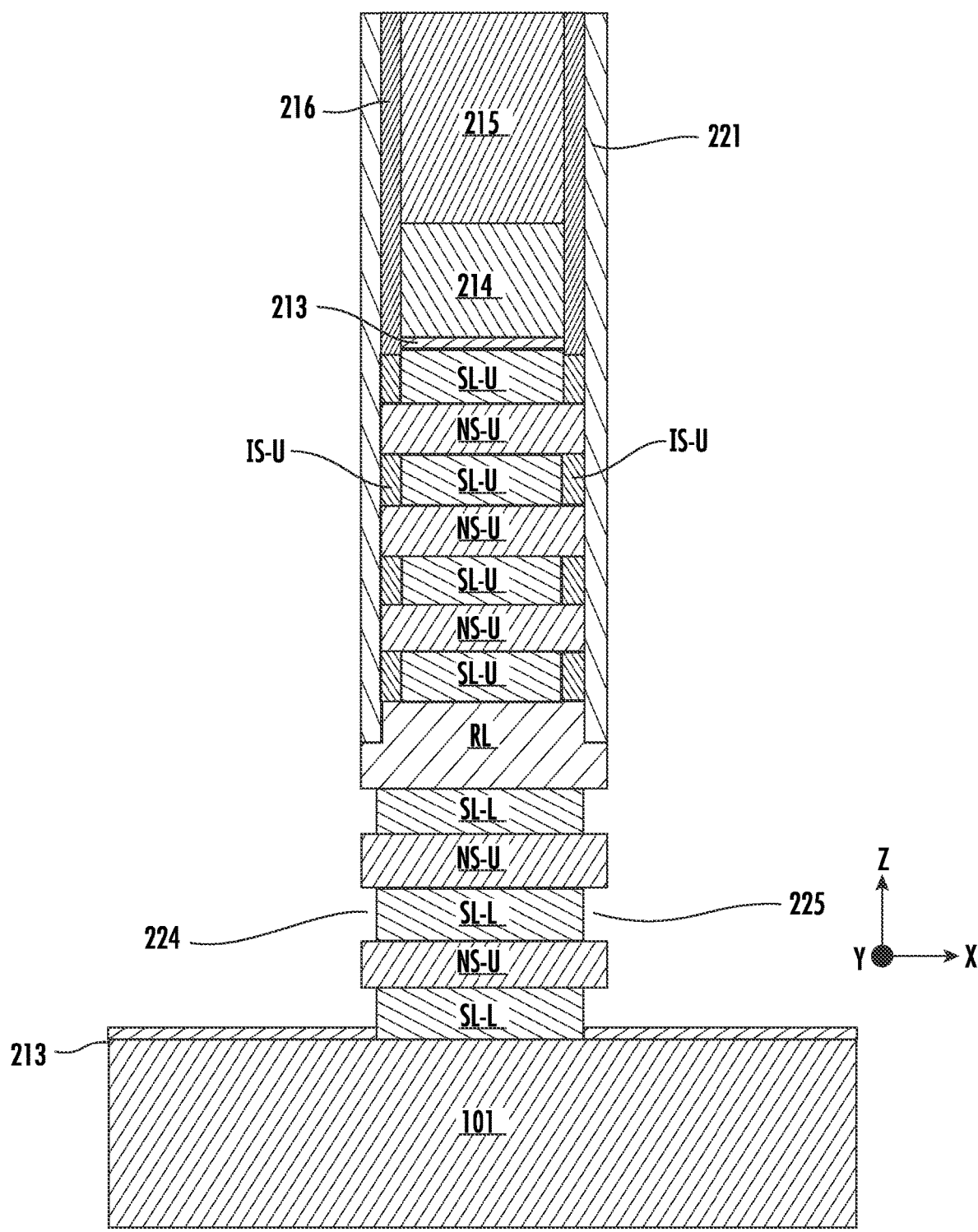

Referring to FIG. 2P, which is a cross-sectional view taken along the direction X, sidewalls of the lower sacrificial layers SL-L are recessed to form recess regions 224, 225 between the lower nanosheets NS-L, as well as between the sacrificial layer RL and an uppermost one of the lower nanosheets NS-L therebelow, and between a lowermost one of the lower nanosheets NS-L and the substrate 101. For example, the recess regions 224, 225 may be formed by performing a SiGe etch-back for the lower sacrificial layers SL-L.

Figure 2Q:
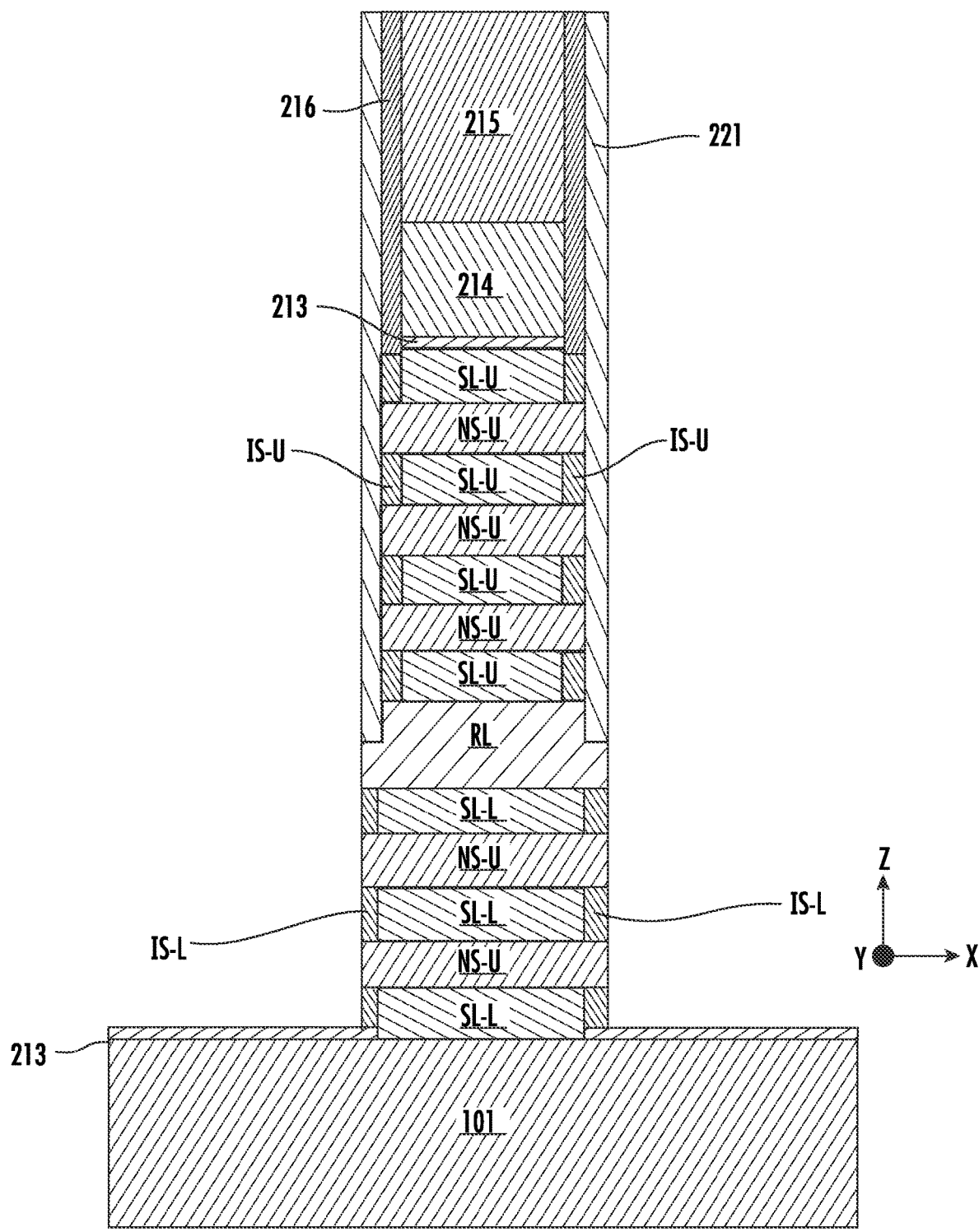

Referring to FIG. 2Q, which is a cross-sectional view taken along the direction X, lower insulating spacers IS-L are formed in the recess regions 224, 225. As a result, the lower insulating spacers IS-L are on sidewalls of the lower sacrificial layers SL-L. The lower insulating spacers IS-L are (i) between the lower nanosheets NS-L, (ii) between the sacrificial layer RL and an uppermost one of the lower nanosheets NS-L therebelow, and (ii) between a lowermost one of the lower nanosheets NS-L and the substrate 101. The lower insulating spacers IS-L may be formed by, for example, performing a SiN deposition and etch-back.

Figure 2R:
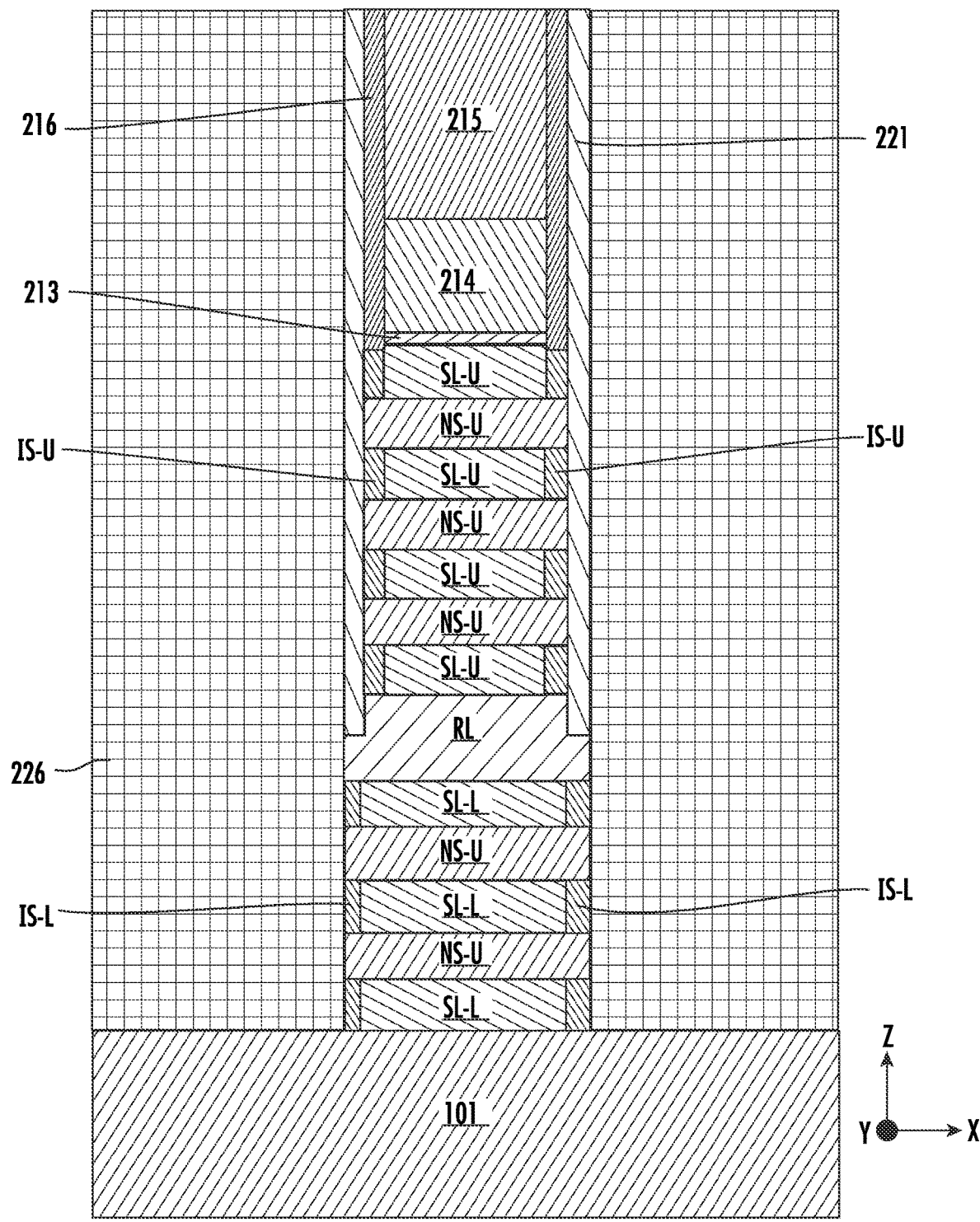

Referring to FIG. 2R, which is a cross-sectional view taken along the direction X, an oxide material 226 is deposited in the recess regions 222, 223 (FIG. 2O) and is planarized (e.g., using CMP).

Figure 2S:
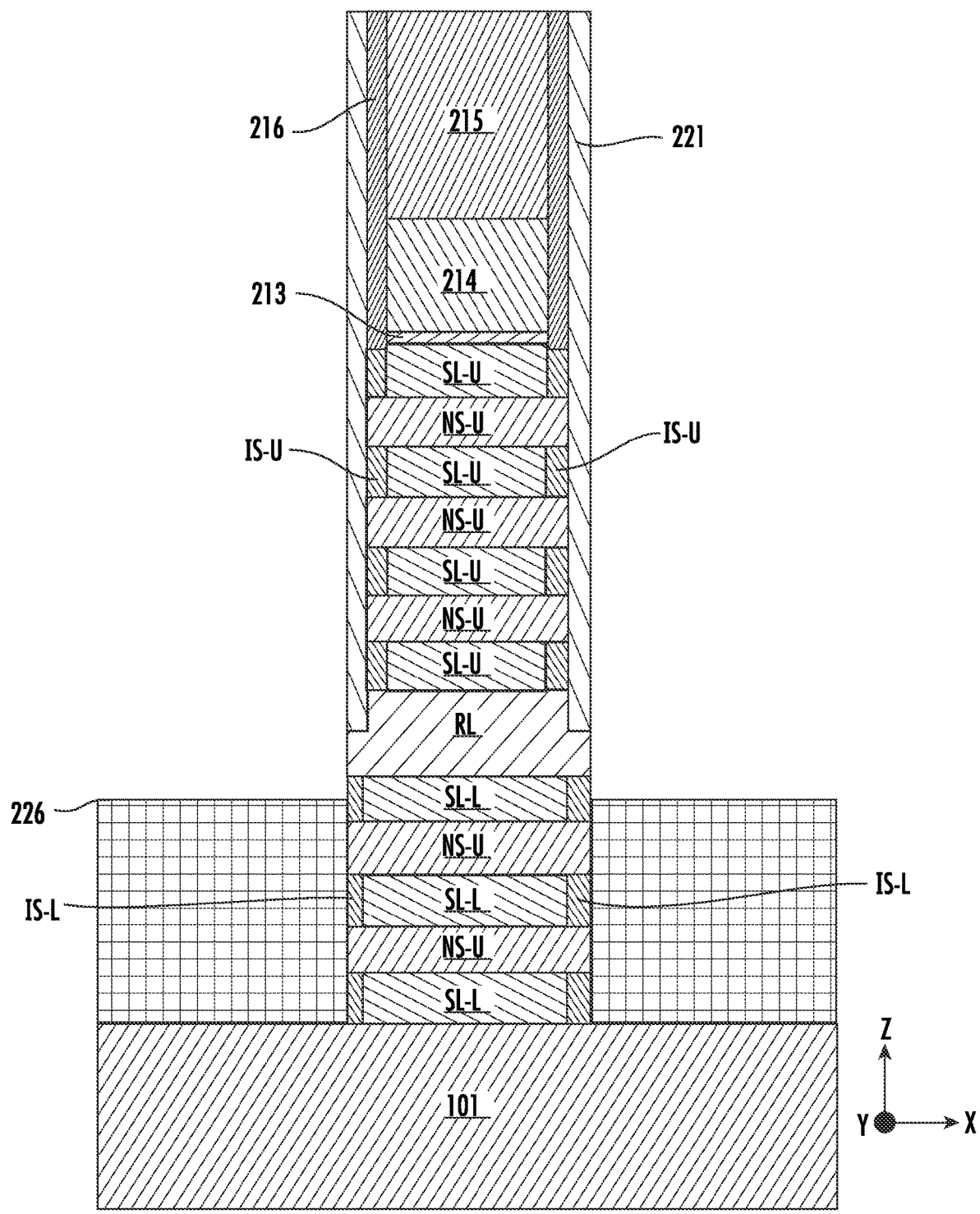

Referring to FIG. 2S, which is a cross-sectional view taken along the direction X, the oxide material 226 is recessed to a level below the sacrificial layer RL. Accordingly, lower sidewalls of the sacrificial layer RL are exposed.

Figure 2T:
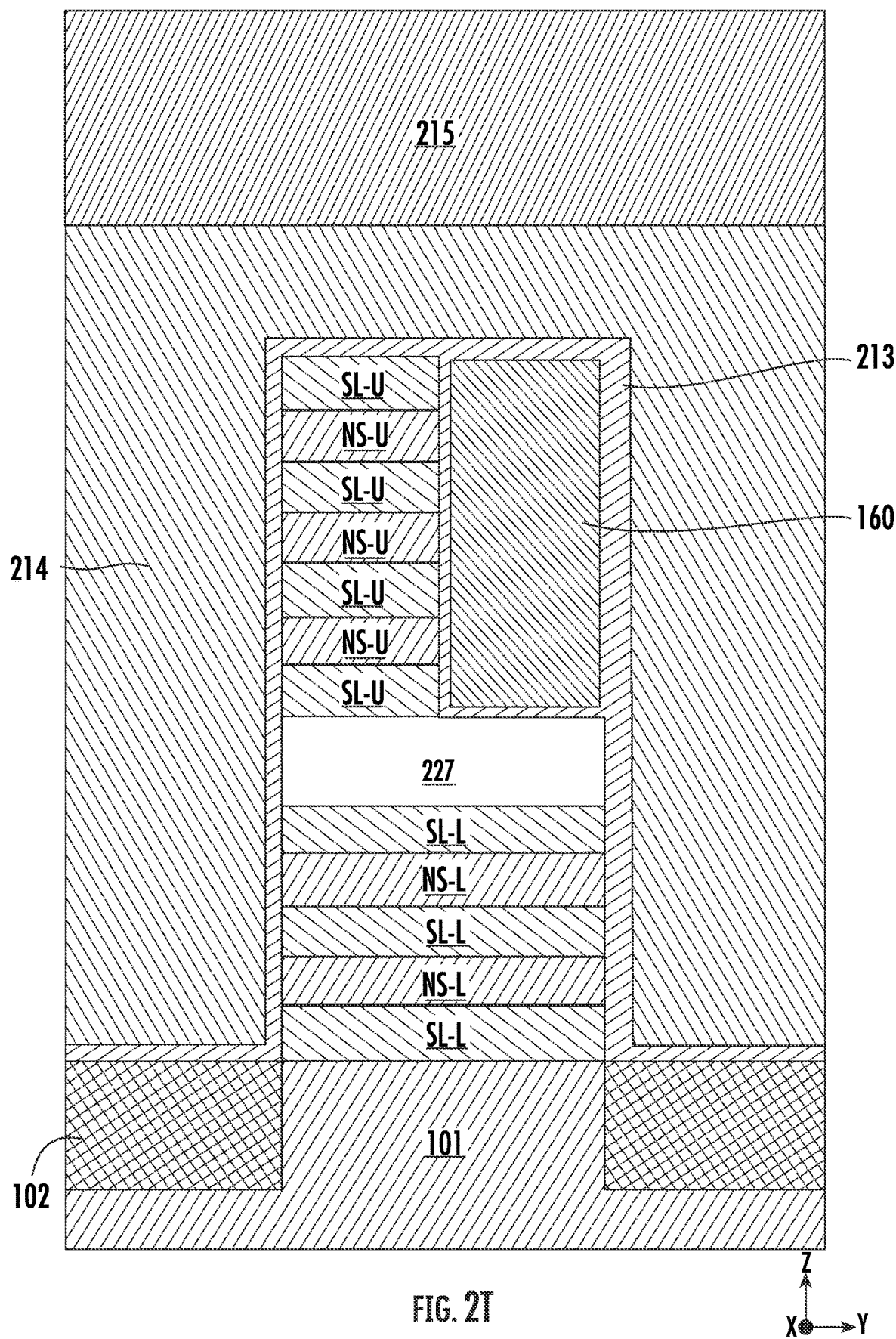

Referring to FIG. 2T, which is a cross-sectional view taken along the direction Y, the sacrificial layer RL is removed, thereby forming an opening 227 between the upper nanosheets NS-U and the lower nanosheets NS-L.

Figure 2U:
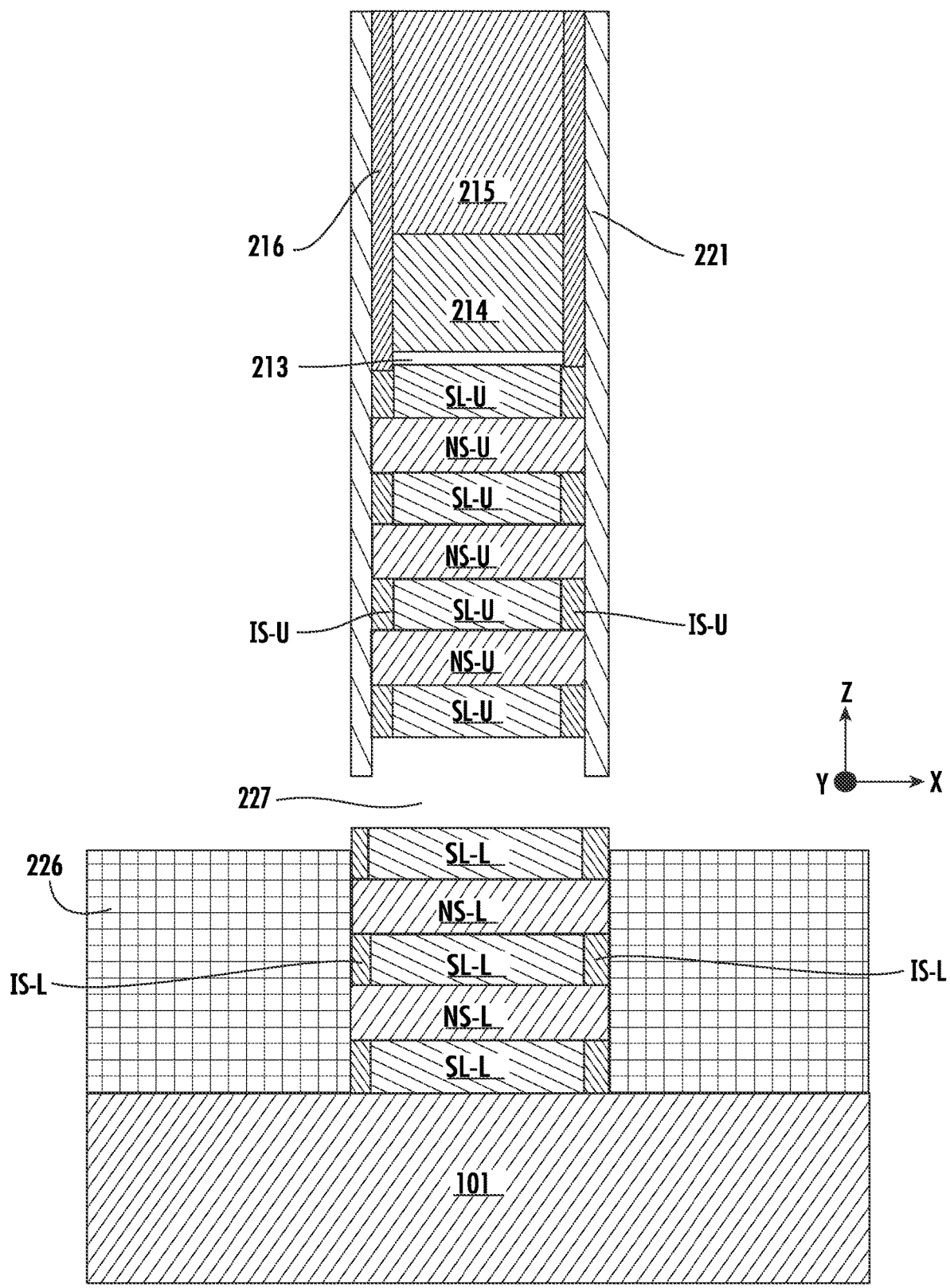

Referring to FIG. 2U, which is a cross-sectional view taken along the direction X, the opening 227 includes a gap between the spacers 221 and an uppermost pair of the lower insulating spacers IS-L. Moreover, the opening 227 is thicker than each of the two sacrificial layers SL that are between the upper nanosheets NS-U and the lower nanosheets NS-L.

Figure 2V:
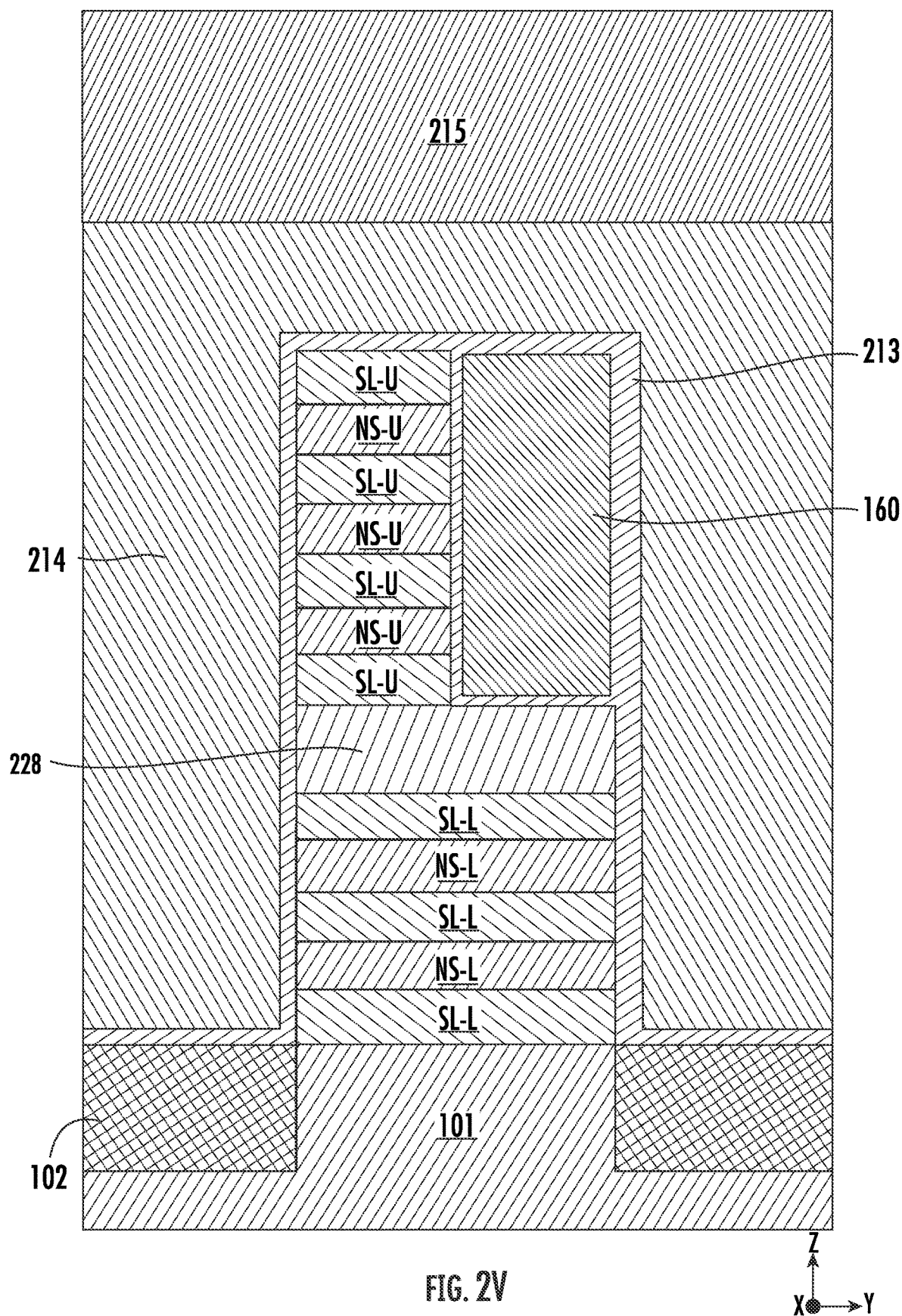

Referring to FIG. 2V, which is a cross-sectional view taken along the direction Y, an isolation layer 228 is formed in the opening 227.

Figure 2W:
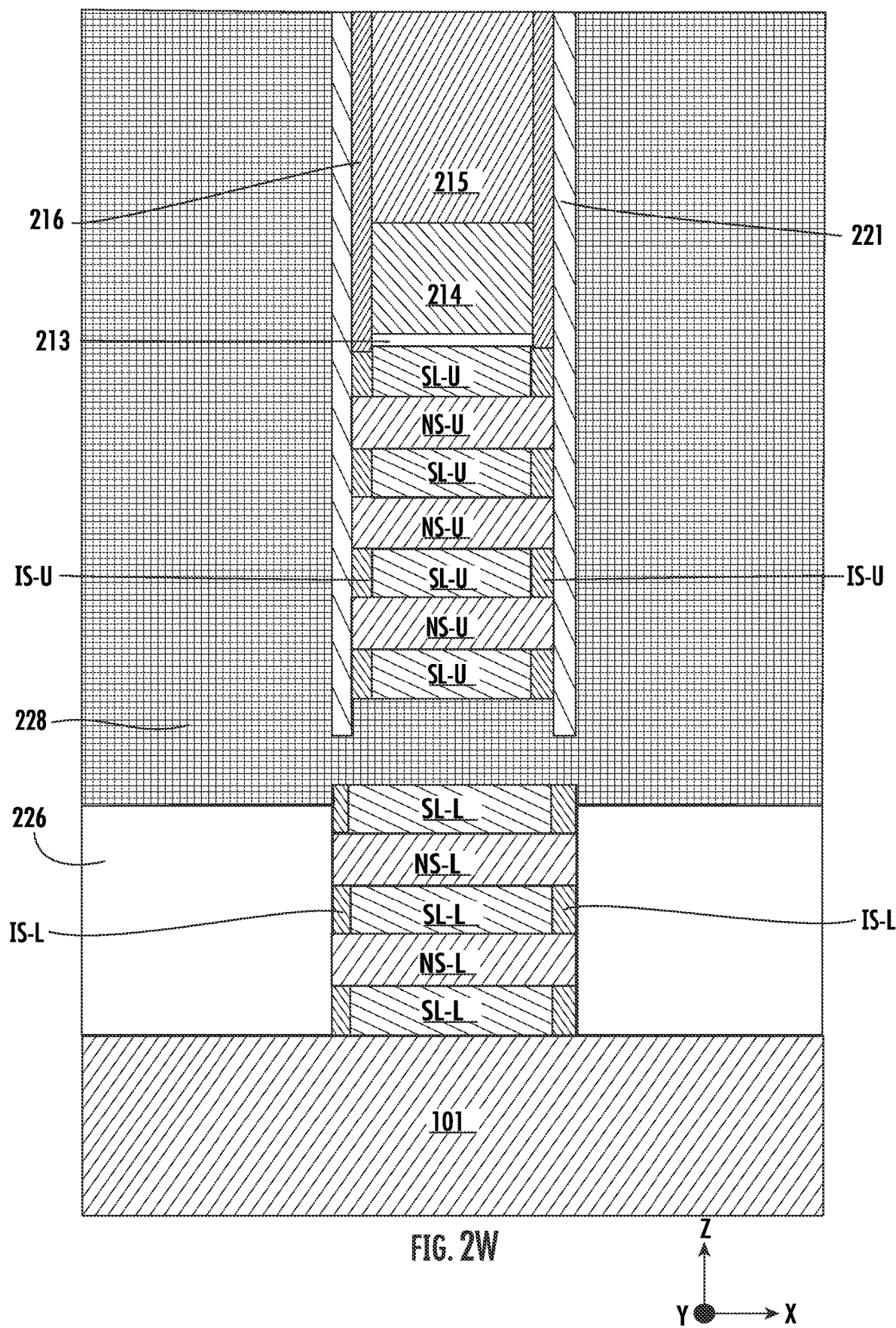

Referring to FIG. 2W, which is a cross-sectional view taken along the direction X, the isolation layer 228 may also be formed on top of the oxide material 226. The isolation layer 228 may comprise, for example, an oxide material that fills openings and then is planarized (e.g., using CMP).

Figure 2X:
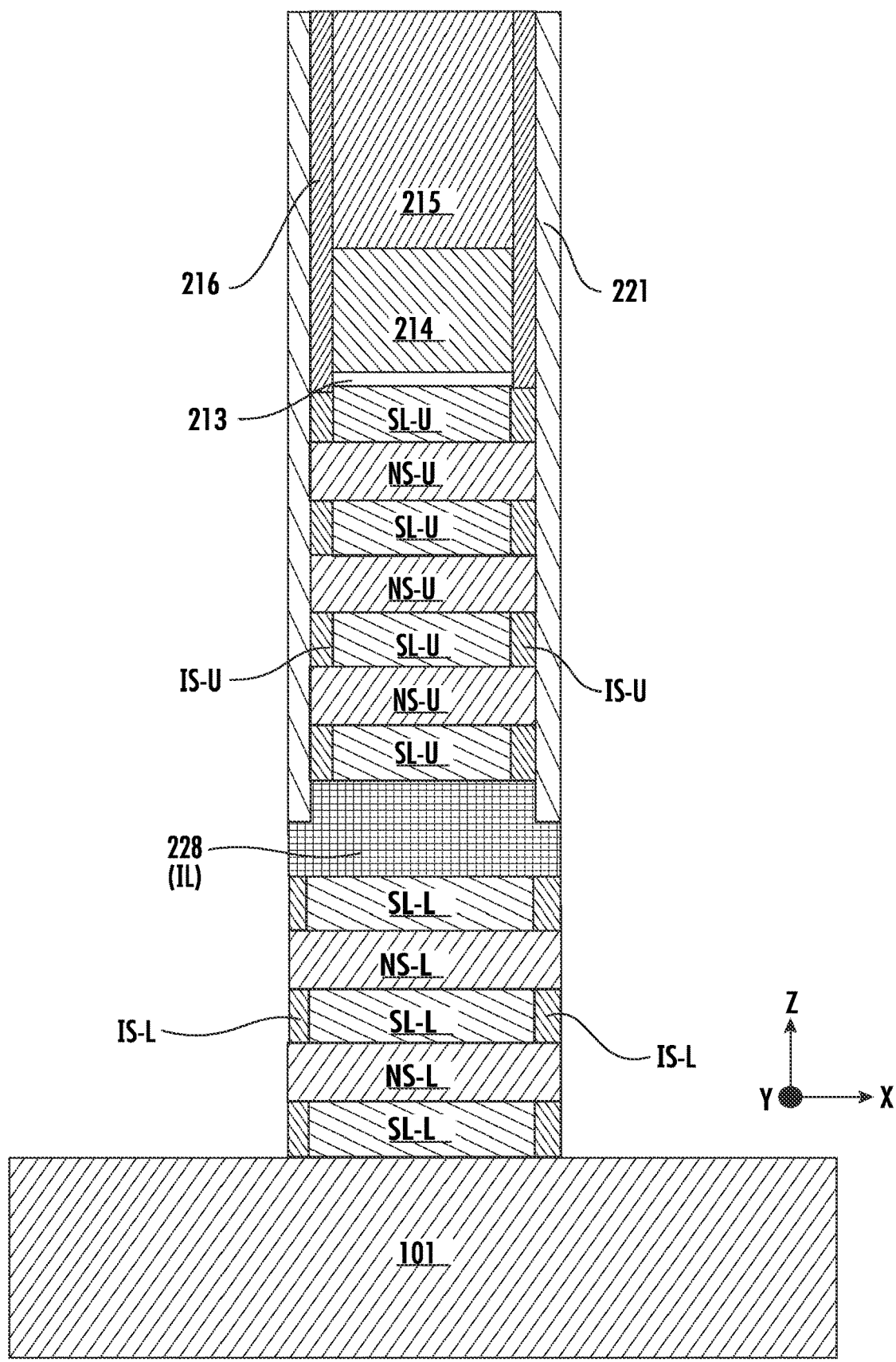

Referring to FIG. 2X, which is a cross-sectional view taken along the direction X, the isolation layer 228 is recessed while using the spacers 216, 221 and the hardmask layer 215 as an etch mask to protect a portion of the isolation layer 228 that separates the upper nanosheets NS-U from the lower nanosheets NS-L. Accordingly, this recess operation removes portions of the isolation layer 228 that are on top of the oxide material 226. The recess operation may also remove the oxide material 226.

Figure 2Y:
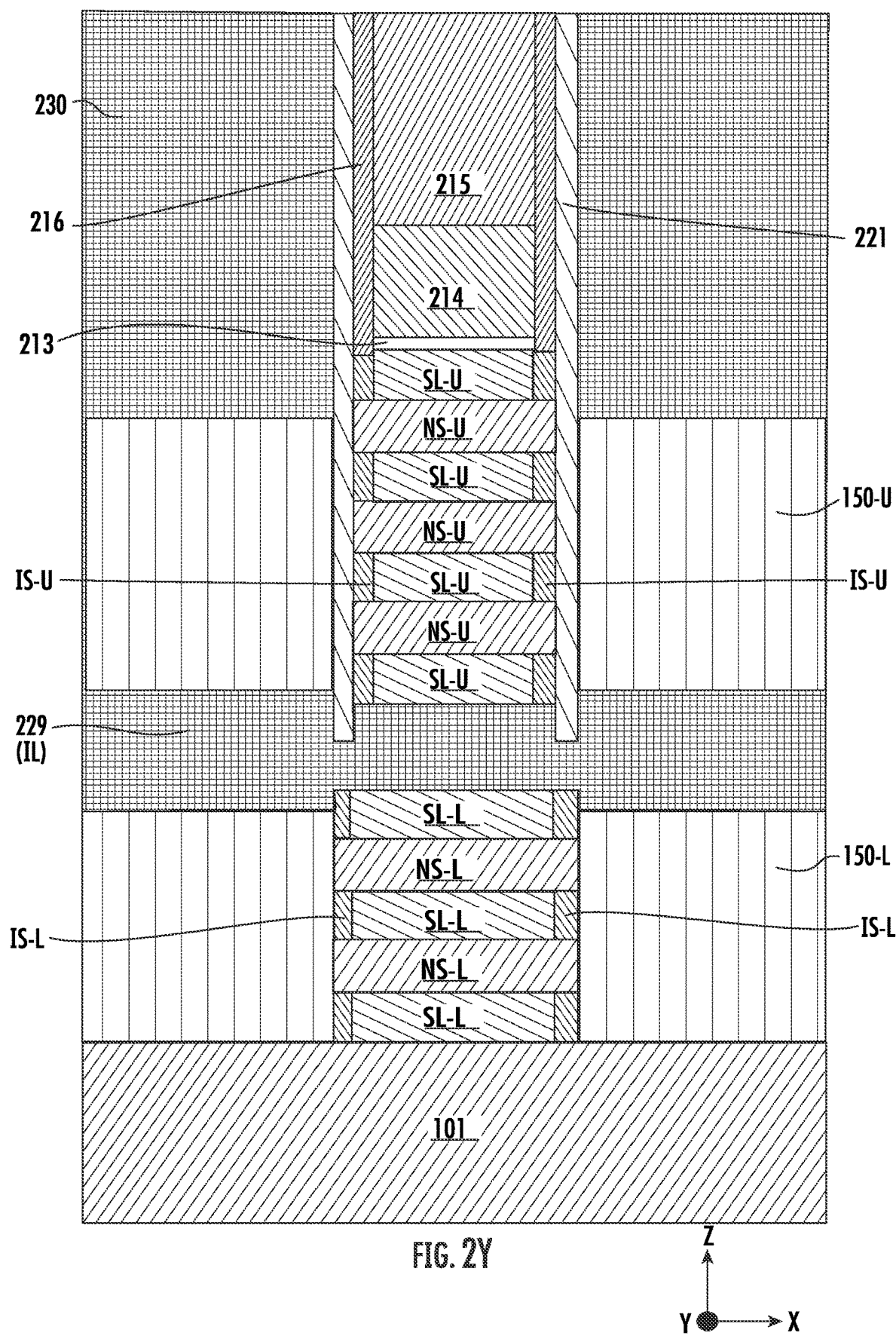

Referring to FIG. 2Y, which is a cross-sectional view taken along the direction X, lower source/drain regions 150-L are formed on the substrate 101 and on sidewalls of the lower nanosheets NS-L. An insulating material 229 is deposited on top of the lower source/drain regions 150-L at a level of the isolation layer 228 (FIG. 2X). The insulating material 229 may comprise, for example, an oxide material, and may, together with the isolation layer 228, provide the isolation region IL. As an example, sidewalls of the insulating material 229 and sidewalls of the isolation layer 228 may contact each other and may comprise the same insulating material. In some embodiments, the isolation region IL may be thicker, in the vertical direction Z, than each of the nanosheets NS (and thus thicker than each channel region CH (FIG. 1C) provided thereby).

Upper source/drain regions 150-U are formed on sidewalls of the upper nanosheets NS-U. For example, the upper source/drain regions 150-U and the lower source/drain regions 150-L may be formed by epitaxial growth. Moreover, an oxide material 230 is deposited on top of the upper source/drain regions 150-U.

Figure 2Z:
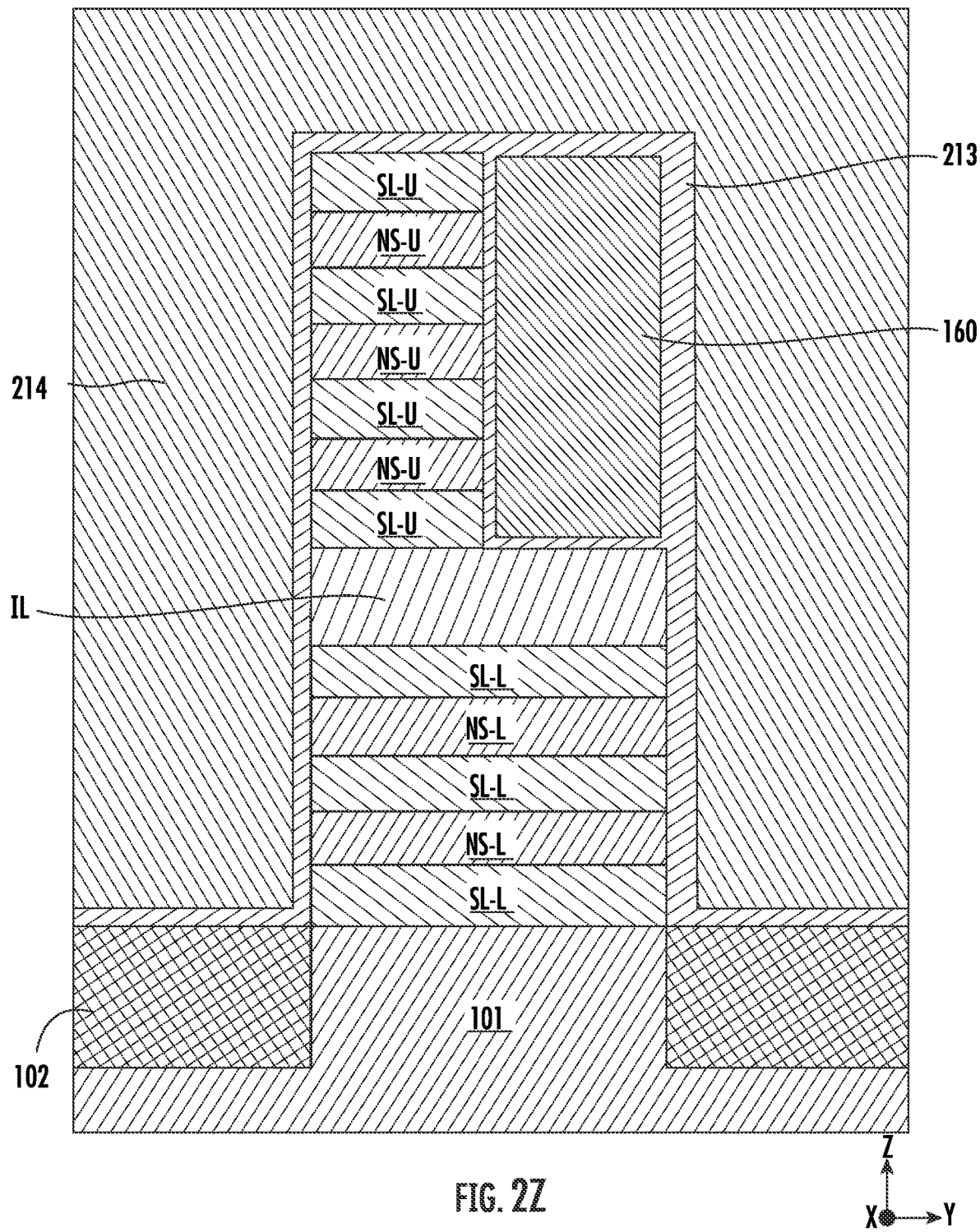
Figure 2A:
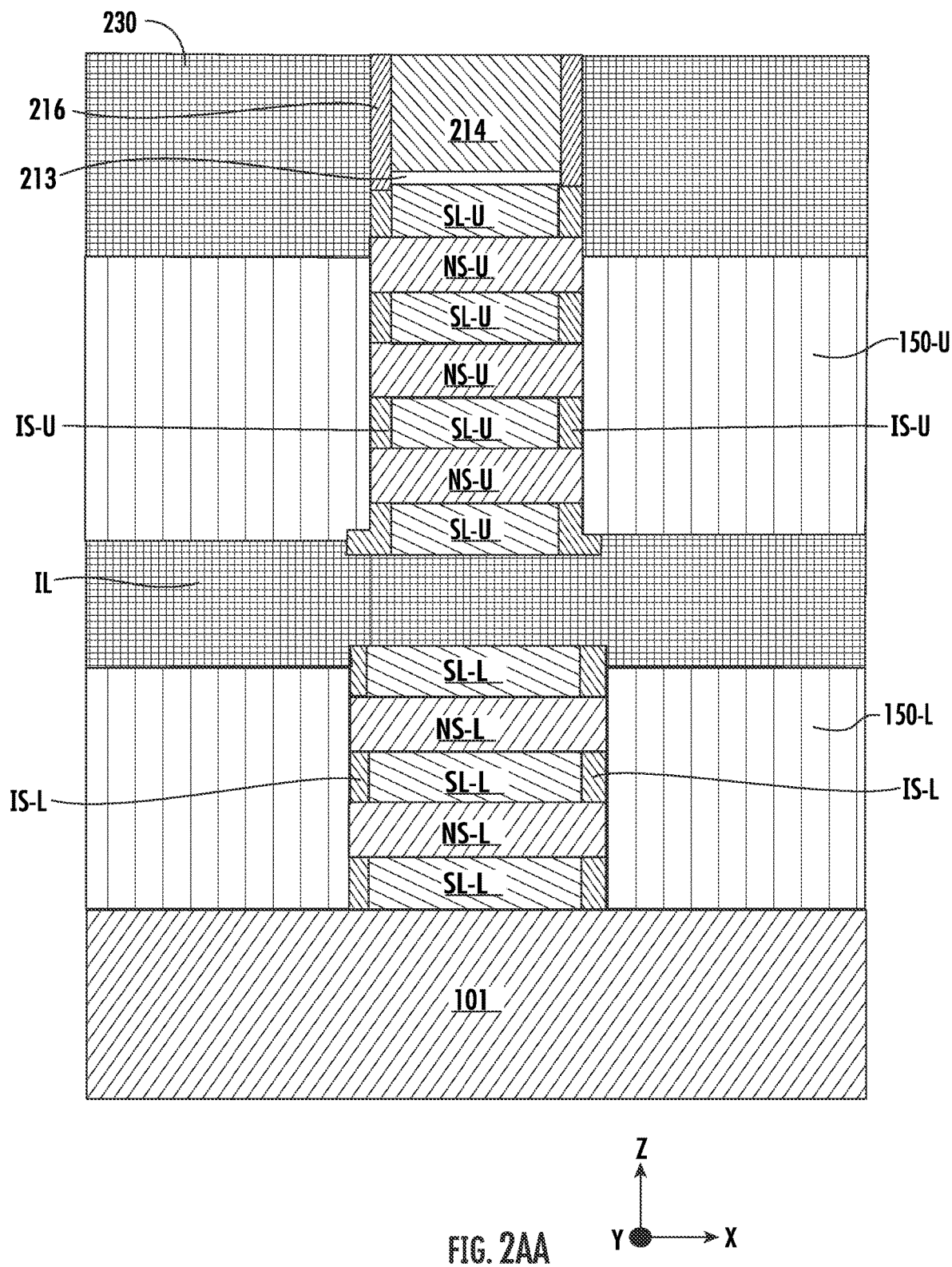
Figure 2A:
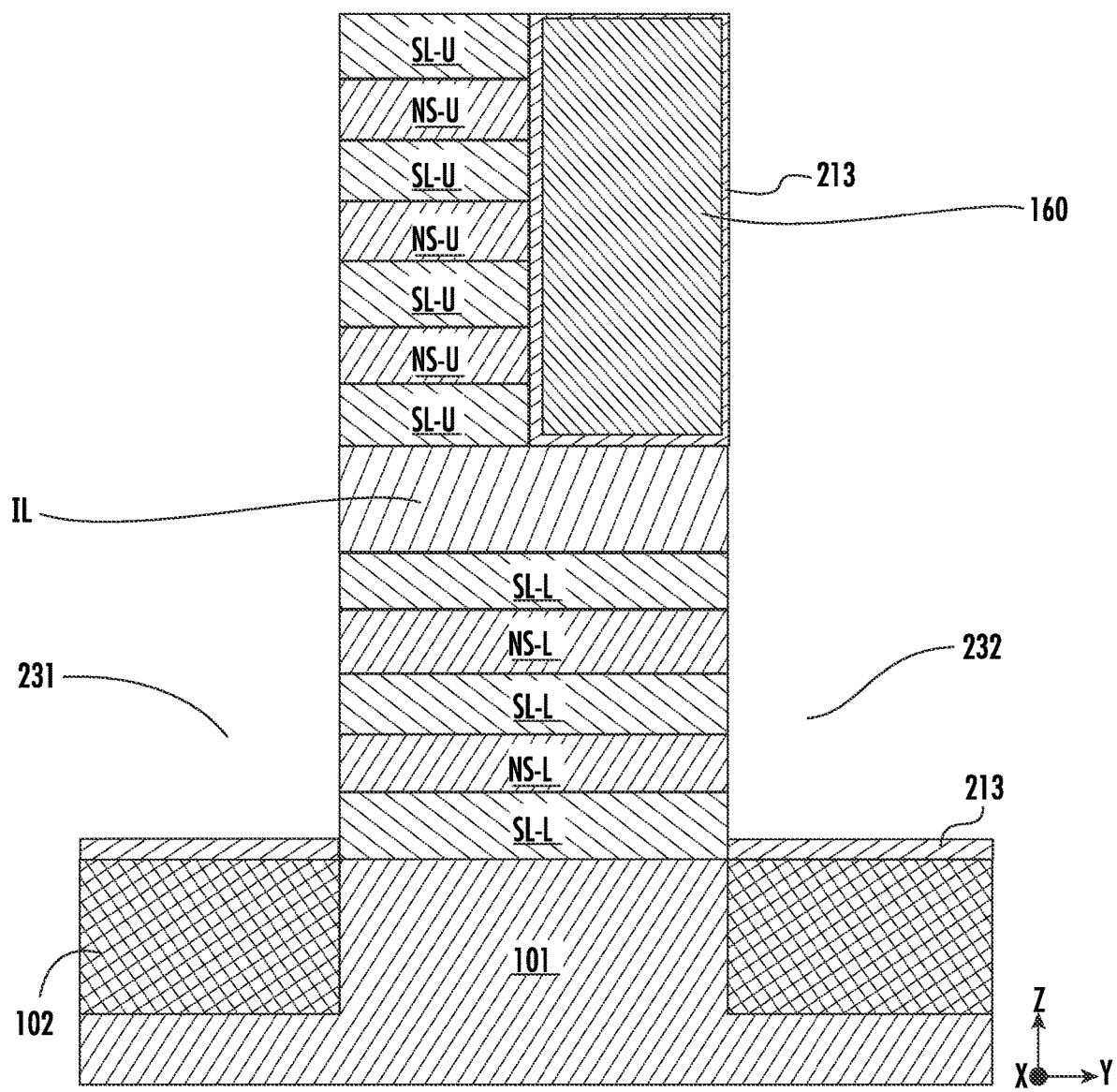
Figure 2A:
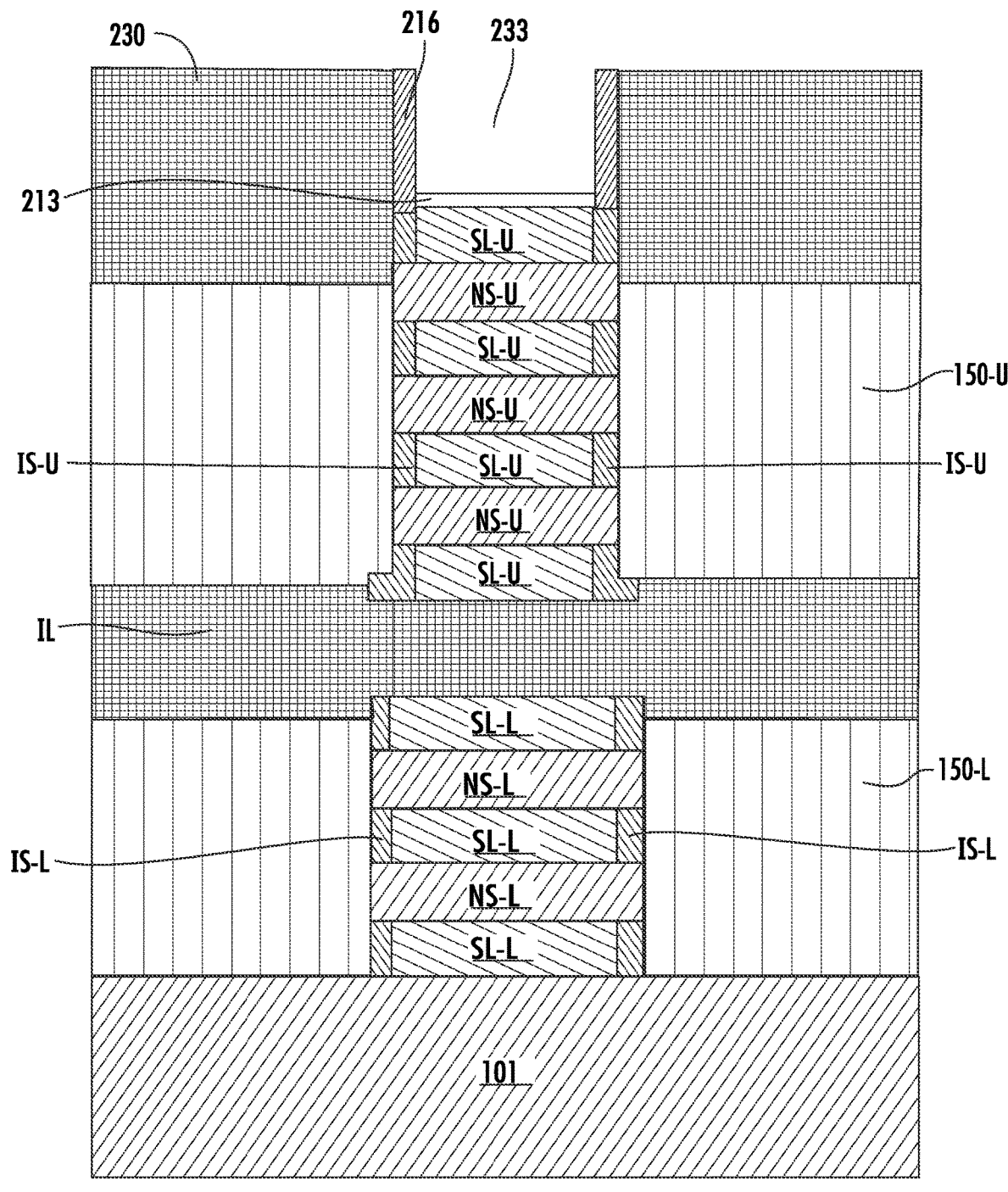
Figure 2A:
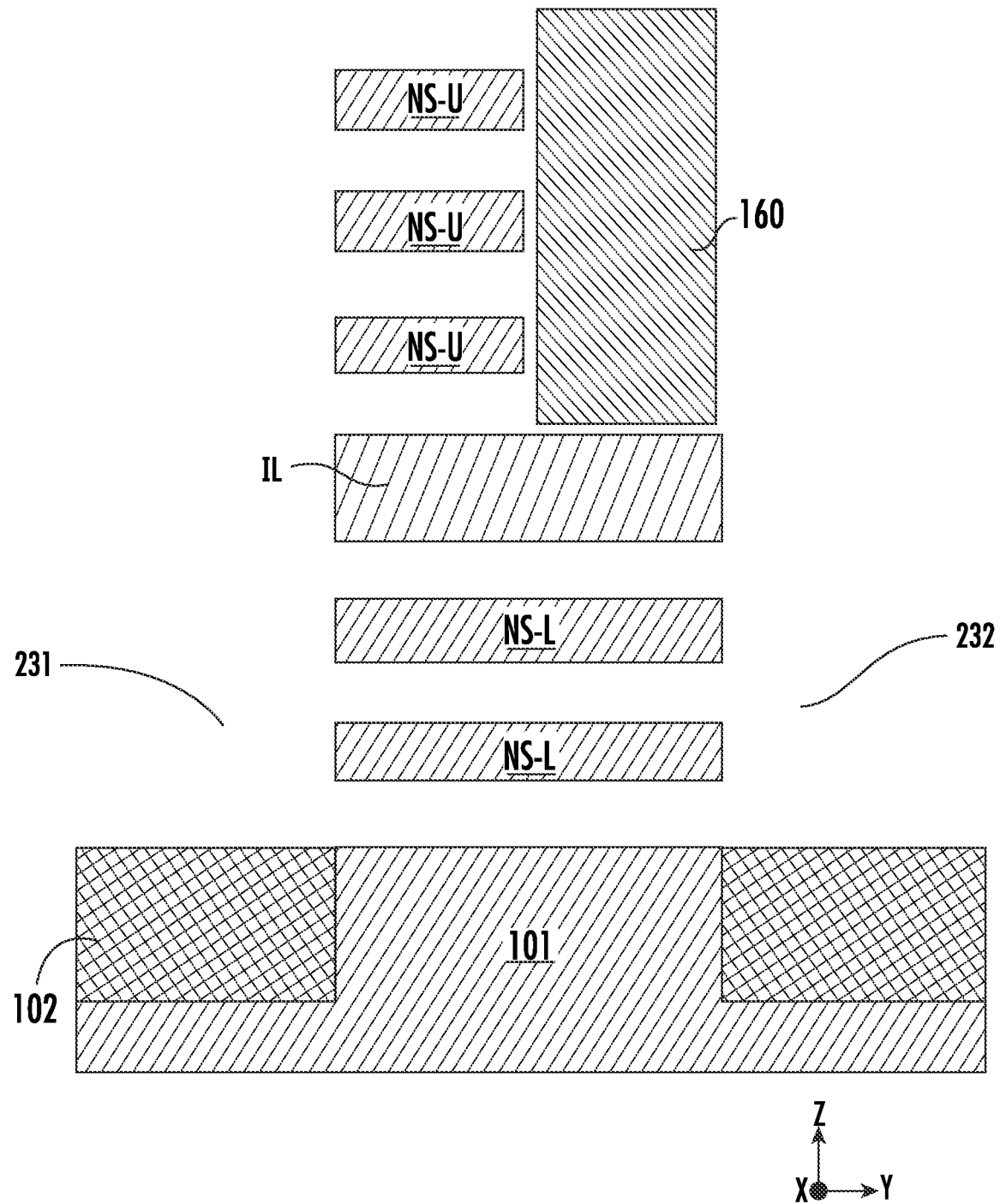
Figure 2A:
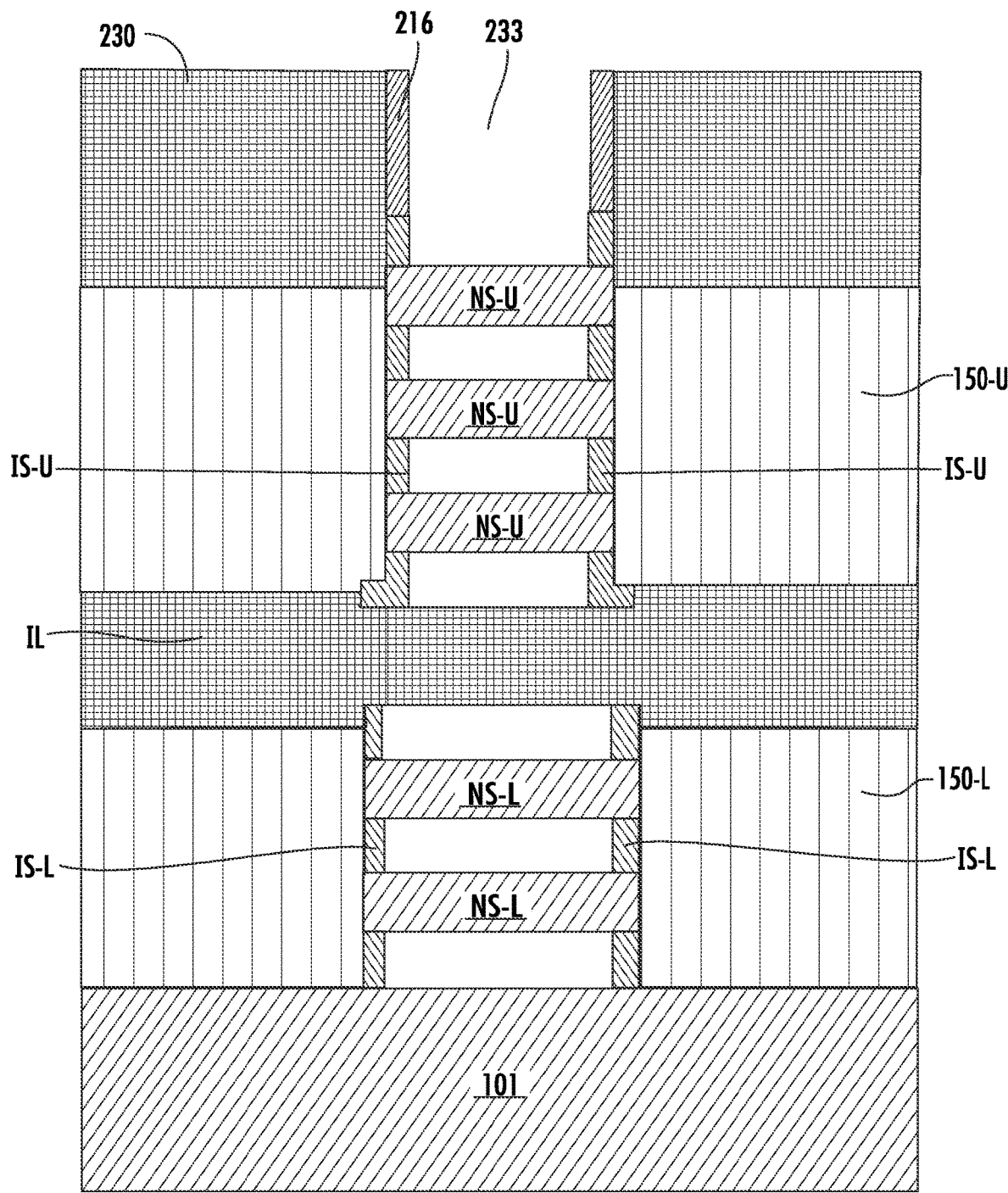
Figure 2A:
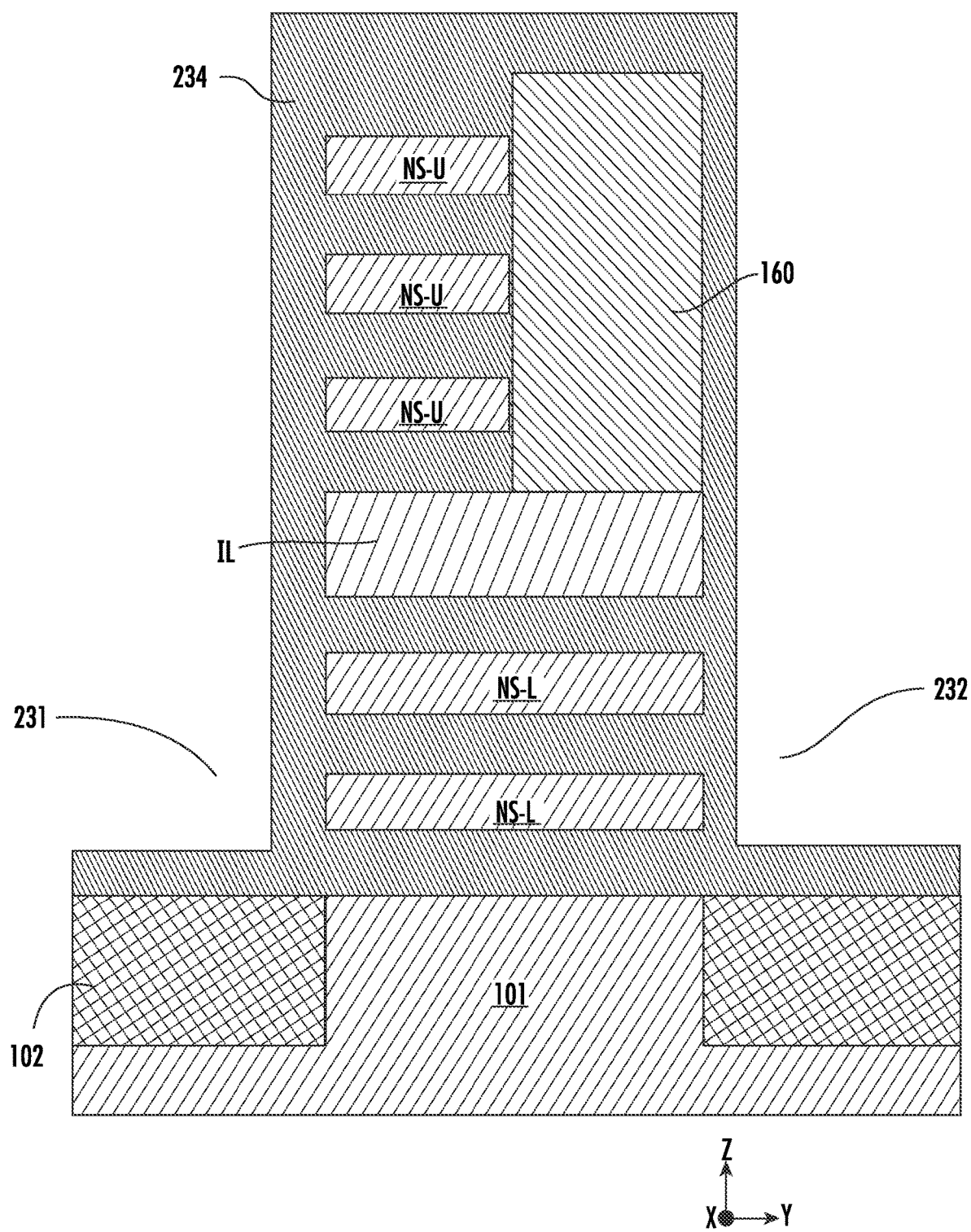
Figure 2A:
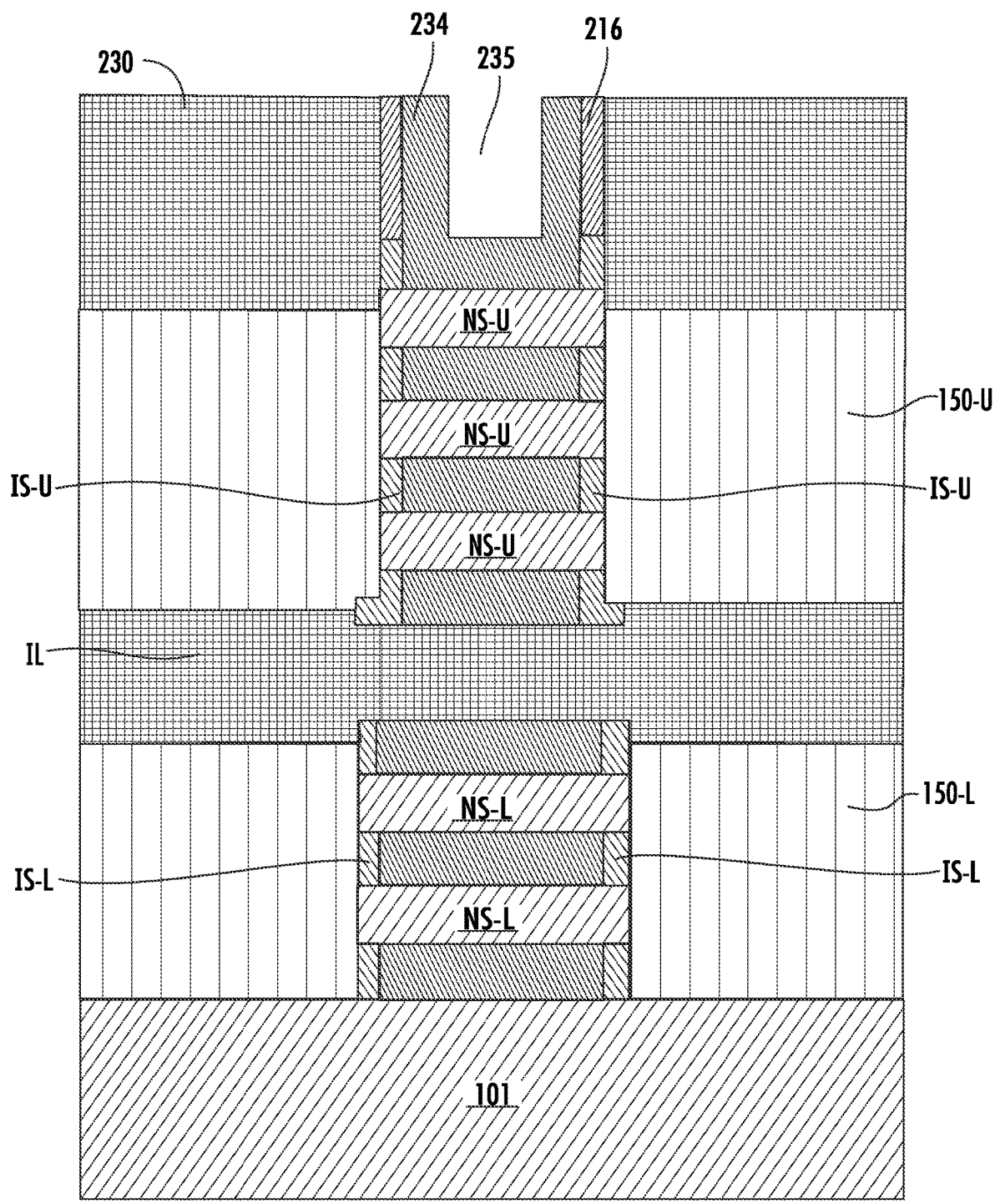
Figure 2A:
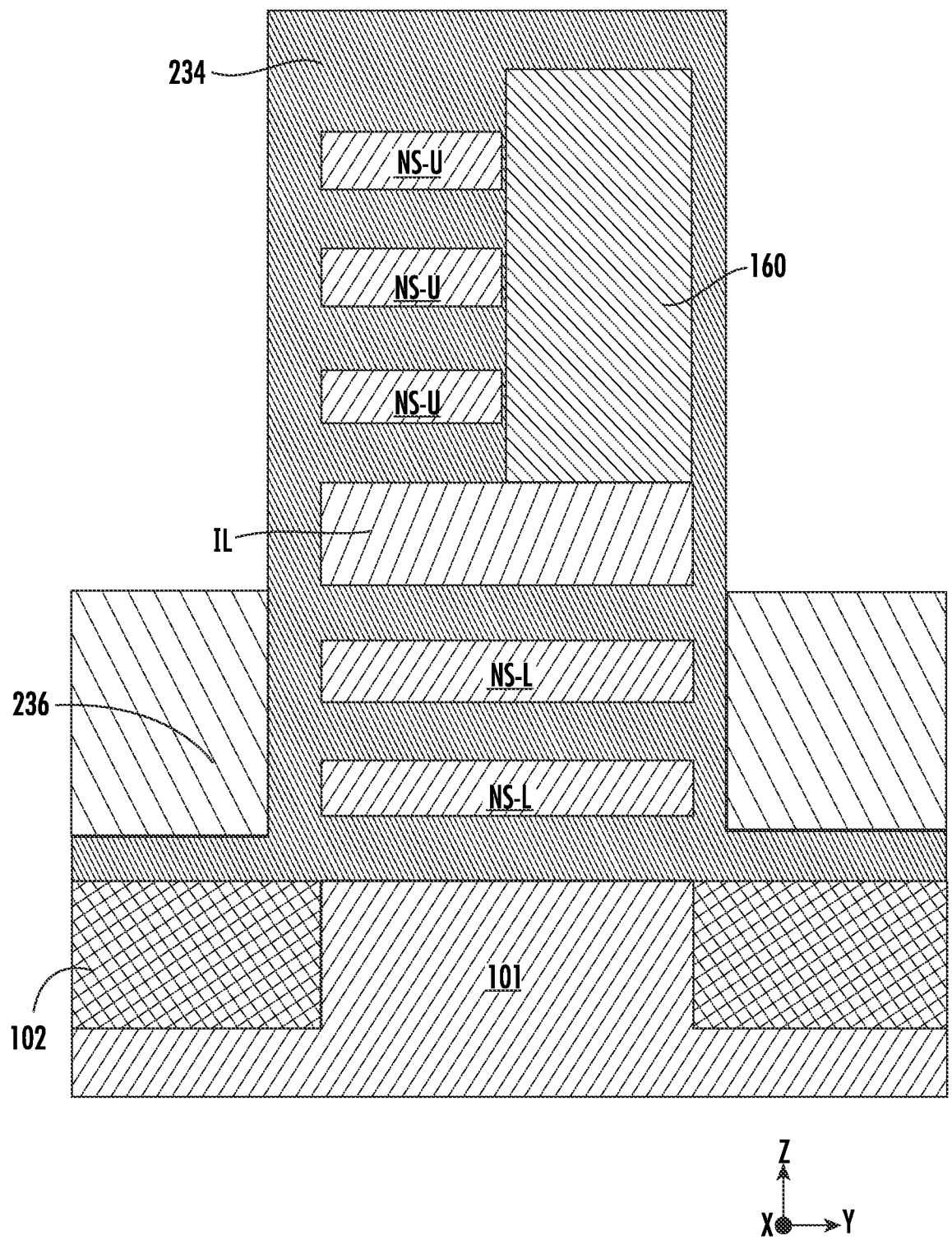
Figure 2A:
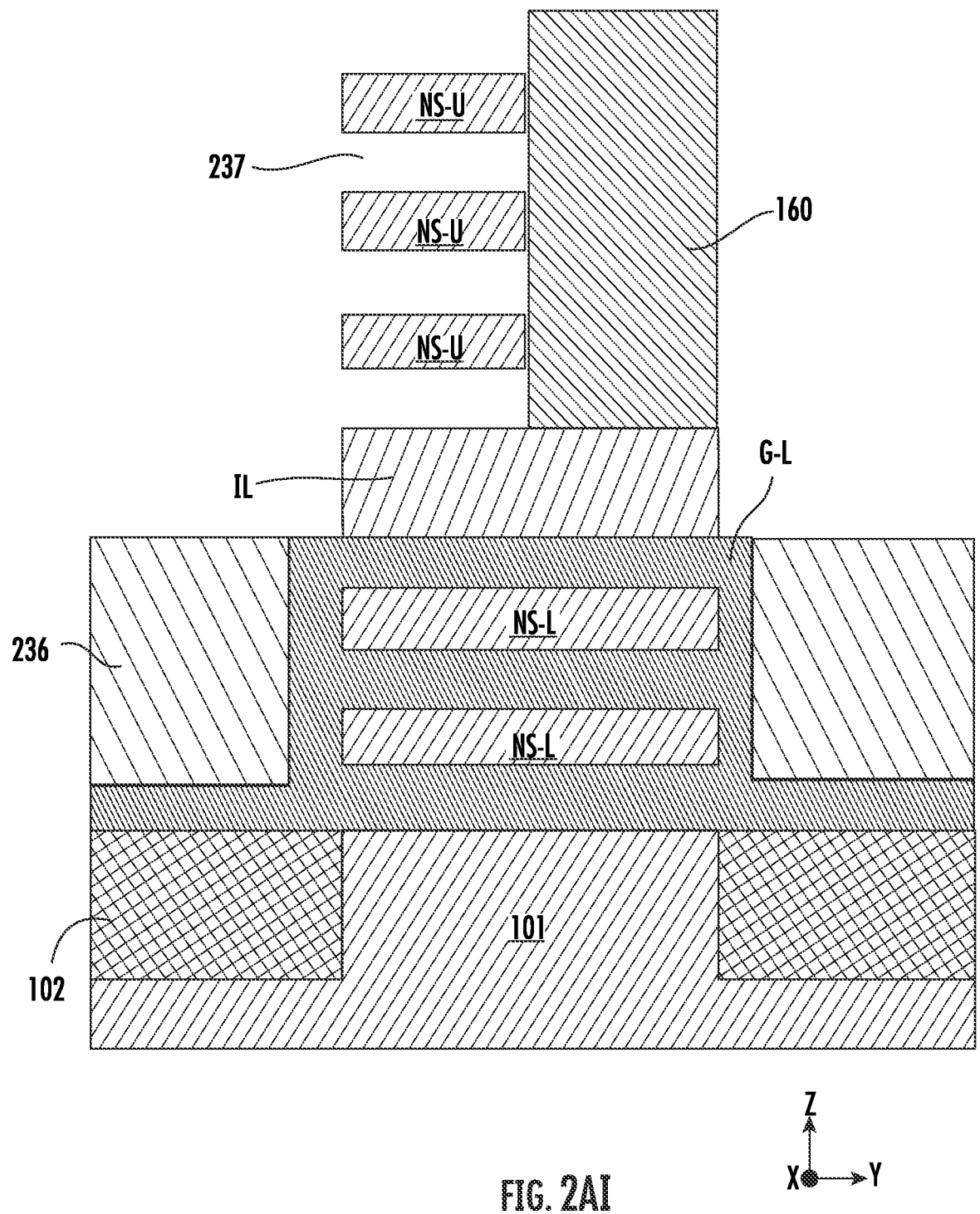
Figure 2A:
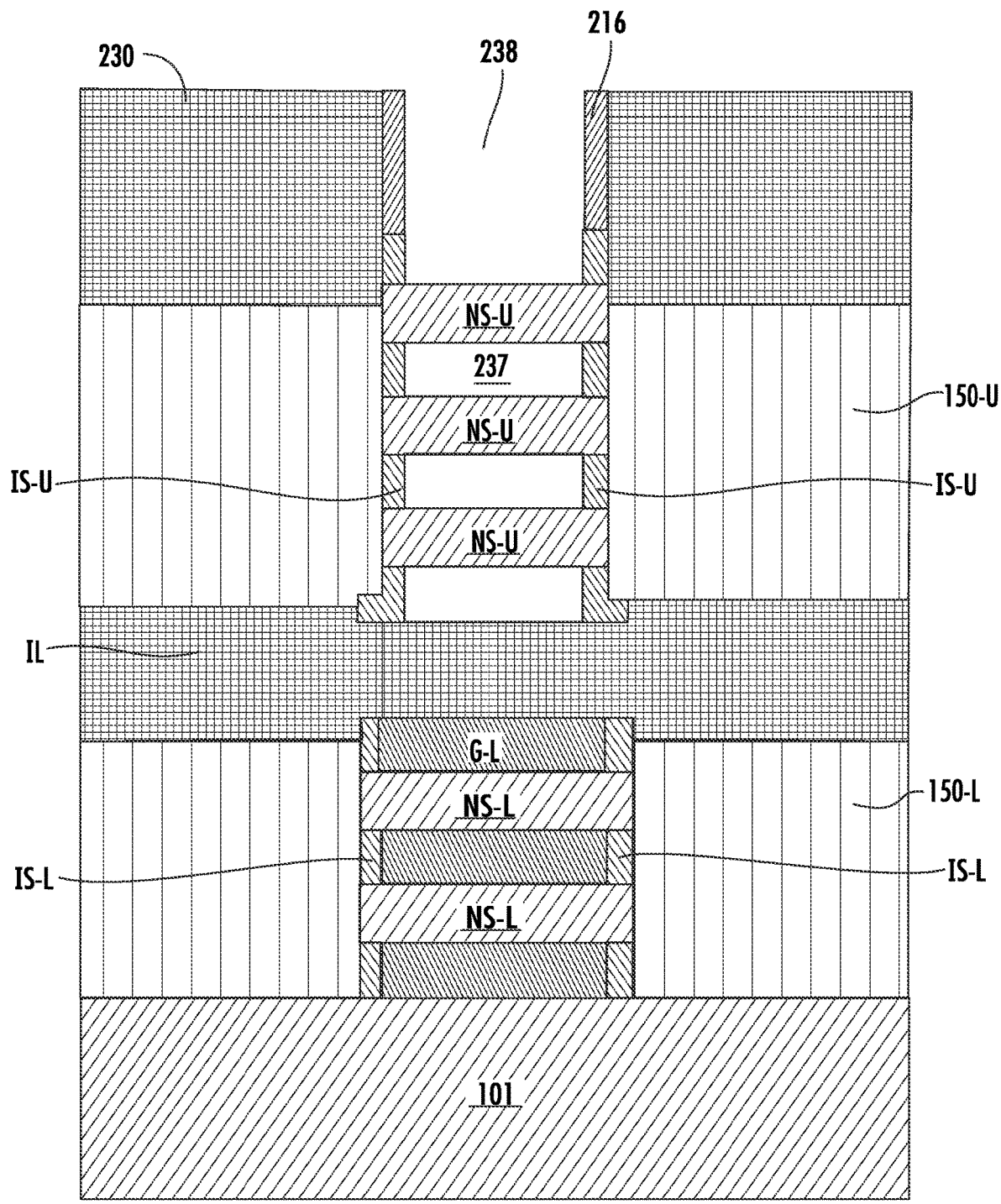
Figure 2A:
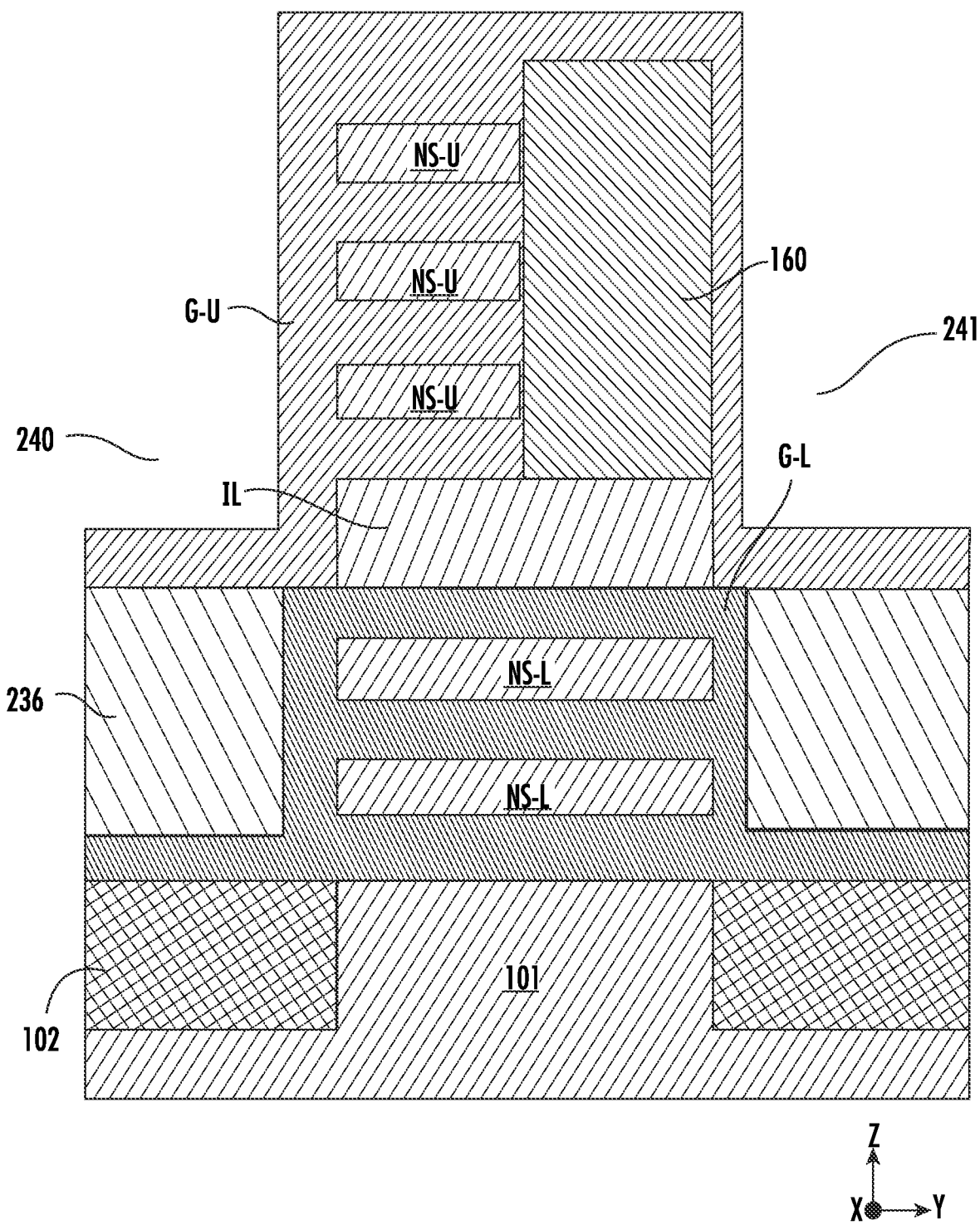
Figure 2A:
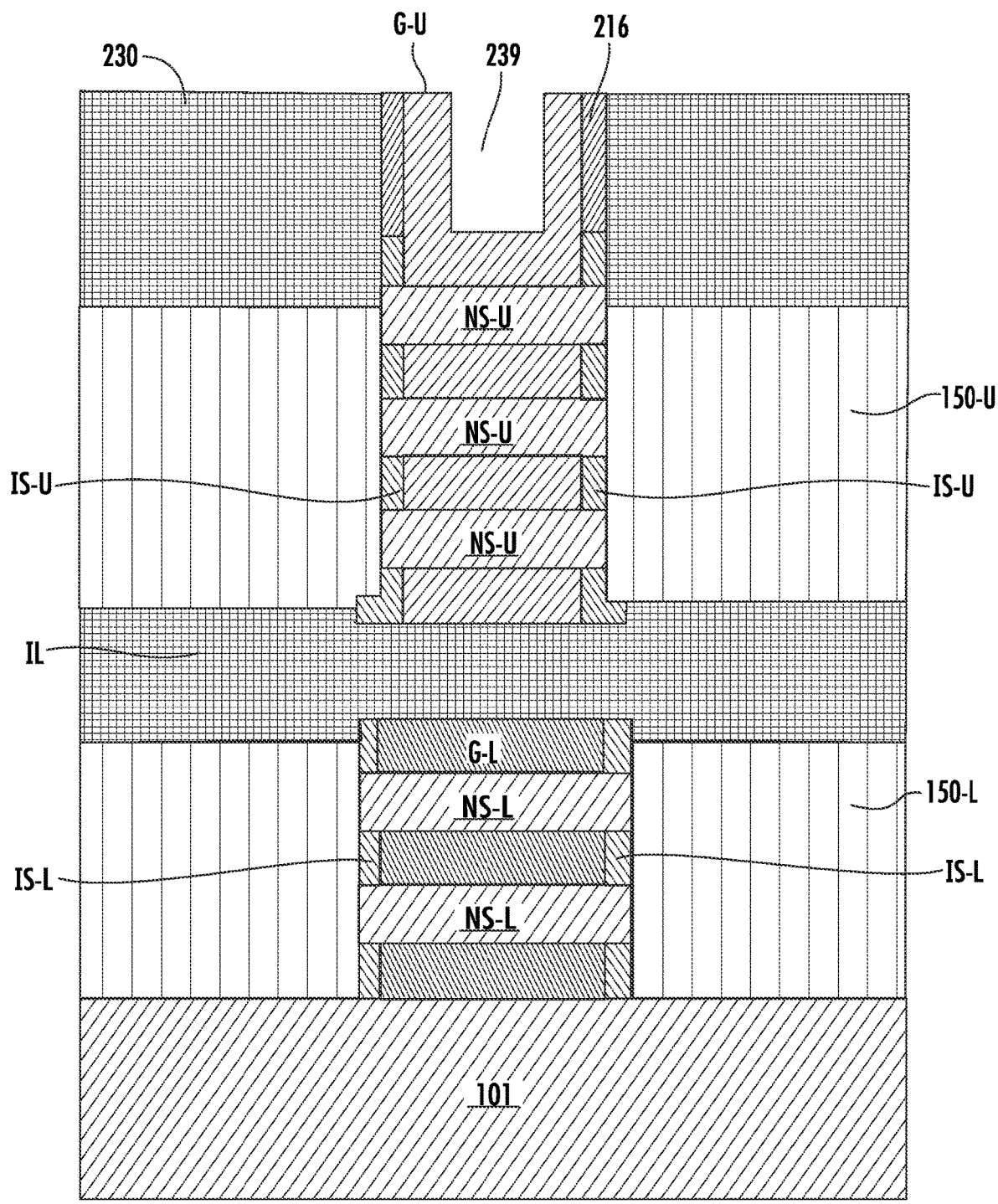
Figure 2A:
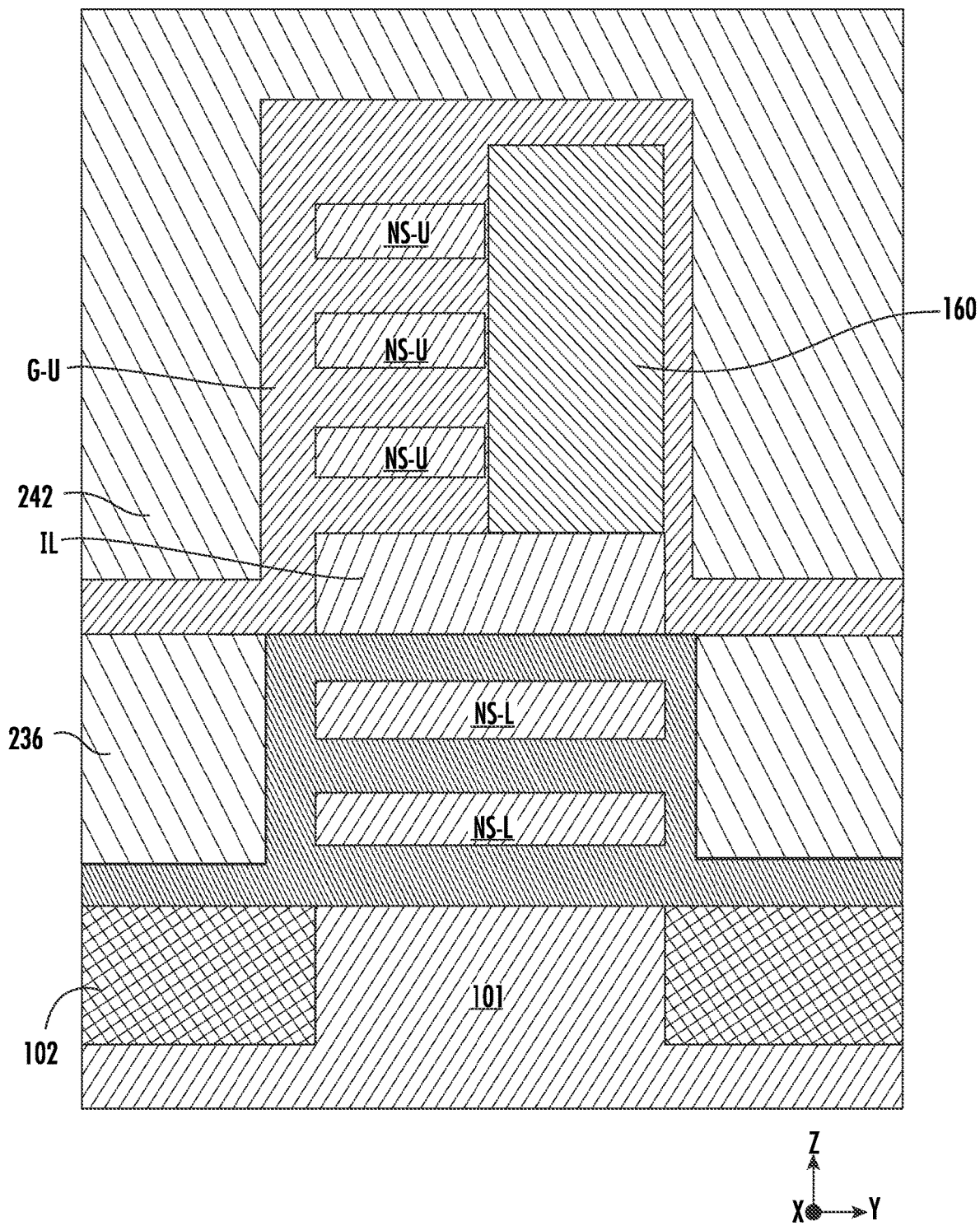
Figure 2A:
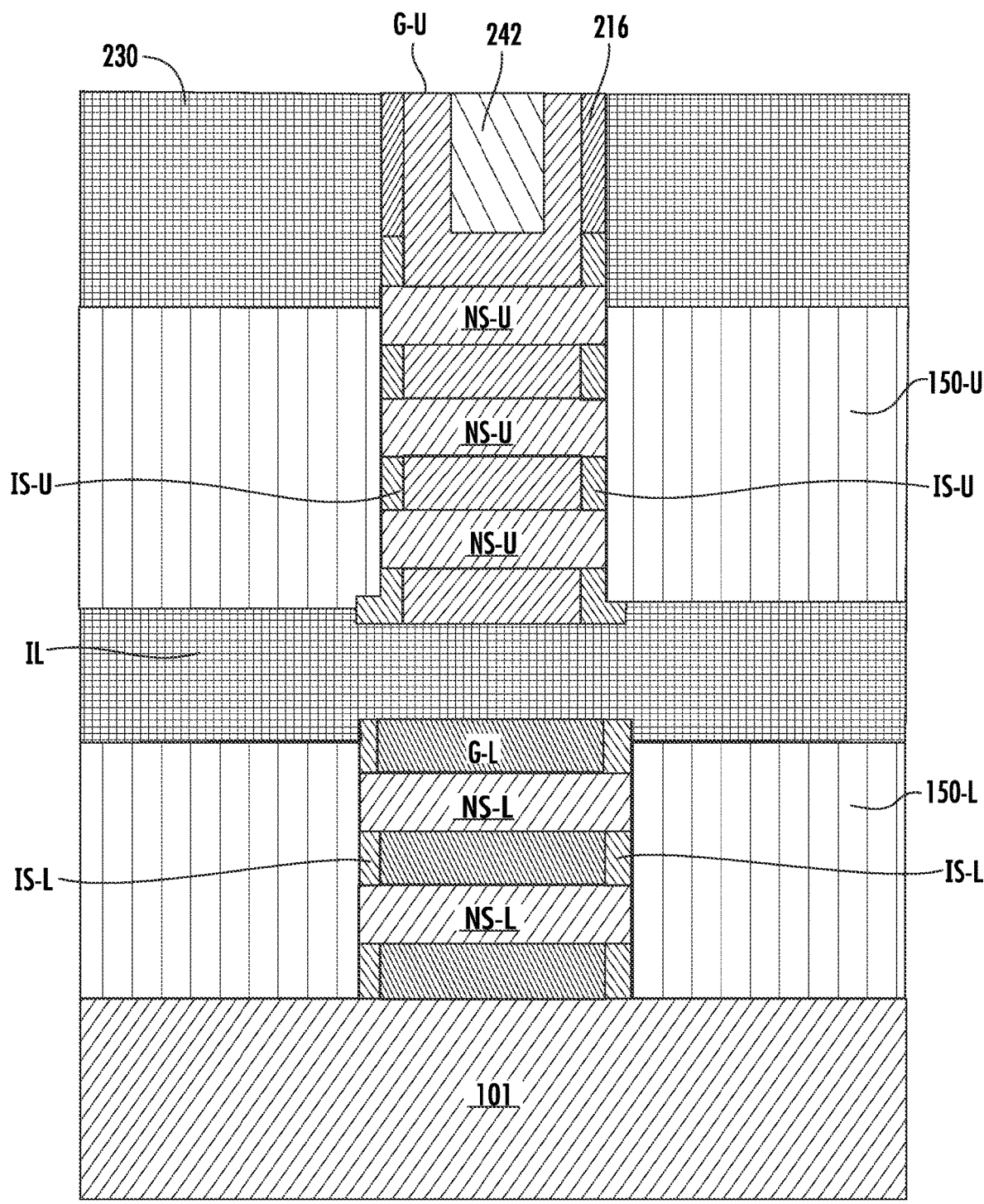

Referring to FIG. 2Z, which is a cross-sectional view taken along the direction Y, the hardmask layer 215 is removed, such as by performing a poly-open CMP.

Referring to FIG. 2AA, which is a cross-sectional view taken along the direction X, the removal of the hardmask layer 215 exposes an upper surface of the sacrificial material 214. Upper portions of the spacers 216 may also be removed.

Referring to FIG. 2AB, which is a cross-sectional view taken along the direction Y, a poly removal operation may be performed to remove the sacrificial material 214. As a result, recess regions 231, 232 are formed and the spacer layer 213 is exposed.

Referring to FIG. 2AC, which is a cross-sectional view taken along the direction X, the poly removal operation that forms the recess regions 231, 232 (FIG. 2AB) also forms an opening 233 between the spacers 216. The poly removal operation also removes at least a portion of the spacer layer 213. As an example, FIG. 2AC shows that the poly removal operation removes a portion of the spacer layer 213 that is on an uppermost one of the upper sacrificial layers SL-U, thereby exposing an upper surface of the uppermost one of the upper sacrificial layers SL-U.

Referring to FIG. 2AD, which is a cross-sectional view taken along the direction Y, the sacrificial layers SL are removed. For example, a SiGe removal operation may remove the sacrificial layers SL.

Referring to FIG. 2AE, which is a cross-sectional view taken along the direction X, the removal of the sacrificial layers SL provides openings between respective pairs of the insulating spacers IS.

Referring to FIG. 2AF, which is a cross-sectional view taken along the direction Y, a first metal material 234 is deposited on the nanosheets NS.

Referring to FIG. 2AG, which is a cross-sectional view taken along the direction X, the first metal material 234 is formed in the openings between the respective pairs of the insulating spacers IS. For example, each insulating spacer IS may contact the first metal material 234. Moreover, an opening 235 may be between sidewalls of an upper portion of the first metal material 234 that is between the spacers 216.

Referring to FIG. 2AH, which is a cross-sectional view taken along the direction Y, a second metal material 236 is deposited on the first metal material 234. The second metal material 236 is then planarized (e.g., using CMP) and recessed (e.g., using chamfering) until the second metal material 236 remains on lower portions of the recess regions 231, 232 (FIG. 2AF) adjacent the lower nanosheets NS-L. As an example, an upper surface of the remaining second metal material 236 may be at a level of a lower surface of the isolation region IL. The second metal material 236 may comprise, for example, tungsten ("W"), which may be different from the first metal material 234.

Referring to FIG. 2AI, which is a cross-sectional view taken along the direction Y, the first metal material 234 may be removed above a level of the upper surface of the second metal material 236. For example, the second metal material 236 may be used as an etch-stop layer when removing upper portions of the first metal material 234. As a result, sidewalls of the isolation region IL may be exposed.

In some embodiments, the removal of the upper portions of the first metal material 234 can be performed using a wet etch that has selectivity between the first and the second metal materials 234, 236. As an example, the wet etch may comprise a chamfering process that stops at the second metal material 236. Moreover, a result (e.g., a lowest etching depth) of the wet etch may vary based on the thickness of the first metal material 234.

Referring to FIG. 2AJ, which is a cross-sectional view taken along the direction X, the removal of upper portions of the first metal material 234 includes removing the first metal material 234 from sidewalls of the upper insulating spacers IS-U. As a result, openings 237 are formed between respective pairs of the upper insulating spacers IS-U. A recess region 238 is also formed between the spacers 216. Moreover, remaining portions of the first metal material 234 provide a lower gate G-U on the lower nanosheets NS-L. Accordingly, the first metal material 234 is a lower gate metal.

Referring to FIG. 2AK, which is a cross-sectional view taken along the direction Y, a third gate material is deposited on the upper nanosheets NS-U to provide an upper gate G-U. Accordingly, the third metal material is an upper gate metal, which may comprise a different material from the first and second metal materials 234, 236. In some embodiments, the upper gate G-U may also be formed on (e.g., in contact with) exposed sidewalls of the isolation region IL. In other embodiments, the lower gate G-L may be formed on (e.g., in contact with) the sidewalls of the isolation region IL. Accordingly, the isolation region IL may be inside either the upper gate G-U or the lower gate G-L. In some embodiments, the isolation region IL may be between the upper gate G-U and the lower gate G-L. Moreover, openings 240, 241 may be on opposite sides of the upper gate G-U.

Referring to FIG. 2AL, which is a cross-sectional view taken along the direction X, the formation of the upper gate G-U includes forming the upper gate G-U in the openings 237 (FIG. 2AJ). As a result, the upper gate G-U may contact sidewalls of the upper insulating spacers IS-U. Moreover, an opening 239 may be between sidewalls of an upper portion of the upper gate G-U that is between the spacers 216.

Referring to FIG. 2AM, which is a cross-sectional view taken along the direction Y, a fourth metal material 242 is deposited on the upper gate G-U and in the openings 240, 241 (FIG. 2AK). The fourth metal material 242 is then planarized (e.g., using CMP). In some embodiments, the fourth metal material 242 may comprise the same material as the second metal material 236. For example, the second and fourth metal materials 236, 242 may each comprise W.

Referring to FIG. 2AN, which is a cross-sectional view taken along the direction X, the formation of the fourth metal material 242 may include forming the fourth metal material 242 in the opening 239 (FIG. 2AL) between the spacers 216.

Figure 3A:
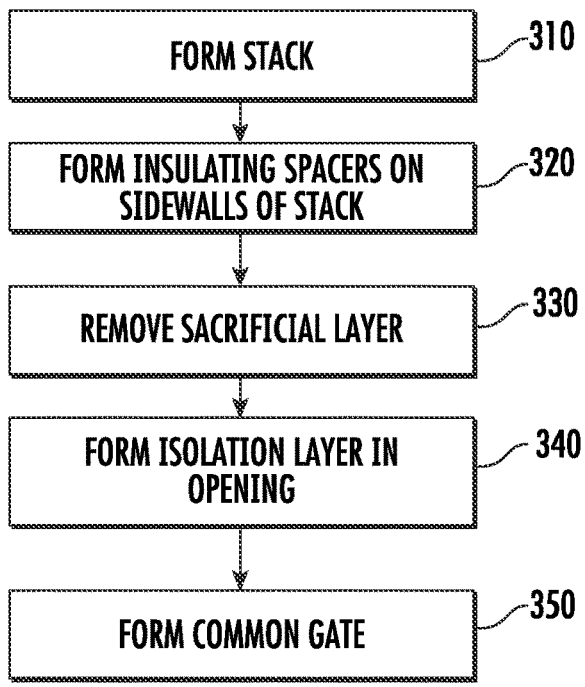
FIGS. 3A, 3B, 3C, 3D, and 3E are flowcharts illustrating operations of forming the transistor stack of FIGS. 1B and 1C.

FIGS. 3A-3E are flowcharts illustrating operations of forming the transistor stack 110-1 of FIGS. 1B and 1C. These operations correspond to operations shown in the cross-sectional views of FIGS. 2A-2AN. As shown in FIG. 3A, the operations include forming (Block 310) a preliminary transistor stack. Referring again to FIG. 2A, the preliminary transistor stack may include preliminary nanosheets NS-P and a sacrificial layer RL that separates lower ones of the preliminary nanosheets NS-P from upper ones of the preliminary nanosheets NS-P. The preliminary transistor stack may also include sacrificial layers SL that alternate with the preliminary nanosheets NS-P.

The operations include forming (Block 320) insulating spacers IS on sidewalls of the preliminary transistor stack. For example, FIGS. 2M and 2Q illustrate forming upper insulating spacers IS-U and lower insulating spacers IS-L, respectively.

The operations include removing (Block 330) the sacrificial layer RL after forming the insulating spacers IS. As an example, FIGS. 2S-2U illustrates removing the sacrificial layer RL to form an opening 227.

The operations include forming (Block 340) an isolation layer 228 in the opening 227. As shown in FIG. 2X, the isolation layer 228 is part of the isolation region IL.

Moreover, the operations include forming (Block 350) a common gate G, which may comprise a lower gate G-L and an upper gate G-U that contacts the lower gate G-L. For example, the lower gate G-L may be formed on lower nanosheets NS-L, as shown in FIG. 2AI, and the upper gate G-U may be formed on upper nanosheets NS-U, as shown in FIG. 2AK. Alternatively, the upper gate G-U and the lower gate G-L may be formed to be isolated from each other, such as by having the isolation region IL extend therebetween.

Though the cross-sectional views shown in FIGS. 1B, 1C, and 2A-2AN show transistors T that each include multiple nanosheets NS, the operations of FIG. 3A are not limited to forming such transistors T. Rather, a transistor T formed by the operations of FIG. 3A may comprise either multiple channel layers or a single channel layer. Accordingly, in a transistor stack 110, a lower transistor T-L may include either multiple lower channel layers or a single lower channel layer, and an upper transistor T-U may include either multiple upper channel layers or a single upper channel layer. Each channel layer may comprise a semiconductor layer. In some embodiments, the semiconductor layer is provided by a nanosheet NS. In other embodiments, however, the semiconductor layer is not provided by a nanosheet NS.

Figure 3B:
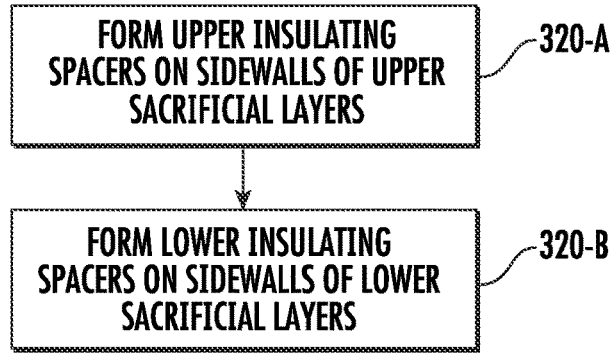

Referring to FIG. 3B, operations of forming (Block 320 of FIG. 3A) insulating spacers IS may include forming (Block 320-A) upper insulating spacers IS-U (FIG. 2M) on sidewalls of upper sacrificial layers SL-U and subsequently forming (Block 320-B) lower insulating spacers IS-L (FIG. 2Q) on sidewalls of lower sacrificial layers SL-L.

Figure 3C:
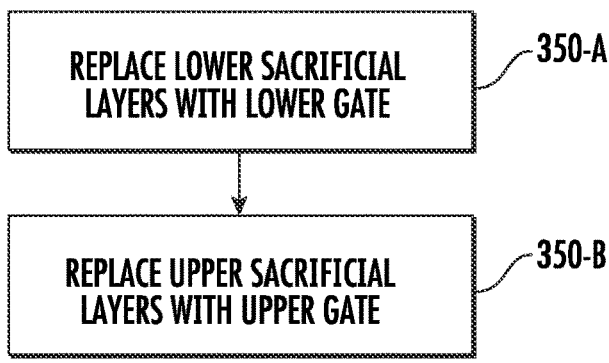

Referring to FIG. 3C, operations of forming (Block 350 of FIG. 3A) the common gate G may include replacing (Block 350-A) the lower sacrificial layers SL-L with a lower gate G-L (FIG. 2AI) and subsequently replacing (Block 350-B) the upper sacrificial layers SL-U with an upper gate G-U (FIG. 2AK).

Figure 3D:
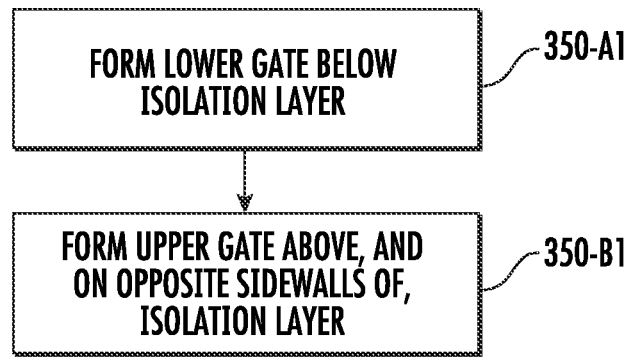
Figure 3E:
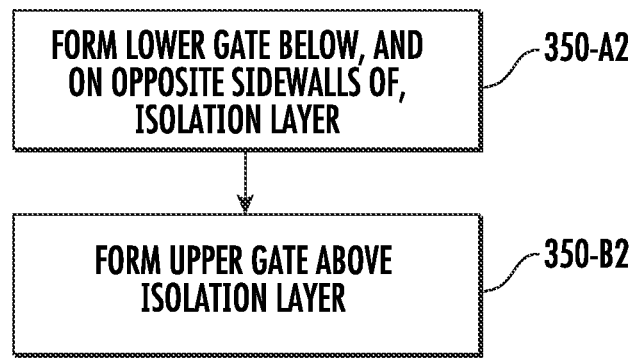

Referring to FIG. 3D, operations of replacing (Blocks 350-A, 350-B of FIG. 3C) the sacrificial layers SL may include forming (Block 350-A1) the lower gate G-L below isolation region IL (FIG. 2AI) and subsequently forming (Block 350-B1) the upper gate G-U above, and on opposite sidewalls of, the isolation region IL. Accordingly, the isolation region IL may, in some embodiments, be inside the upper gate G-U, as shown in FIG. 2AK.

According to other embodiments, the isolation region IL may be inside the lower gate G-L. For example, referring to FIG. 3E, operations of replacing (Blocks 350-A, 350-B of FIG. 3C) the sacrificial layers SL may include forming (Block 350-A2) the lower gate G-L below, and on opposite sidewalls of, the isolation region IL and subsequently forming (Block 350-B2) the upper gate G-U above the isolation region IL.

Figure 4A:
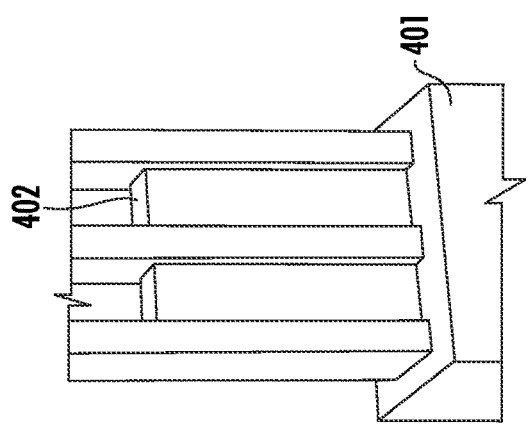
FIGS. 4A, 4B, 4C, 4D, 4E, 4F, 4G, 4H, 4I, 4J, 4K, 4L, 4M, 4N, 4O, and 4P are perspective views illustrating operations of further embodiments of forming a transistor stack.
Figure 4B:
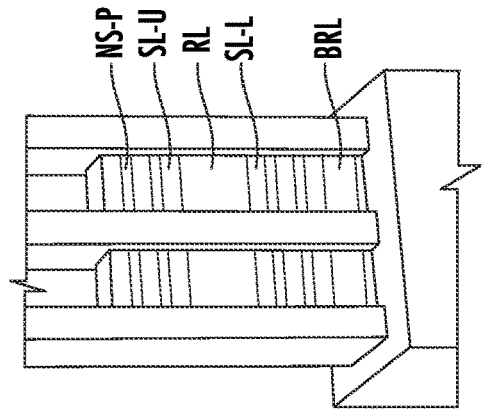
Figure 4C:
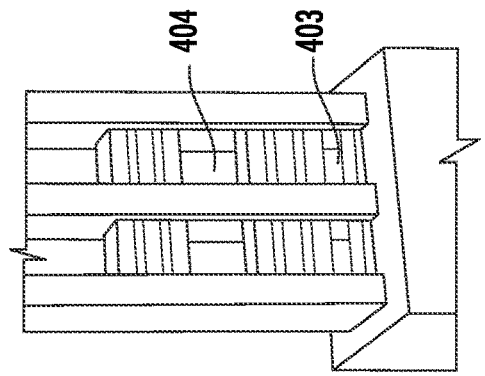
Figure 4D:
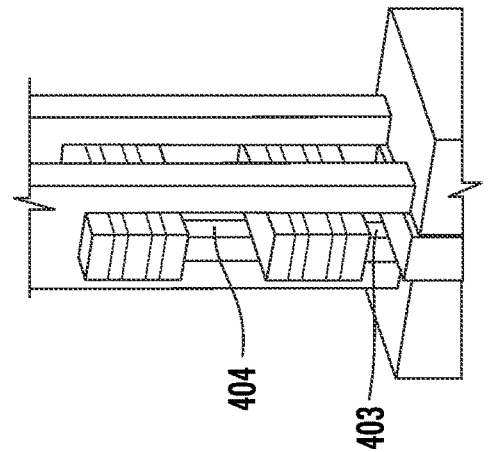
Figure 4E:
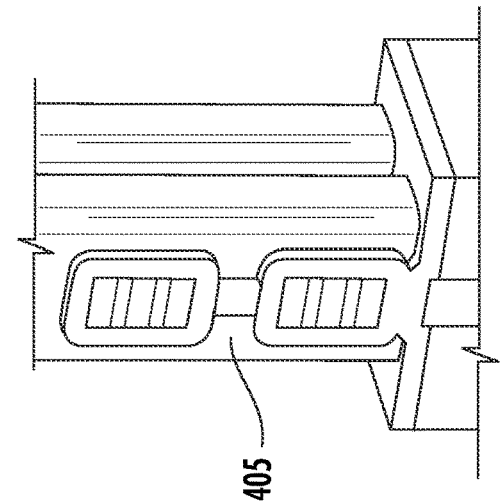
Figure 4F:
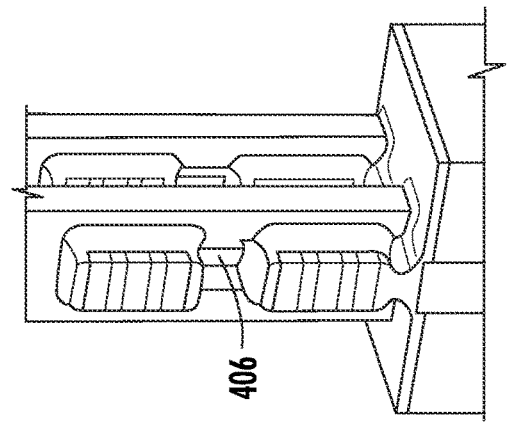
Figure 4I:
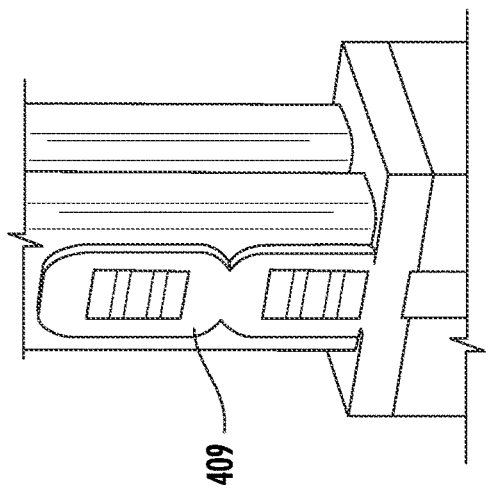
Figure 4L:
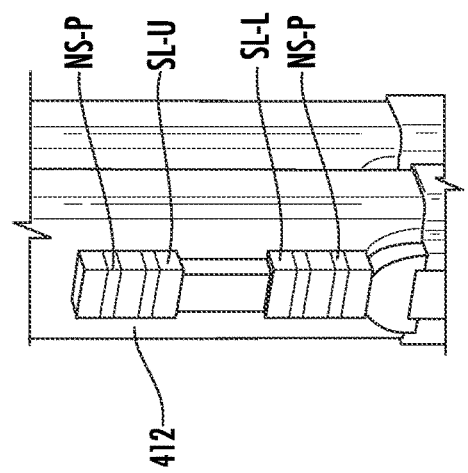
Figure 4H:
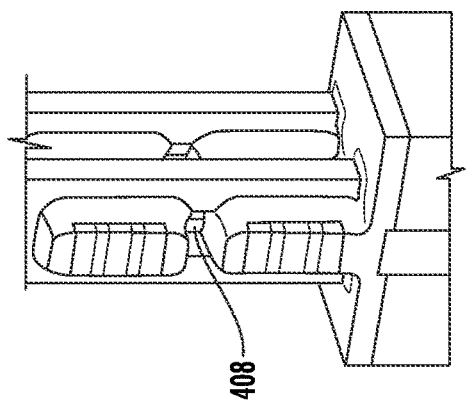
Figure 4K:
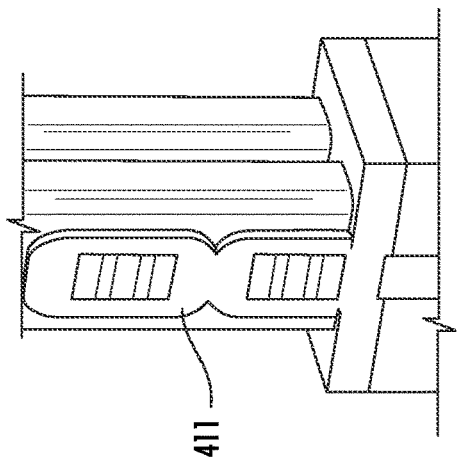
Figure 4G:
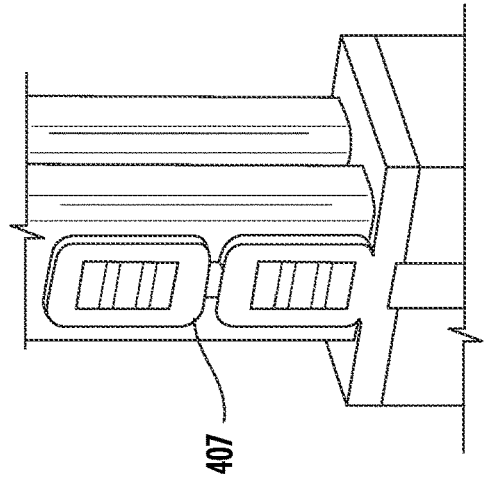
Figure 4J:
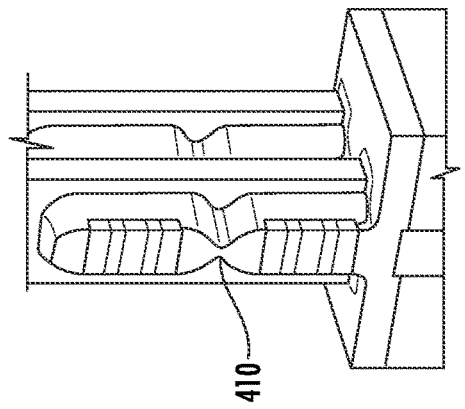
Figure 4O:
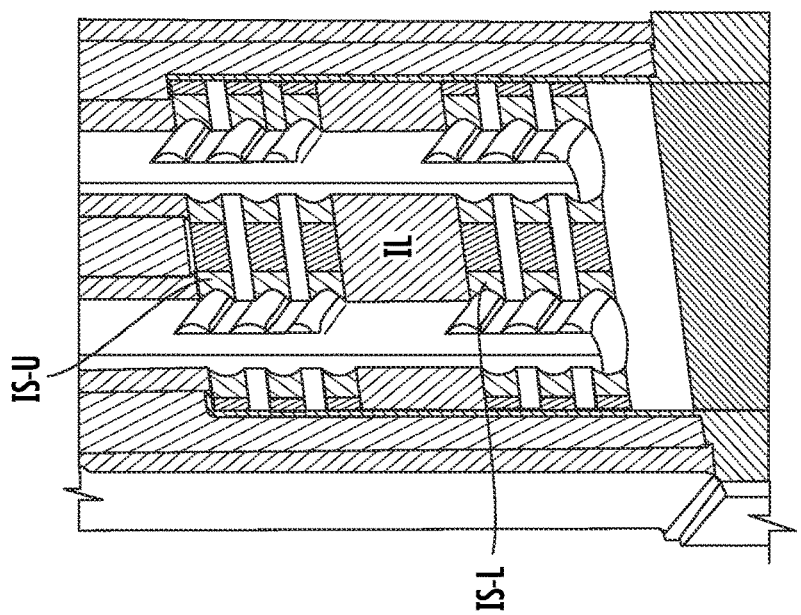
Figure 4N:
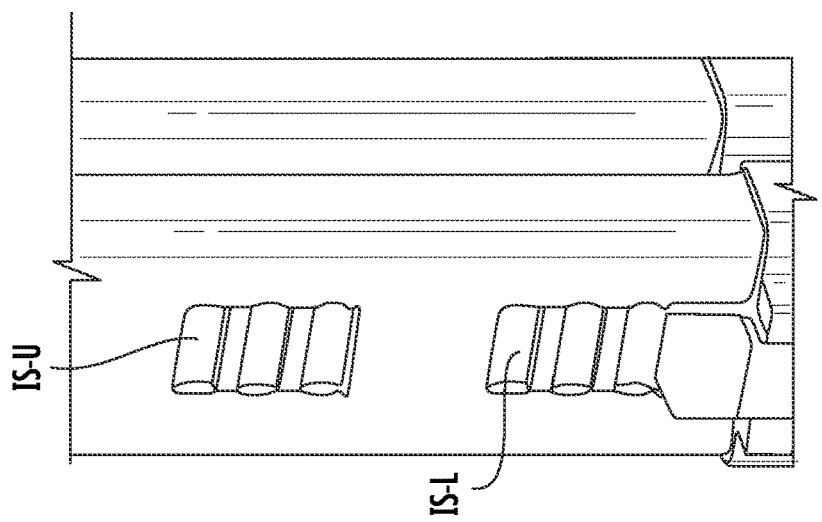
Figure 4M:
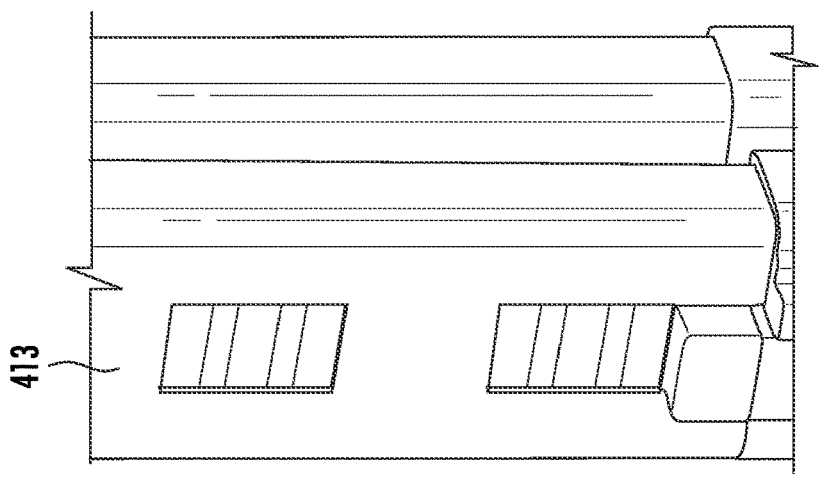
Figure 4P:
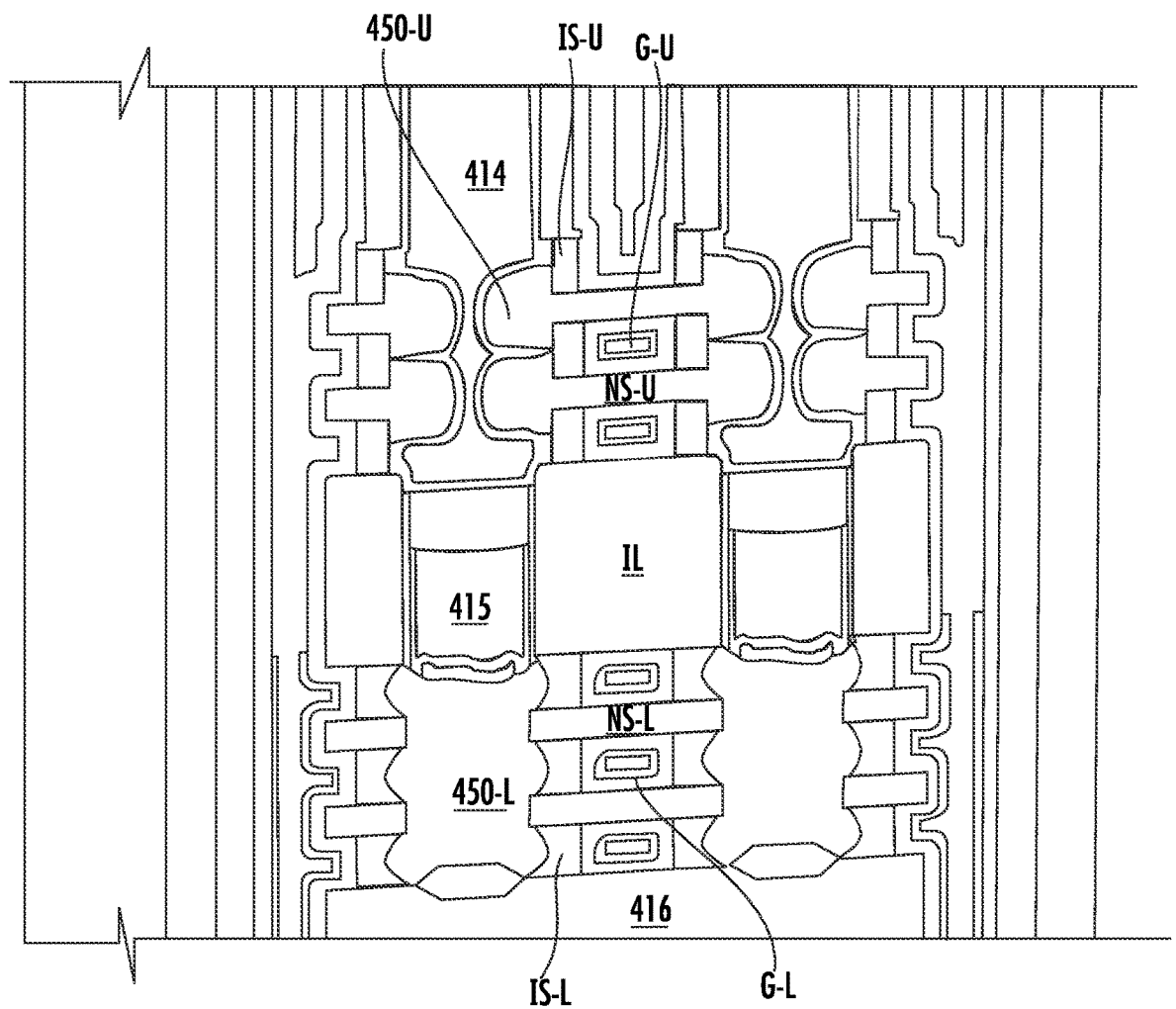

FIGS. 4A-4P are perspective views illustrating operations of further embodiments of forming a transistor stack. The resultant transistor stack may be similar to that which is formed by the operations of FIGS. 2A-2AN. For example, the operations of FIGS. 4A-4P may be used to form any of the transistor stacks shown in FIGS. 1A-1D, as may the operations of FIGS. 2A-2AN. Accordingly, the following description of FIGS. 4A-4P may focus primarily on differences with respect to the operations of FIGS. 2A-2AN.

As shown in FIG. 4A, a substrate 401 may have a preliminary transistor stack thereon that is covered with a liner 402, which may be an oxide liner.

Referring to FIG. 4B, the liner 402 is removed, thereby exposing the preliminary transistor stack, which includes preliminary nanosheets NS-P, upper sacrificial layers SL-U, lower sacrificial layers SL-L, and a sacrificial layer RL that is between the upper and lower sacrificial layers SL-U, SL-L. Moreover, a bottom sacrificial layer BRL may be between the lower sacrificial layers SL-L and the substrate 401. The bottom sacrificial layer BRL has an etch selectivity with respect to the sacrificial layers SL. For example, the bottom sacrificial layer BRL may include the same material as the sacrificial layer RL. The sacrificial layer RL and the bottom sacrificial layer BRL may each be thicker than each of the sacrificial layers SL. Moreover, the bottom sacrificial layer BRL may be thinner than the sacrificial layer RL.

Referring to FIG. 4C, the sacrificial layer RL and the bottom sacrificial layer BRL are removed, thereby forming openings 403, 404. For example, the sacrificial layer RL and the bottom sacrificial layer BRL may each comprise a high concentration of Ge (e.g., higher than that of the sacrificial layers SL) and may be removed by a removal process selective for high-Ge SiGe.

FIG. 4D is a side perspective view of the openings 403, 404. FIG. 4C, on the other hand, is a front perspective view.

Referring to FIG. 4E, a gate spacer material 405 is deposited. The operations of FIGS. 4E-4O may be used as a repeated deposit-etch back sequence that eventually builds the isolation region IL and the insulating spacers IS.

Referring to FIG. 4F, an etch-back operation is performed on the gate spacer material 405, thereby forming an opening 406 in a region where the sacrificial layer RL had been present.

Referring to FIG. 4G, a gate spacer material 407 is deposited.

Referring to FIG. 4H, an etch-back operation is performed on the gate spacer material 407, thereby forming an opening 408 in a region where the sacrificial layer RL had been present. Due to the repeated gate spacer material formation operations, the opening 408 is smaller than the opening 406 (FIG. 4F), as more of the gate spacer material 407 remains after its etch-back operation.

Referring to FIG. 4I, a gate spacer material 409 is deposited.

Referring to FIG. 4J, an etch-back operation is performed on the gate spacer material 409. Rather than forming an opening in a region where the sacrificial layer RL had been present, this etch-back operation may provide a narrowed gate spacer region 410.

Referring to FIG. 4K, a spacer material 411 is deposited. In some embodiments, the spacer material 411 may provide the isolation region IL (FIG. 1B).

Referring to FIG. 4L, an etch-back operation is performed on the spacer material 411, thereby providing recess regions 412 beyond which the sacrificial layers SL and preliminary nanosheets NS-P protrude outwardly.

Referring to FIG. 4M, a recess region 413 may be formed by removing the outwardly-protruding portions of the sacrificial layers SL and preliminary nanosheets NS-P.

Referring to FIG. 4N, upper inner spacers IS-U and lower inner spacers IS-L may be simultaneously formed on sidewalls of the upper sacrificial layers SL-U and lower sacrificial layers SL-L (FIG. 4L), respectively.

FIG. 4O is a front perspective view of the inner spacers IS-U and lower inner spacers IS-L that are formed above and below, respectively, the isolation region IL.

FIG. 4P is a front perspective view illustrating that a gate G replaces the sacrificial layers SL on sidewalls of the insulating spacers IS. As the gate G may be vertically thinner than a conventional gate, it may have a smaller surface area and thus may help reduce capacitance (e.g., with a source/drain contact 414/415 and/or with a source/drain region 450). Also, upper source/drain regions 450-U are on sidewalls of the upper nanosheets NS-U and lower source/drain regions 450-L are on sidewalls of the lower nanosheets NS-L. In some embodiments, a source/drain contact 414 may be on each upper source/drain region 450-U and a source/drain contact 415 may be on each lower source/drain region 450-L. Moreover, a bottom isolation region 416 is in the space that was formerly occupied by the bottom sacrificial layer BRL (FIG. 4B). The bottom isolation region 416 may comprise, for example, the same insulating material as the isolation region IL.

FIGS. 5A and 5B are flowcharts corresponding to operations of FIGS. 4A-4P. As shown in FIGS. 5A and 4B, a preliminary transistor stack is formed (Block 510) that includes alternating sacrificial layers SL and preliminary nanosheets NS-P. Moreover, a sacrificial layer RL separates upper sacrificial layers SL-U from lower sacrificial layers SL-L, and a bottom sacrificial layer BRL separates the lower sacrificial layers SL-L from a substrate 401 (FIG. 4A).

Referring to FIGS. 5A and 4C, the sacrificial layer RL is removed (Block 520) to form an opening 404 that separates the upper sacrificial layers SL-U from the lower sacrificial layers SL-L. Moreover, the bottom sacrificial layer BRL may be simultaneously removed to form an opening 403. In other embodiments, however, the sacrificial layer RL may be removed without simultaneously removing the bottom sacrificial layer BRL.

Referring still to FIG. 5A, an isolation layer is formed (Block 530) in the opening 404. The isolation layer may provide part of the isolation region IL (FIG. 4P). As an example, a spacer material 411 (FIG. 4K) may provide the isolation layer.

Referring to FIGS. 5A and 4O, insulating spacers IS are formed (Block 540) on sidewalls of a stack of sacrificial layers SL. The insulating spacers IS are formed after forming the isolation layer that may provide part of the isolation region IL.

Referring to FIGS. 5A and 4P, a common gate G is formed (Block 550) between sidewalls of the insulating spacers IS. The common gate G includes an upper gate G-U and a lower gate G-L that contacts the upper gate G-U.

Referring to FIGS. 5B and 4O, an operation of forming (Block 540 of FIG. 5A) the insulating spacers IS may include simultaneously forming (Block 540S) upper insulating spacers IS-U on sidewalls of upper sacrificial layers SL-U and lower insulating spacers IS-L on sidewalls of lower sacrificial layers SL-L.

Transistor devices 100 (FIG. 1B) and methods of forming the same according to embodiments of the present invention may provide a number of advantages. These advantages include defining a border between an upper transistor T-U (FIG. 1B) and a lower transistor T-L (FIG. 1B) of a transistor stack 110 (FIG. 1B). For example, the border can be defined by forming a sacrificial layer RL (FIG. 2A) that will be replaced with an isolation region IL (FIG. 1B) between the stacked transistors T-U, T-L. Defining the border with the sacrificial layer RL can improve subsequent formation of insulating spacers IS (FIG. 1C) that will separate a gate G (FIG. 1C) from source/drain regions 150 (FIG. 1C). This can help to address the issue of inner spacer incomplete pinchoff in a region between two transistors in a stack. As another example, by forming the isolation region IL inside the gate G, which may be a common gate having upper and lower gates G-U, G-L that contact each other, variability and control of gate-metal deposition and removal can be improved. This can help to reduce gate capacitance.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present invention are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present invention should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. A transistor device comprising:
   a substrate;
   a lower transistor comprising a lower gate, a lower channel region on the substrate, lower insulating spacers on sidewalls of the lower gate, and a lower source/drain region;
   an upper transistor comprising an upper gate, an upper channel region, upper insulating spacers on sidewalls of the upper gate, and an upper source/drain region, wherein the lower transistor is between the upper transistor and the substrate; and
   an isolation region that separates the lower insulating spacers from the upper insulating spacers, the isolation region comprising a first portion that separates the lower channel region from the upper channel region and a second portion that separates the lower source/drain region from the upper source/drain region,
   wherein the lower gate of the lower transistor contacts the upper gate of the upper transistor, and
   wherein the first portion of the isolation region has a first thickness that is less than or equal to a second thickness of the second portion of the isolation region.

2. The transistor device of claim 1, wherein a lower surface of the upper gate of the upper transistor contacts an upper surface of the lower gate of the lower transistor.

3. The transistor device of claim 1,
   wherein the upper gate of the upper transistor is on opposite sidewalls of the isolation region, and wherein the isolation region is thicker than the upper channel region of the upper transistor.

4. The transistor device of claim 1,
wherein the lower and upper transistors are lower and upper nanosheet transistors, respectively,
wherein the lower nanosheet transistor comprises a plurality of lower nanosheets, a first of which defines the lower channel region,
wherein the upper nanosheet transistor comprises a plurality of upper nanosheets, a first of which defines the upper channel region, and
wherein the first portion of the isolation region separates the plurality of lower nanosheets of the lower nanosheet transistor from the plurality of upper nanosheets of the upper nanosheet transistor.

5. The transistor device of claim 1, wherein the first portion of the isolation region has a first thickness that is thinner than a second thickness of the second portion of the isolation region.

6. The transistor device of claim 1,
wherein one of the lower insulating spacers contacts a sidewall of the lower source/drain region and a lower portion of the isolation region, and
wherein one of the upper insulating spacers contacts a sidewall of the upper source/drain region and an upper portion of the isolation region.

7. The transistor device of claim 1,
wherein a first one of the lower transistor or the upper transistor comprises a gate-all-around (GAA) nanosheet transistor or a tri-gate nanosheet transistor, and
wherein a second one of the lower transistor or the upper transistor, different from the first one, comprises a vertical field-effect transistor (VFET) or a fin field-effect transistor (FinFET).

8. A transistor device comprising:
a lower nanosheet transistor comprising a lower nanosheet stack and a lower gate on the lower nanosheet stack;
an upper nanosheet transistor on top of the lower nanosheet transistor, the upper nanosheet transistor comprising an upper nanosheet stack and an upper gate on the upper nanosheet stack; and
an isolation region that separates the lower nanosheet stack from the upper nanosheet stack,
wherein the lower gate of the lower nanosheet transistor contacts the upper gate of the upper nanosheet transistor,
wherein the lower nanosheet transistor further comprises a lower insulating spacer that contacts a lower portion of the isolation region, and
wherein the upper nanosheet transistor further comprises an upper insulating spacer that contacts an upper portion of the isolation region.

9. The transistor device of claim 8, wherein an upper surface of the lower gate of the lower nanosheet transistor contacts a lower surface of the upper gate of the upper nanosheet transistor.

10. The transistor device of claim 8, wherein the upper gate of the upper nanosheet transistor contacts opposite sidewalls of the isolation region.

11. A method of forming a transistor device, the method comprising:

forming a preliminary transistor stack comprising a lower channel layer, an upper channel layer, and a sacrificial layer that separates the lower channel layer from the upper channel layer and overlaps the lower channel layer and the upper channel layer in a first direction;
forming insulating spacers between the lower channel layer and the upper channel layer;
removing the sacrificial layer;
forming an isolation layer in an opening that is formed by removing the sacrificial layer and overlaps the insulating spacers in the first direction; and
forming a lower gate on the lower channel layer below the isolation layer and an upper gate on the upper channel layer above the isolation layer.

12. The method of claim 11, wherein the insulating spacers are formed before removing the sacrificial layer.

13. The method of claim 11, wherein the insulating spacers are formed after removing the sacrificial layer and forming the isolation layer.

14. The method of claim 11, wherein the preliminary transistor stack further comprises:
a plurality of lower nanosheets, a first of which defines the lower channel layer;
a plurality of lower sacrificial layers that alternate with the plurality of lower nanosheets;
a plurality of upper nanosheets, a first of which defines the upper channel layer; and
a plurality of upper sacrificial layers that alternate with the plurality of upper nanosheets.

15. The method of claim 14, wherein forming the insulating spacers comprises:
forming lower ones of the insulating spacers on sidewalls of the plurality of lower sacrificial layers; and
forming upper ones of the insulating spacers on sidewalls of the plurality of upper sacrificial layers.

16. The method of claim 15, wherein the upper ones of the insulating spacers are formed before the lower ones of the insulating spacers.

17. The method of claim 15, wherein the upper ones of the insulating spacers are formed simultaneously with the lower ones of the insulating spacers.

18. The method of claim 14,
wherein the preliminary transistor stack further comprises a bottom sacrificial layer that is below the plurality of lower sacrificial layers,
wherein the bottom sacrificial layer is thinner than the sacrificial layer and thicker than each of the plurality of lower sacrificial layers,
wherein the method further comprises:
removing the bottom sacrificial layer;
forming a bottom isolation layer in an opening formed by removing the bottom sacrificial layer; and
removing the plurality of lower sacrificial layers and the plurality of upper sacrificial layers after forming the isolation layer and the bottom isolation layer,
wherein forming the lower gate comprises forming the lower gate in openings formed by removing the plurality of lower sacrificial layers, and
wherein forming the upper gate comprises forming the upper gate in openings formed by removing the plurality of upper sacrificial layers.

* * * * *